United States Patent
Mahjoob et al.

(10) Patent No.: US 12,538,447 B2
(45) Date of Patent: Jan. 27, 2026

(54) HIGH EFFICIENCY THERMAL MANAGEMENT DEVICES FOR USE WITH ELECTRONIC COMPONENTS HAVING HIGH HEAT FLUX VALUES

(71) Applicant: The California State University—Northridge, Northridge, CA (US)

(72) Inventors: Shadi Mahjoob, Northridge, CA (US); Carlos Zing, Northridge, CA (US)

(73) Assignee: The Trustees of the California State University, Long Beach, CA (US)

( * ) Notice: Subject to any disclaimer, the term of this patent is extended or adjusted under 35 U.S.C. 154(b) by 826 days.

(21) Appl. No.: 17/513,105

(22) Filed: Oct. 28, 2021

(65) Prior Publication Data

US 2022/0232728 A1 Jul. 21, 2022

Related U.S. Application Data

(63) Continuation-in-part of application No. 16/423,901, filed on May 28, 2019, now abandoned.

(60) Provisional application No. 62/677,094, filed on May 28, 2018.

(51) Int. Cl.
| | |
|---|---|
| *H05K 7/20* | (2006.01) |
| *H01L 23/367* | (2006.01) |
| *H01L 23/433* | (2006.01) |
| *H01L 23/473* | (2006.01) |

(52) U.S. Cl.
CPC ..... *H05K 7/20145* (2013.01); *H05K 7/20154* (2013.01); *H05K 7/20509* (2013.01); *H01L 23/3675* (2013.01); *H01L 23/4336* (2013.01); *H01L 23/4735* (2013.01); *H05K 7/20518* (2013.01)

(58) Field of Classification Search
CPC ........... H05K 7/20145; H05K 7/20154; H05K 7/20509; H05K 7/20518; H01L 23/4735; H01L 23/3675; H01L 23/4336
USPC ..................... 165/75, 80.4, 104.33
See application file for complete search history.

(56) References Cited

U.S. PATENT DOCUMENTS

| | | | | |
|---|---|---|---|---|
| 3,635,037 | A * | 1/1972 | Hubert .................. | H10N 10/13 62/3.2 |
| 9,049,780 | B2 * | 6/2015 | Na ...................... | H05K 7/20154 |
| 10,634,397 | B2 * | 4/2020 | Fisher ................. | F28D 15/0266 |
| 2009/0226971 | A1 * | 9/2009 | Beer ................. | B01L 3/502784 435/303.1 |

* cited by examiner

*Primary Examiner* — Joel M Attey
(74) *Attorney, Agent, or Firm* — Sandra Poteat Thompson; Finlayson Toffer Roosevelt & Lilly LLP

(57) ABSTRACT

High efficiency heat management devices for use with electronic components, are disclosed and include: at least one jet inlet channel, at least one non-uniform channel area or uniform channel area, at least two exit channels, at least one heat spreader conductive plate, wherein the at least one non-uniform channel area or uniform channel area is bounded by the at least one jet inlet channel, the at least two exit channels, and the at least one heat spreader conductive plate, and at least one porous component or at least one foam component, wherein the at least one porous component or at least one foam component at least partially fills the at least one non-uniform channel area or uniform channel area.

20 Claims, 58 Drawing Sheets

(b)

(a)

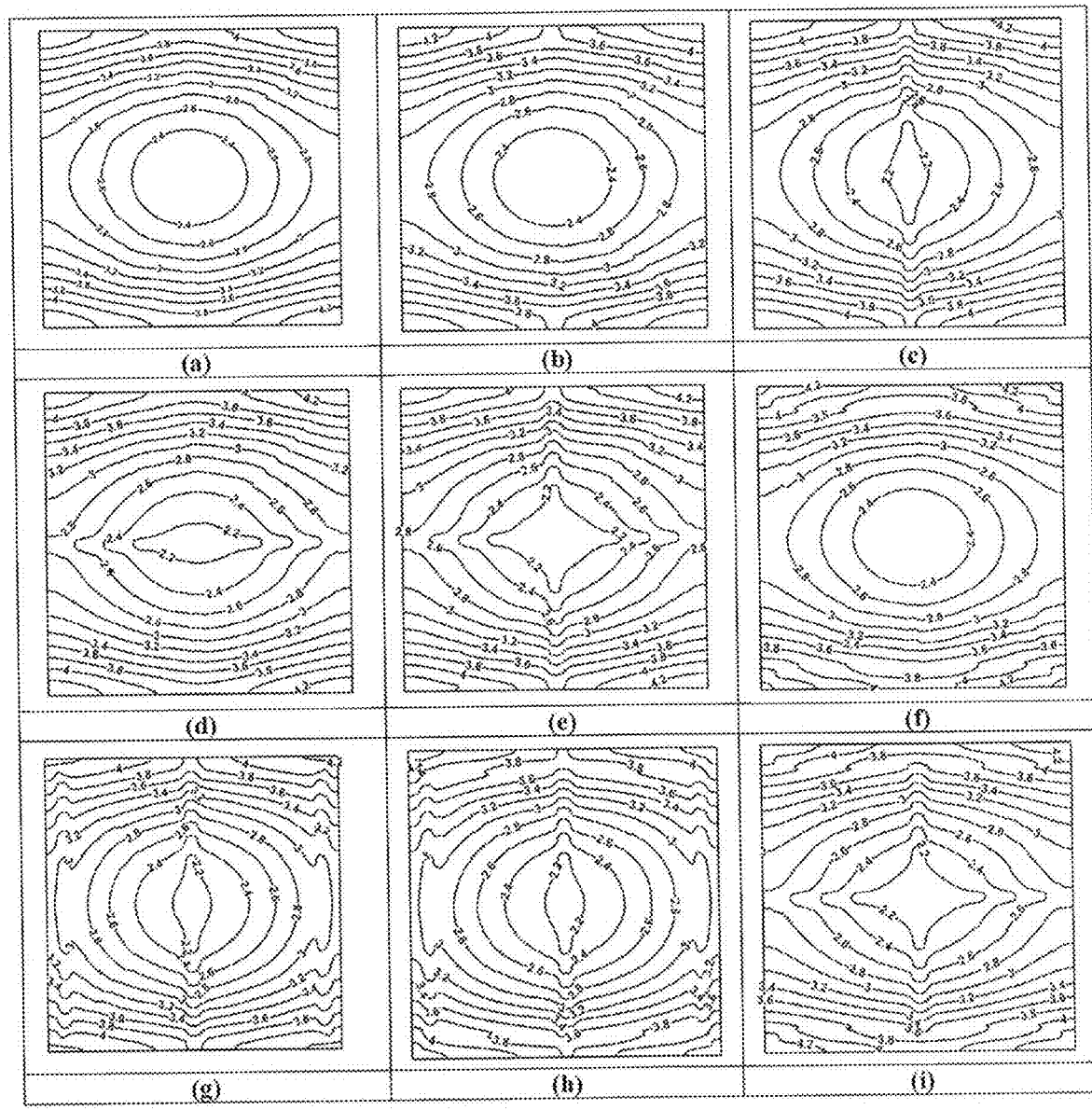
Fig. 26A-I (b)

HIGH EFFICIENCY THERMAL MANAGEMENT DEVICES FOR USE WITH ELECTRONIC COMPONENTS HAVING HIGH HEAT FLUX VALUES

This United States Continuation in Part Application claims priority to U.S. Utility application Ser. No. 16/423,901, which was filed on May 28, 2019 and is entitled "High Efficiency Thermal Management Device for Use with Components Having High Heat Flux Values, which claims priority to U.S. Provisional Patent Application Ser. No. 62/677,094, which is entitled "Thermal Transport in Confined Single and Multiple Jet Impingements Through Porous Filled Non-Uniform Cross Section Channels", which was filed on May 28, 2018, and which are all commonly-owned and incorporated by reference herein in their entirety.

FIELD OF THE SUBJECT MATTER

The field of the subject matter is high efficiency or highly efficient thermal or heat management devices for the purpose of cooling of components, including electronic components, that have high heat flux values or heating components that need to be heated.

BACKGROUND

The transistor, in essence an electronic on/off switch and the main component to microprocessors, has birthed the electronic age, allowing electronics to tunnel into almost every aspect of modern life, from toys and cellular phones to air and space craft. Because the number of transistors correlates directly to electronic performance, humans have been trying to increase the density in each processor by making smaller and smaller transistors.

A microprocessor during the 70's would have a transistor count in the thousands, today, they are found with a count above 2 billion. A processor is made up of different electrical components; resistors, capacitors, transistors, etc., and every component provides an electrical resistance to some degree, resulting in a rise in temperature and/or heat loss. Partly because of Moore's law, a demand for smaller components, and higher processing speeds, the heat flux and, consequently, the temperature in electronic components is predicted to climb even higher. As such, electronic components may break down when operating for long periods of time at high temperatures, and the failure rate increases exponentially with the operating temperature [1].

The development of electronic devices with high processing speeds and small sizes is not achieved without employing efficient cooling systems. With increasingly large heat generation, high temperature values and hot spots in the electronics devices, the implementation of electronics cooling is essential for the safety, longevity, and performance of these components. In addition to the need for keeping the temperature below a safe temperature, it is crucial to provide temperature uniformity in the chip and avoid hot spots. Due to large temperature gradients and hotspots, thermal stress and fatigue are increased in chips and electronic packages resulting in electronic reliability reduction [41]. Some of the main electronics cooling methods employ fans, heat sinks, cold plates, jet impingement, micro-channels, heat pipes, thermo-electrics, and immersion cooling.

Air or liquid jet impingement can provide efficient cooling with variety of applications ranging from gas turbines to electronics cooling. The coolant is injected to a target plate subject to a high heat flux or high temperature, resulting in a stagnation zone with low temperature and velocity and high rate of heat transfer. The thermal performance of jet impingement depends on several factors including jet Reynolds number, jet diameter, jet cross section shape, jet to target spacing, single jet and jet array, jet arrangement, jet spacing, and injected coolant properties.

Du et al. [42] numerically investigated the effect of the nozzle geometry of the air jet impingement on the flow field and thermal characteristics of vortex cooling. The results indicate the importance of the jet aspect ratio; the ratio of the two sides of the rectangular cross-sectional jets. Liu et al. [43] studied the effect of air jet nozzle angle and jet aspect ratio for swirl cooling for an internal cooling system employing numerical methods. The authors indicated that the lowest thermal stress is obtained for the jet angle of 60 degrees. They discussed that an increase in the jet nozzle aspect ratio and Reynolds number increases thermal performance factor while the factor is decreased by the jet angle enlargement. The authors recommended the jet aspect ratio of 4.5 and the jet angle of degrees for the studied swirl cooling. Kurran et al. [44] experimentally investigated hydrodynamics and thermal transport in water jet impingement at a surface close to the jet. The effect of nozzle jet to surface spacing was analyzed for the spacing distance similar to the nozzle dimeter and less. The authors discussed on the effect of the spacing on the jet deflection region and the inertia dominant region. They concluded that the normalized stagnation Nusselt number enhances with a decrease in the spacing in the jet deflection region, due to higher stagnation pressure. However, they noticed negligible effect of spacing for the inertia dominant region.

Choi et al. [45] experimentally investigated jet impingement on a semi-circular target. The fluid structure was analyzed in different regions of free, impinging, and wall jet flow. The effects of different parameters were studied including the nozzle to target spacing and Reynolds number. The author indicated that the lower spacing would result in higher heat transfer. They also discussed on the secondary peaks occurrence and their locations. Kumar and Prasad numerically studied a row of circular jet impingement on a concave target. They studied the effects of the distance between the jets, spacing between the jet and the target, and Reynolds number. They concluded that the studied cases with lower distance between the jets or lower spacing between the jet and target result in higher rate of heat transfer. The interaction between the jets and counter rotating vortices were also discussed.

Structured and finned target surfaces may enhance thermal transport due to higher surface area, turbulence and mixing. Turbulators and structured targets can improve the efficiency of the jet impingement cooling especially when they are placed in the wall jet regions next to the stagnation zone. In general, high local heat transfer coefficient is obtained in the stagnation zone by proper jet impingement design. However, the coefficient decreases in the regions away from the stagnation zone for single or array of jet impingements [47]. As such, the subject of jet impingement at rib structured target surfaces have got the attention of researchers. Some of the effective parameters in rib structured surfaces are rib height, rib shape and size, rib angle, rib pitch or the distance between the ribs, and the location of ribs from the stagnation point. Tan et al. [47] experimentally investigated a row of air jet impingement on a rib-roughened target surface and studied different rib configurations of orthogonal ribs, V-shaped ribs and inverted V-shaped ribs. The authors concluded that higher heat transfer is achieved for roughened surfaces in comparison with smooth channels.

They also indicated the advantage of the V-shaped rib in comparison with other studied shapes, especially at lower spacing distance between the jet and the target.

Zhang et al. [88] studied the flow and thermal characteristics of single jet impingement on a protrusioned surface employing combined PIV and numerical modeling. They investigated the effects of the jet diameter to protrusioned target diameter, protrusion relative depth and Reynolds number on flow structure, local and average Nusselt numbers. They concluded that the overall heat transfer of most cases is enhanced using the protrusioned target surface. Kim et al. numerically investigated hybrid microchannel and slot jet modules with and without plate fins beneath the slot jet impingement. The outcomes indicated a better cooling performance for the case with the plate fin. Ligrani et al. [50] studied air impingement jet array cooling on target surfaces with small scale roughness patterns. The studied roughness shapes were cylindrical and three different roughness heights were studied. The authors discussed on different physical effects including local mixing, vorticity fluctuation, wetted surface area, and thermal resistance. Rubio-Jimenez et al. [51] numerically analyzed the characteristics of water flow through micro pin fin heat sinks with application in electronic cooling. Four fin shapes with cross sections of square, circular, elliptical, and flat with redounded sides were studied. The junction temperature and pressure drop variations were discussed and the advantage of the designed pin fins were expressed. Tepe at al. [52] experimentally studied flow characteristics and thermal performance of an array of extended jet holes on a rib-roughened surface for a variety of spacing between the extended jet exit and the target surface. Each rectangular rib was placed at the target surface right in front of the middle of each two jet inlets. The effect of the rib height was analyzed numerically. The authors concluded that the average Nusselt number for the rib roughened target surfaces could be enhanced using jets extended toward the surface. In addition, a reduction in the distance between the jet exit to the surface might increase the local Nusselt number. Singh et al. [53] experimentally and numerically investigated jet impingement on microroughness cylindrical, cubic and concentric elements. The jet spacing varied between 2 and 5 and jet to target spacing of 1 to 5 are studied for Reynolds numbers varying from 2500 to 10,000. The authors concluded that the concentric elements provide improved heat transfer and fin effectiveness.

Utilization of porous inserts can enhance cooling effectiveness and temperature control by providing a large surface area for a given volume. Metal foam is a type of porous material with a system of interconnected metal filaments. At its basic unit, it is a polyhedron with twelve to fourteen hexagon or pentagon faces [2]. The metal foam tortuosity provides mixing of the fluid passing through the foam and so improves heat transfer and temperature uniformity. The foam can be described by its porosity, filament thickness, permeability, pore diameter, and pore density. A reduction in pore size or porosity or an increase in pore density or flow's Reynolds number would result in higher heat transfer and pressure drop. Therefore, a compromise between the heat transfer rate and pressure drop should be made.

Metal foams also provide very large surface area per volume resulting in heat transfer enhancement. The advantages of metal foam utilization for cooling systems have been emphasized in literature [14]. Metal foams are made of light and conductive porous materials with internally connected pores. The foam metals are characterized by its porosity, pore diameter, pore density, filament thickness, and permeability. A lower porosity value or higher pore density causes larger rate of heat transfer and pressure drop. Bhattacharya et al. [15] discussed on thermophysical properties of metal foams. Zhao [54] presented a literature review on thermal transport in high porosity cellular metal foams. The author discussed on effective thermal conductivity, compact heat exchangers, forced and natural convection, thermal radiation, and multi-phase flow in metal foams. Rashidi et al. [55] reviewed the applications of porous materials for energy recovery and thermal systems such as heat exchangers, boilers, heat pipes, and electronics cooling. Boules et al. [56] experimentally studied thermal characteristics of crossflow around a horizontal heated cylinder wrapped partially or completely with metal foams at a range of Reynolds numbers. The effect of the angle between the cross flow and the partial foams on performance are discussed. The results indicate that utilization of metal foam increases thermal performance and pressure drop. However, proper placement of foam segments can result in low pressure drop.

Metal foams can be employed for advanced cooling systems. For instance, metal foam can be used to increase performance of heat sinks, by utilizing cooling through natural convection [17], applying metal foam between layers of finned heat sinks [18], and jet impingement through metal foam with a restricted outlet [19]. Several effective thermal conductivity models have been introduced in literature based on arranged thermal resistances for fluid and solid phases in series, parallel, or their variations. Bhattacharya et al. [20] developed a theoretical model using a two-dimensional hexagon with circular blobs of metal to represent a unit of metal foam. Yang et al. [21] presented an analytical model based on a tetradecahedron with cuboid nodes as its representative unit cell. Iasiello et al. [22] developed a model that takes into account a metal foams anisotropy, which comes from elongations of filaments in one direction occurring during manufacturing. Ranut [23] studied different effective thermal conductivity models while categorizing the models as asymptotic, empirical, or analytical approaches. More details on thermal transport in porous material can be found in the following references: [2, 14, 24-27].

Jet impingement on the other hand, has also been established to achieve high heat transfer rates. Since its discovery, it has been used in applications such as annealing sheet metal and cooling of lasers, turbine blades, and electronic equipment. An impinging jet's geometry is typically a nozzle facing a flat surface a distance away. Fluid exits the nozzle at a certain velocity, developing into a free jet, until it enters a stagnation zone where it starts decelerating due to the flat plate's presence, and starts accelerating away from the origin, parallel and adjacent to the plate, developing into wall jets. Bintoro et al. [3] numerically and experimentally studied a closed loop, single impinging jet heat exchanger system designed for electronic cooling, for the range of 10,000 to 31,000 Reynold's number. They forced water through two different diameter nozzles, 0.5 and 0.8 mm, to impinge on the face of a 12 mm diameter copper cylinder, 13 mm away. Bintoro et al. [3] declared that the system was able to keep a computer chip generating a maximum heat of 200 Watts under safe working conditions. While examining different nozzles, they concluded that a larger nozzle would provide a larger heat transfer for the same Reynold's number in this system. Regarding the effect of Reynold's number, a larger Reynolds number results in a higher convection heat transfer coefficient.

Other jet impinging geometries commonly studied are jet arrays, in which, multiple jets impinge on a flat surface. Iyengar and Ellsworth [4] numerically investigated the effect of a range of impinging water jets, 1, 16, and 36, on a computer chip 0.5 mm away, utilizing two different outlet schemes. In one of the schemes, the outlet was found on the periphery of the chip, where the fluid flows perpendicular to the impinging jet. In the other scheme, the outlets were holes with twice the diameter as the inlet jets, found in the same plane and between the inlet jet orifices, where the fluid outflow would flow parallel to the impinging jets. They concluded that regardless of outlet scheme, for cases of the same volumetric flow rate, more impinging jets would result in significantly better effective heat transfer and more uniform temperature distribution on chip surface. Increasing the volumetric flow rate has similar effects. The comparison of the two outlet schemes indicates that, due to separation sections, a considerably higher heat transfer rate for all periphery outlet cases is obtained than that of their parallel outlet opposites [4].

Jet impingement through foam filled channels are categorized as confined and unconfined channels for totally filled or partially filled by metal foams, respectively [19]. In the confined channels, the foam is "bounded" by the channel walls or boundaries of the uniform or non-uniform channel that is surrounded by the inlet channel, the exit channel(s), and a heat spreader conductive plate or other component, in which the channel cross section may be constant, i.e. uniform channels, or may vary, i.e. non-uniform channels. In the unconfined channels, the foam is not fully "bounded" by the channel walls or boundaries of the uniform or non-uniform channel that is surrounded by the inlet channel, the exit channel(s), and a heat spreader conductive plate or other component, but instead has at least one open space.

Sivasamy et al. [57] investigated jet impingement through an unconfined channel. They studied the effects of Peclet number, Rayleigh number, Jet diameter and jet to target distance. Wong [58] performed an experimental study of jet impingement through metal foam inserted in a confined horizontal channel. Infrared thermography imaging camera was utilized to capture the temperature distribution within the foam for different studied jet velocities. Mahjoob et al. [22] investigated transient thermal transport in foam filled thermal cyclers with application in polymerase chain reaction nucleic acid amplification. The effects of several parameters were studied such as coolant jet velocity, channel thickness, jet inlet size and flow exit size and orientation. Singh et al. [59] studied array of jet impingement through a high porosity aluminum foam filled channel. The effects of pore density, jet spacing and Reynolds number are analyzed. The authors concluded that thinner foams result in lower pressure drop while still providing thermal advantages. Yogi et al. [60] investigated local heat transfer and Nusselt number for circular jet impinging on an aluminum metal foamed flat plate. Different pore densities, Reynolds numbers, and jet to target spacing are studied experimentally. The authors concluded the advantage of metal foamed flat plate for heat transfer augmentation in comparison with smooth flat plate.

Multi-jet impingement through confined foam filled channels with application in electronics cooling was numerically investigated by Zing and Mahjoob [25]. Utilizing local thermal non-equilibrium model in porous media, the effects of several design parameters on temperature distribution and cooling effectiveness were analyzed including jet shape and size, jet location and orientation, and foam porosity [25]. Employing local thermal non-equilibrium (LTNE) assumption in porous media, the volume averaging is performed for each fluid and solid phases individually resulting in two energy equations. The two equations are linked by interfacial surface area and interstitial heat transfer coefficient to take care of heat transfer between the phases. In a simpler model, the volume averaging is performed over a representative volume containing both fluid and solid phases resulting in one energy equation [26]. Ranut [27] reviewed the literature regarding the empirical correlations and the theoretical models for effective thermal conductivity of aluminum metal foams. The author categorized the correlations as asymptotic, empirical, and analytical models.

Thermal transport through four different porous filled configurations, namely confined or unconfined with totally filled or partially filled porous materials, is discussed in [5]. Confined/unconfined geometries refer to whether flow through porous substrate is bounded by the channel walls (confined) or not (unconfined). Totally/completely filled or partially filled refers to the porous media and whether it encompasses every space through which the fluid flows. Partially filled cases usually have thin porous blocks adjacent to the base surface. Sivasamy et al. [6] numerically investigated cooling of a totally filled, confined parallel channel, subjected to a constant heat flux, utilizing a single jet. The effects of varying the nozzle diameter, Peclet number, Rayleigh number, and jet exit to heated surface distance are studied. The results indicate that at high Peclet numbers, where impinging jet forces overcome buoyancy forces, the Rayleigh number has negligible effect on the thermal transport. Also increasing the inlet diameter or decreasing jet-heated surface distance would improve overall heat transfer for cases of high Peclet number. Similar works confirm the above conclusions [7-8]. Rallabandi et al. [9] experimentally investigated high pressure air impinging through multiple inlet jets on a partially filled, confined parallel channel subjected to a uniform heat flux. Their results show a significant increase in heat transport for the porous foam with coating compared with similar case without the coating.

It is shown that utilization of nanofluids may improve thermal transport and efficiencies in heat management devices [28-30]. Diameter sizes of suspended particles in nanofluids range in nanometers leading to low corrosion probability. Zing et al. [29] numerically analyzed single jet impingement through a confined totally porous filled channel subject to a high uniform heat flux of $10^6$ W/m$^2$ at the channel's base. They investigated the effects of porosity, porous material, and coolants (water, 5% titanium dioxide ($TiO_2$) in water, 1% alumina in water, 1% diamond in 40:60 ethylene glycol/water, and 0.03% multi walled carbon nanotubes (MWCNT) in water). The results indicate that utilization of 5% titanium dioxide ($TiO_2$) in water nanofluid improves cooling efficiency and temperature uniformity over the channel's base.

For modeling heat transfer through porous media, volume averaged equations are commonly employed in which the transport equations are integrated over an elementary volume. There are two approaches to develop volume averaged energy equations. One is based on averaging over a representative elementary volume containing both fluid and solid phases and applying the assumption of local thermal equilibrium (referred to as one equation model). The other approach is to average over each of the phases separately and applying the assumption of local thermal non-equilibrium, resulting in energy equations for each individual phase (referred to as two equation model) [31]. If there is a large temperature difference between fluid and solid at the interface of the phases, the interfacial surface area and interstitial heat transfer coefficient will become key factors affecting the internal heat transfer between the phases. The product of these two variables is referred to as the volumetric heat transfer coefficient [32], thus a low volumetric heat transfer coefficient corresponds to a high temperature difference between phases. That is when the employment of two-equation model would be crucial [31, 33].

With the development of smaller and more powerful electronic devices, the heat generation and temperature in these components are considerably enhanced that can affect the components' performance, reliability, and lifespan. Furthermore, local areas of high heat flux are generated in microprocessors and electronic devices, producing hot spots that require more attention to prevent stress failure and fatigue. Sharma et al. [41] presented and investigated an embedded liquid cooling system for targeted cooling of hotspots electronic cooling. Manno et al. [61] emphasized on the importance of hotspots electronics cooling. They experimentally and numerically analyzed a micro-contact enhanced thermoelectric cooling system. Waddell et al. [62] experimentally studied an inclined jet impingement in a miniature channel with application in hotspot electronics cooling. The low Reynolds number and laminar flow was investigated using infrared thermography of a Joule-heated foil and particle image velocimetry (PIV).

Therefore, it is desirable and ideal to develop innovative high efficiency or highly efficient heat or thermal management devices for cooling components that have high heat flux values. Contemplated ideal devices would have a number of geometrical parameters, such as location and size of jet inlet channels, orientation of ceiling confining wall, flow rate in each channel, and heat fluxes. Contemplated devices should have several applications, including but not limited to, electronics cooling and cooling of biomedical devices, cooling of powered electrical equipment such as x-rays, lasers, ultrasound equipment, radiography machines, surgical equipment, and solar radiation receivers [10-11]. In addition, innovative cooling systems employing jet impingement technology, high conductive metal foam, rib structured surfaces, and a conductive heat spreader plate are numerically modeled and analyzed with application in hotspot removal. The advantage of combined metal foam and rib-structured surfaces subject to liquid jet impingement are discussed in detail that has not been addressed in literature. Several effective parameters are investigated such as slot and circular jet cross section shapes, impinging jet velocity, fully versus partially foam filled channels, foam thickness, rib geometry, rib location and orientation, applied heat flux, and the thickness of conductive heat spreader plate.

SUMMARY OF THE SUBJECT MATTER

Heat management devices for use with electronic components, are disclosed and include: at least one jet inlet channel, at least one non-uniform channel area or uniform channel area, at least two exit channels, at least one heat spreader conductive plate, wherein the at least one non-uniform channel area or uniform channel area is bounded by the at least one jet inlet channel, the at least two exit channels, and the at least one heat spreader conductive plate, and at least one porous component or at least one foam component, wherein the at least one porous component or at least one foam component at least partially fills the at least one non-uniform channel area or uniform channel area.

Also, heat management devices for use with electronic components, are disclosed and include: at least one jet inlet channel, at least one non-uniform channel area or uniform channel area, at least two exit channels, at least one heat spreader conductive plate, wherein the at least one non-uniform channel area or uniform channel area is bounded by the at least one jet inlet channel, the at least two exit channels, and the at least one heat spreader conductive plate, and at least one rib structure component that is coupled with the at least one heat spreader conductive plate and is located in the at least one non-uniform channel area or uniform channel area.

In addition, heat management devices for use with an electronic components, are disclosed that include: at least one jet inlet channel, at least one non-uniform channel area or uniform channel area, at least two exit channels, at least one heat spreader conductive plate, wherein the at least one non-uniform channel area or uniform channel area is bounded by the at least one jet inlet channel, the at least two exit channels, and the at least one heat spreader conductive plate, and at least one porous component or at least one foam component, wherein the at least one porous component or at least one foam component at least partially fills the at least one non-uniform channel area or uniform channel area, at least one jet impingement of at least one thermal management liquid or gas, wherein the at least one jet inlet channel directs the at least one jet impingement of a liquid or a gas onto a surface of the at least one porous component or at least one foam component.

BRIEF DESCRIPTION OF THE FIGURES

FIG. 26A-I shows non-dimensional temperature contours at the base interface (Y=0) for the studied Cases defined in FIGS. 36 (a) Case C1, (b) Case C2, (c) Case C3, (d) Case C4, (e) Case C5, (f) Case C6, (g) Case C7, (h) Case C8, and (i) Case C9.

Figure 36:
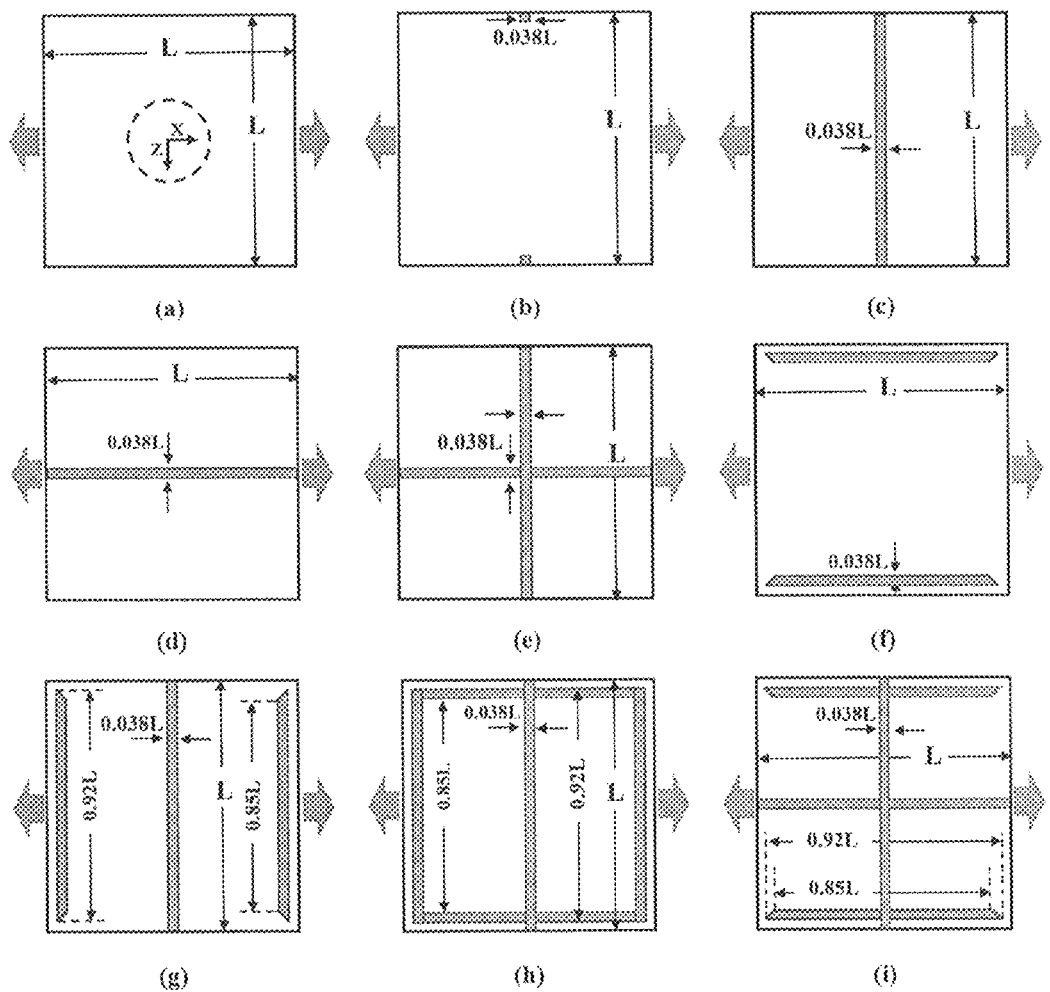

Based on the outcomes of the study of Cases S2-S4, multiple rib-foam combinations are designed and investigated for circular jet impingement, as shown in FIG. 36.

DETAILED DESCRIPTION

Innovative high efficiency or highly efficient heat or thermal management devices for cooling components that have high heat flux values have been developed and are disclosed herein. For the purposes of this disclosure, a contemplated high heat flux value is at least $10^4$ W/m$^2$ at the channel's base. In some embodiments, a contemplated high heat flux value is at least $10^5$ W/m$^2$ at the channel's base. In other contemplated embodiments, a contemplated high heat flux value is at least $10^6$ W/m$^2$ at the channel's base.

Contemplated devices have a number of geometrical parameters, such as location and size of jet inlet channels, orientation of ceiling confining wall, flow rate in each channel, and heat fluxes. Contemplated devices have several applications, including but not limited to, electronics cooling or thermal management, thermal management and/or cooling of biomedical devices, and thermal management and/or cooling of powered electrical equipment, such as x-rays, lasers, ultrasound equipment, radiography machines, surgical equipment, and solar radiation receivers.

The development of miniaturized and more powerful electronic devices and microprocessors has resulted in high heat generation and temperature values in these components. That affects the performance, reliability and lifespan of the devices. In addition, more local hot spots are generated in the components that require even more attention to prevent stress failure and fatigue. As such, the employment of advanced electronics cooling systems is very essential to keep the temperature below the safe temperature.

Cooling of electronics devices is one of the main issues in development of advanced devices such as electronics and biomedical devices. In this work, several multiple jet inlet porous filled heat exchangers are numerically modeled to investigate the thermal performance of different geometrical parameters, such as the thickness of jet impingement inlets, and their location. The importance of the inclined wall is also examined. Utilizing the inclined walls and narrowing the porous filled channels would improve the temperature uniformity.

Figure 1A:
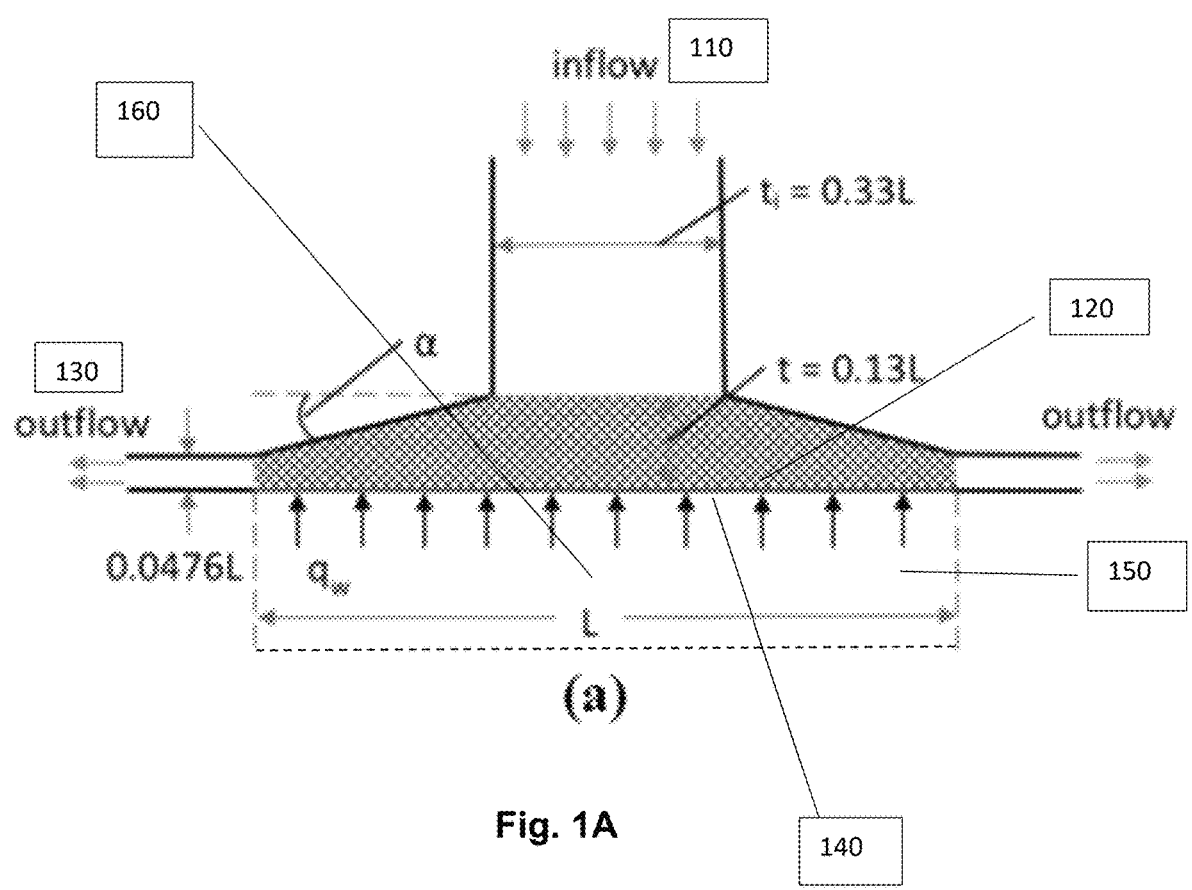
FIG. 1A-D shows schematic diagrams (a) front view of single jet impingement, (b) front view of multi jet impingements, (c) a three-dimensional case with single rectangular cross-section inlet channel, and (d) a three-dimensional case with multi square cross-section inlet channels.
Figure 1B:
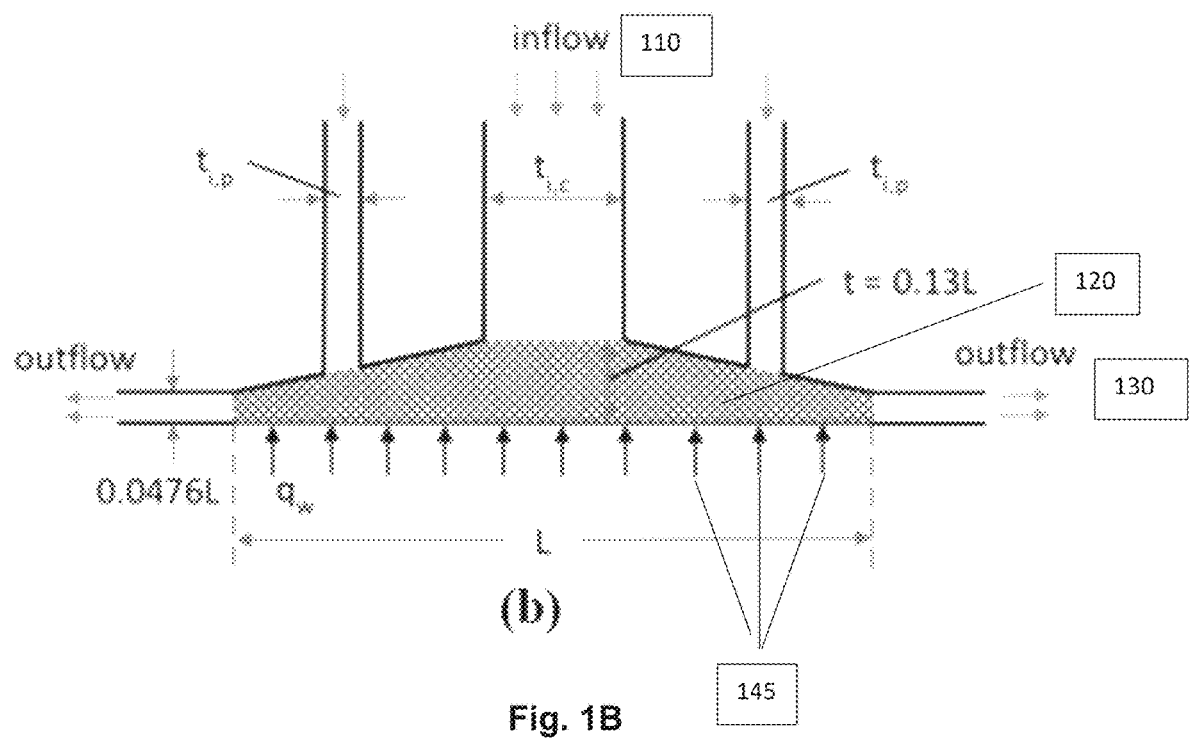
Figure 1C:
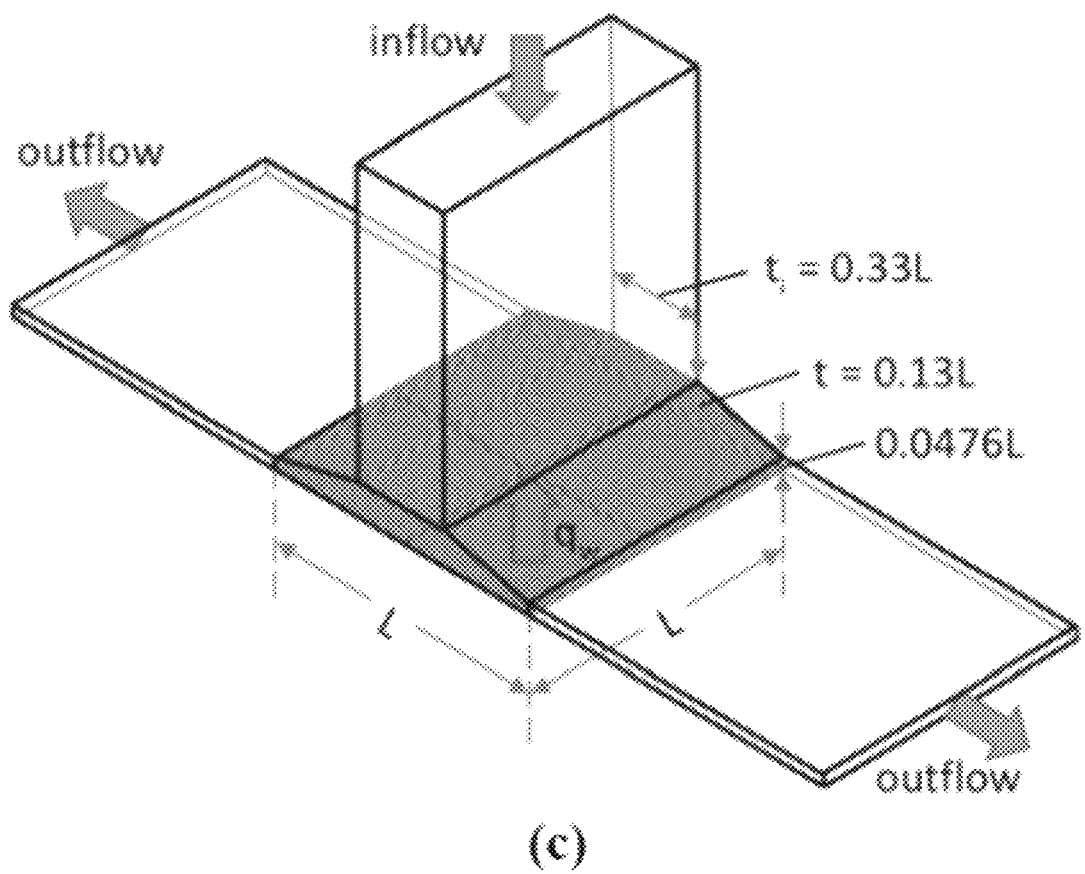
Figure 32A:
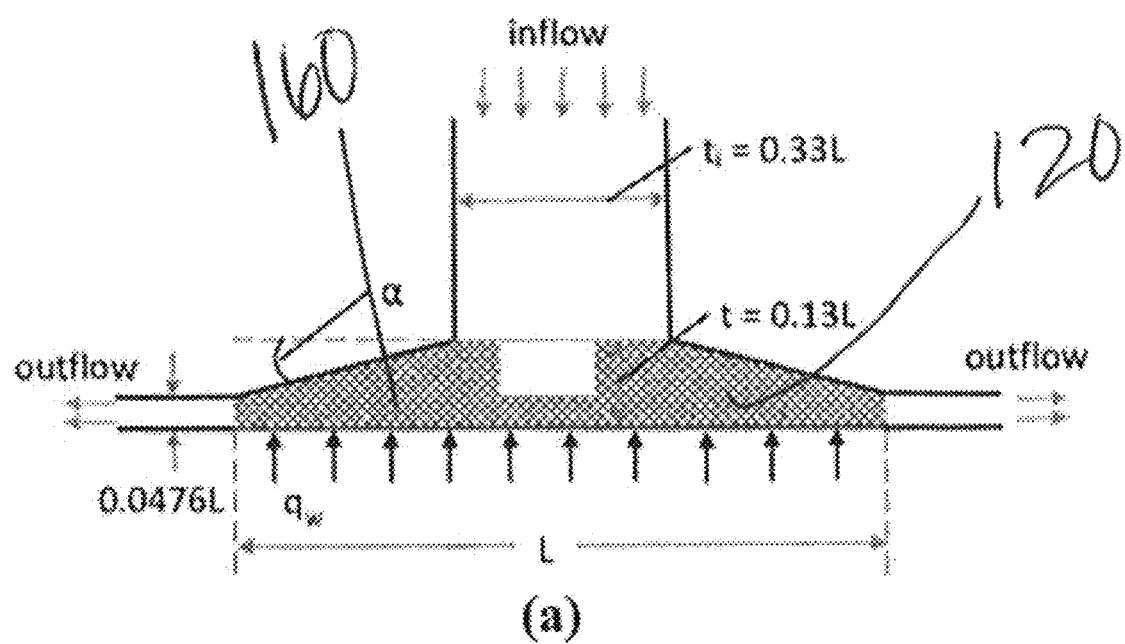
FIG. 32A-B shows a contemplated embodiment that has a partially filled non-uniform channel 120.
Figure 32B:
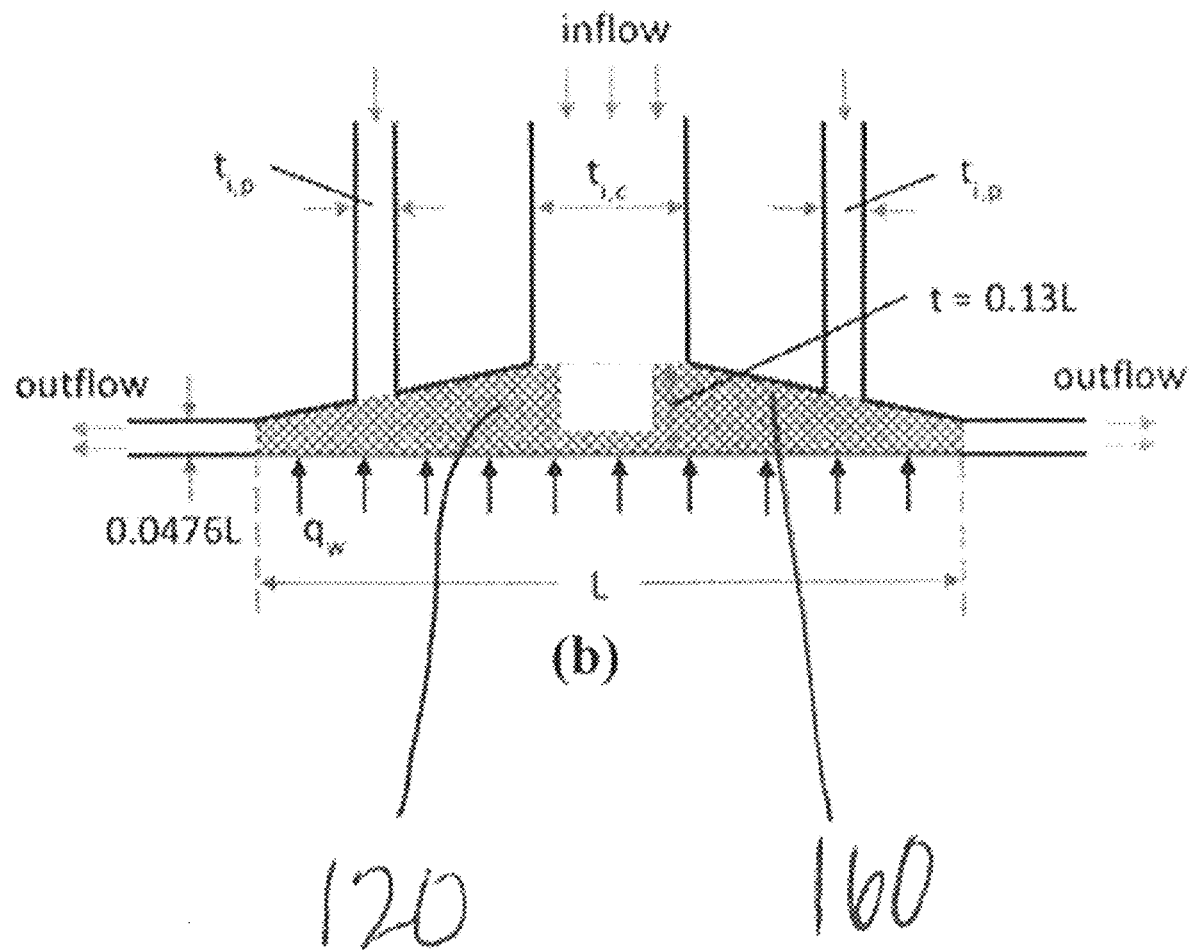

Innovative and contemplated heat exchangers utilizing single and multiple jet impingements are numerically investigated. The heat exchangers are confined non-uniform (with inclined walls) porous filled channels or foam filled channels subjected to uniform heat flux leaving the devices to be cooled. Schematic diagrams of the single jet and one of the multiple jet heat exchangers are presented in FIG. 1. To investigate the effects of the third direction on the results, numerical modeling is performed for both two and three-dimensional configurations. FIG. 1 shows a contemplated cooling system comprising a vertical jet inlet channel 110, a non-uniform channel or uniform channel 120, at least two exit channels 130, and a heat spreader conductive plate or component 140 that is subject to a high heat flux at its bottom surface 145. An electronic component 150 is shown in FIG. 1A for reference. As should be understood throughout this disclosure, the use of the phrases "partially filled" and "fully filled" refers to the foam filling the non-uniform or uniform channel 120. The at least one porous component and/or the at least one foam component is shown in FIG. 1A as reference number 160. In other words, a "fully filled foam channel" means that the non-uniform or uniform channel 120 is fully filled with foam or another porous material to its channel boundaries. A "partially filled foam channel" means that the non-uniform or uniform channel 120 is partially filled with foam or another porous material, such that there is remaining space between the foam and the channel boundaries. FIG. 32A-B shows a contemplated embodiment that has a partially filled non-uniform channel 120. The at least one porous component and/or the at least one foam component is shown in FIG. 32A-B as reference number 160.

As disclosed herein, innovative cooling systems are developed and analyzed employing jet impingement technology, high conductive metal foam, rib structured target surfaces, confined non-uniform small-scale channel, and conductive heat spreader plate. The base of the foam-filled cooling channel is subject to a uniform high heat flux value resembling the electronics device to be cooled. For numerical modeling of thermal transport through foam filled region, the local thermal non-equilibrium model in porous media is utilized resulting in two energy equations for solid and fluid phases.

For better understanding of flow and thermal characteristics of jet impingement through the combination of metal foam and rib structured surfaces in confined channels, several effective parameters are studied such as slot and circular jet impingements, the shape and orientation of the ribs, impinging jet velocity, applied heat flux and the thickness of conductive heat spreader plate for hotspot removal.

Some results discussed herein from contemplated embodiments show that the fully foam filled channel provides a more efficient cooling in comparison with partially foam filled channel. Furthermore, the results indicate the advantage of utilization of ribs at the stagnation region of the impinging jet, for local thermal treatment of hotspots. The perpendicular cuboid ribs placed at the stagnation zone of the coolant jet impingement provide 13% increase in maximum local Nusselt number while the increase in the pressure drop and required pumping power are as small as 4.2%. Doubling the velocity would result in 35.3% increase in the maximum local Nusselt number, 180% increase in the pressure drop and 460.7% increase in the required pumping power. An increase in the thickness of the conductive heat spreader plate increases the base local temperature but improves local temperature uniformity.

Specifically, high efficiency heat management devices for use with electronic components, are disclosed and include: at least one jet inlet channel, at least one non-uniform channel area or uniform channel area, at least two exit channels, at least one heat spreader conductive plate, wherein the at least one non-uniform channel area or uniform channel area is bounded by the at least one jet inlet channel, the at least two exit channels, and the at least one heat spreader conductive plate, and at least one porous component or at least one foam component, wherein the at least one porous component or at least one foam component at least partially fills the at least one non-uniform channel area or uniform channel area.

Figure 3A:
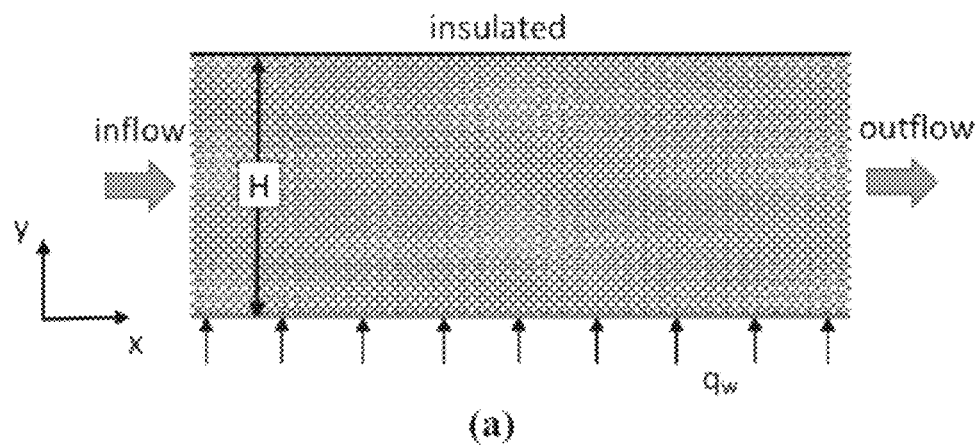
FIG. 3A-B shows a comparison of current numerical study with analytical data for flow through a uniform confined porous filled or foam filled channel (a) schematic diagram of the channel (b) non-dimensional solid and fluid temperature profiles at Bi=10, ε=0.1, κ=0.11 for Φ=0 and 1.

As used herein, the phrases "at least one porous component" or "at least one foam component" means that the components are porous and/or foam and are developed and/or configured to at least partially fill the non-uniform and/or uniform channels, such as the one shown in FIG. 3A, wherein the channel configuration component shown has a top surface and a base. These contemplated components can be doped, filled or infused with thermal management solutions, coolants, gases, or another suitable gas or liquid that can provide a degree of thermal management to the subject at least one component having a high heat flux value or the at least one component that requires thermal management.

As mentioned, contemplated devices include at least one porous component or at least one foam component. As mentioned earlier, utilization of porous inserts/components or foam inserts/components can enhance cooling effectiveness and temperature control by providing a large surface area for a given volume. Metal foam is a type of porous material with a system of interconnected metal filaments. At its basic unit, it is a polyhedron with twelve to fourteen hexagon or pentagon faces [2]. The metal foam tortuosity provides mixing of the fluid passing through the foam or pores and so improves heat transfer and temperature uniformity. The foam or porous material can be described by its porosity, filament thickness, permeability, pore diameter, and pore density. A reduction in pore size or porosity or an increase in pore density or flow's Reynold's number would result in higher heat transfer and pressure drop. Therefore, a compromise between the heat transfer rate and pressure drop should be made. Metal foams can be employed for advanced cooling systems. For instance, metal foam can be used to increase performance of heat sinks, by utilizing cooling through natural convection [17], applying metal foam or metal porous material between layers of finned heat sinks [18], and jet impingement through metal foam with a restricted outlet [19].

Contemplated metal foams may comprise any suitable metal, combination of metals, or metal-like composite material. A contemplated metal includes aluminum, palladium, platinum, nickel, titanium, osmium, copper, or combinations thereof. One characteristic of contemplated metal foams is that they have a relatively high porosity-which may be defined as 5-25% of the volume of the base metal. Contemplated composite materials, such as aluminum polymers, ceramics, or other suitable composite materials may also be used.

As mentioned earlier, contemplated devices provide thermal transport through four different porous filled configurations, namely confined or unconfined with totally filled or partially filled porous materials, respectively. Confined/unconfined geometries refer to whether flow through porous substrate is bounded by the channel walls (confined) or not (unconfined). Totally/completely filled or partially filled refers to the porous media and whether it encompasses every space through which the fluid flows. Partially filled cases usually have thin porous blocks adjacent to the base surface.

Contemplated heat management devices for use with an electronic component comprise at least one porous component or at least one foam component, wherein the at least one porous component or at least one foam component at least partially fills the at least one non-uniform channel area or uniform channel area. In some contemplated embodiments, the at least one porous component or at least one foam component completely fills the at least one non-uniform channel area or uniform channel area.

Contemplated heat management devices for use with an electronic component comprise at least one porous component or at least one foam component, wherein the at least one porous component or at least one foam component comprises a confined geometry. In other embodiments, contemplated heat management devices for use with an electronic component comprise at least one porous component or at least one foam component, wherein the at least one porous component or at least one foam component comprises an unconfined geometry.

In addition, heat management devices for use with an electronic components, are disclosed that include: at least one jet inlet channel, at least one non-uniform channel area or uniform channel area, at least two exit channels, at least one heat spreader conductive plate, wherein the at least one non-uniform channel area or uniform channel area is bounded by the at least one jet inlet channel, the at least two exit channels, and the at least one heat spreader conductive plate, and at least one porous component or at least one foam component, wherein the at least one porous component or at least one foam component at least partially fills the at least one non-uniform channel area or uniform channel area, at least one jet impingement of at least one thermal management liquid or gas, wherein the at least one jet inlet channel directs the at least one jet impingement of a liquid or a gas onto a surface of the at least one porous component or at least one foam component.

Contemplated thermal management liquids or gases may be any suitable liquid or gas or mixture of liquids or gases that effectively manages the thermal issues that come with use of electronics, biomedical devices, and powered electrical equipment, such as x-rays, lasers, ultrasound equipment, radiography machines, surgical equipment, and solar radiation receivers. Contemplated thermal management liquids or gases may be coolants or may be designed to provide heat to these components, if they are used in areas where the components are subjected to undesirable cooling, such that they cannot properly function. Thermal management liquids may be or comprise nanofluids, which are fluids that have suspensions of ultrafine solid nanoparticles, such as copper oxide, aluminum oxide, titanium dioxide, or combinations thereof. Thermal management liquids may also comprise water, deionized water, waterless coolants, glycols, such as ethylene glycol or propylene glycol, oils, liquid hydrogen, dielectric fluids, or combinations thereof.

Contemplated thermal management gases may comprise air, hydrogen, inert gases, sulfur hexafluoride, steam, liquid gases, such as carbon dioxide, liquid nitrogen, liquid hydrogen. or other suitable gases or combinations of gases.

Contemplated high efficiency heat management devices for use with a component comprise at least one jet inlet, wherein the at least one jet inlet comprises a suitable shape. In some embodiments, the shape is square or rectangular. Other shapes are also contemplated. In some embodiments, a contemplated high efficiency heat management device comprises at least one jet inlet that has a two-dimensional configuration or a three-dimensional configuration.

Figure 33:
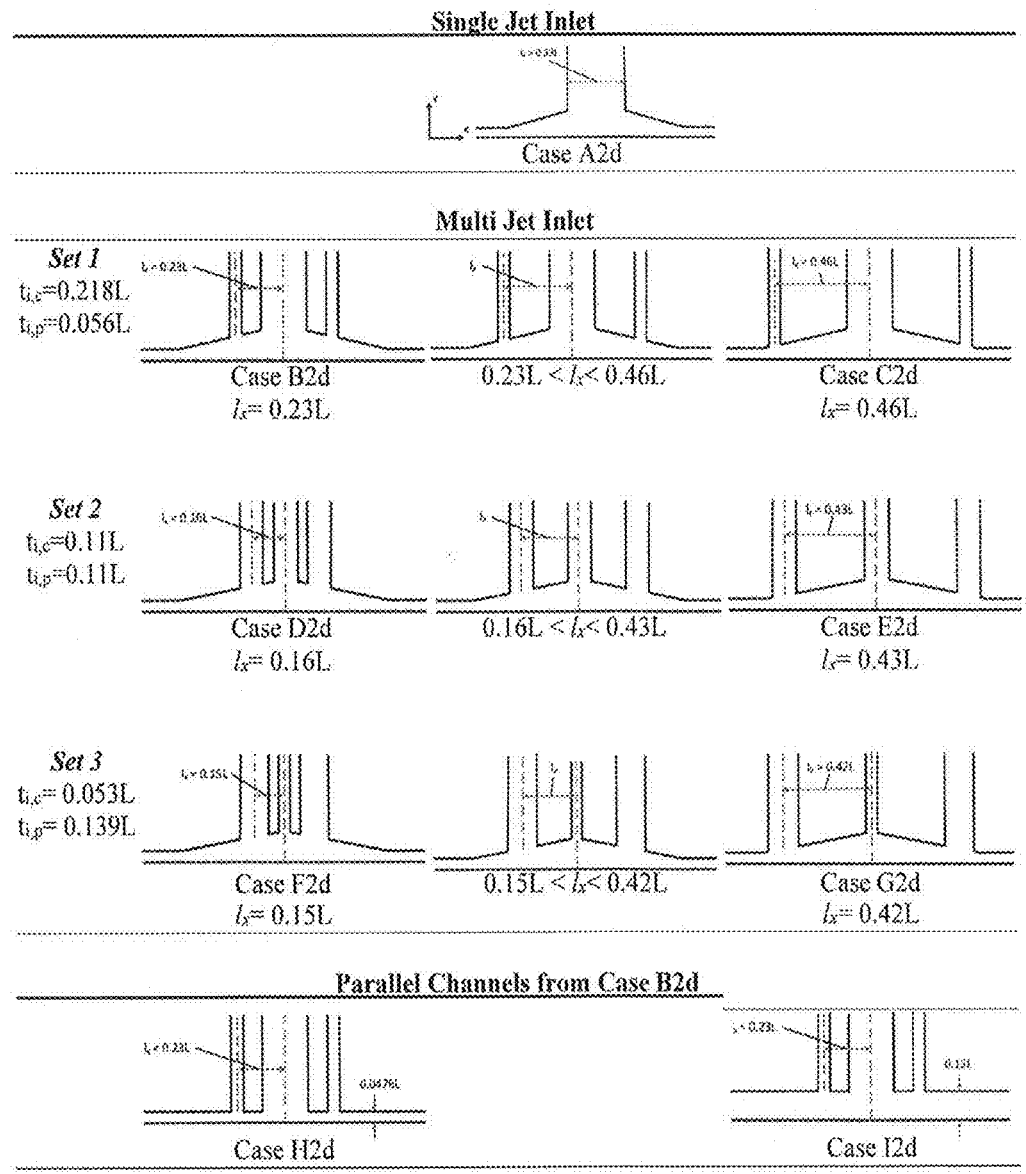
FIG. 33 shows the frontal view (x-y plane) of the investigated two dimensional single and multi jet impingement cases.

Contemplated jet inlets comprise or have a vertical enclosure (170) having a top (175), a bottom (180), and at least one side (190). These designs are shown in FIG. 33, including FIGS. 1A and 1D. As shown, contemplated at least one jet inlet comprises or has a tapered directional component (195) coupled with the bottom of the vertical enclosure.

As will be described in Example 3, contemplated heat management devices for use with electronic components may further comprise at least one rib structure component that is coupled with the at least one heat spreader conductive plate and is located in the at least one non-uniform channel area or uniform channel area. It should be understood that in embodiments where there is at least one rib structure component and at least one porous component or at least one foam component, the at least one rib structure component works in conjunction with the at least one porous component or the at least one foam component to manage the high temperatures and heat flux from the electronic components.

In some embodiments, heat management devices for use with electronic components, are disclosed and include: at least one jet inlet channel, at least one non-uniform channel area or uniform channel area, at least two exit channels, at least one heat spreader conductive plate, wherein the at least one non-uniform channel area or uniform channel area is bounded by the at least one jet inlet channel, the at least two exit channels, and the at least one heat spreader conductive plate, and at least one rib structure component that is coupled with the at least one heat spreader conductive plate and is located in the at least one non-uniform channel area or uniform channel area.

Contemplated high efficiency heat management devices for use with an electronic component comprise at least one component having a high heat flux value, wherein the electronic component has a top surface. Contemplated high efficiency heat management device for use with an electronic component comprises at least one non-uniform channel area or uniform channel area that is operationally near, coupled with, or connected to the top surface of the electronic component. Contemplated devices have several applications, including but not limited to, components such as electronics, biomedical devices, and powered electrical equipment, such as x-rays, lasers, ultrasound equipment, radiography machines, surgical equipment, and solar radiation receivers.

EXAMPLES

Example 1: Two-Dimensional and Three-Dimensional Configurations

Conductive porous filled heat exchangers with single or multiple jet impingements are numerically investigated employing local thermal non-equilibrium model in porous media (FIG. 1). The heat exchangers consist of confined, narrowing, porous filled channels or foam filled channels subject to uniform heat flux leaving the devices to be cooled. The inflow coolant enters through vertical inlet channels, passes through the porous material along inclined channels and leaves through the two lateral, open-volume exit channels. In all studied cases, the maximum thickness of the porous substrate, located under the central jet inlet, is 0.13 of the length of the porous insert at the base (L=5.25 cm). The thickness reduces to 0.048L at the exit channels. The porous substrate is constructed from copper and has a porosity value of 0.45 with a filament thickness of 4.315× $10^{-4}$ m [14]. The base surface of the heat exchanger is exposed to a uniform heat flux of $10^5$ W/m² and all other walls are assumed to be insulated. Fluid enters the heat exchangers at 300K with a uniform velocity, and flow would be hydraulically developed before reaching the porous insert.

Figure 1D:
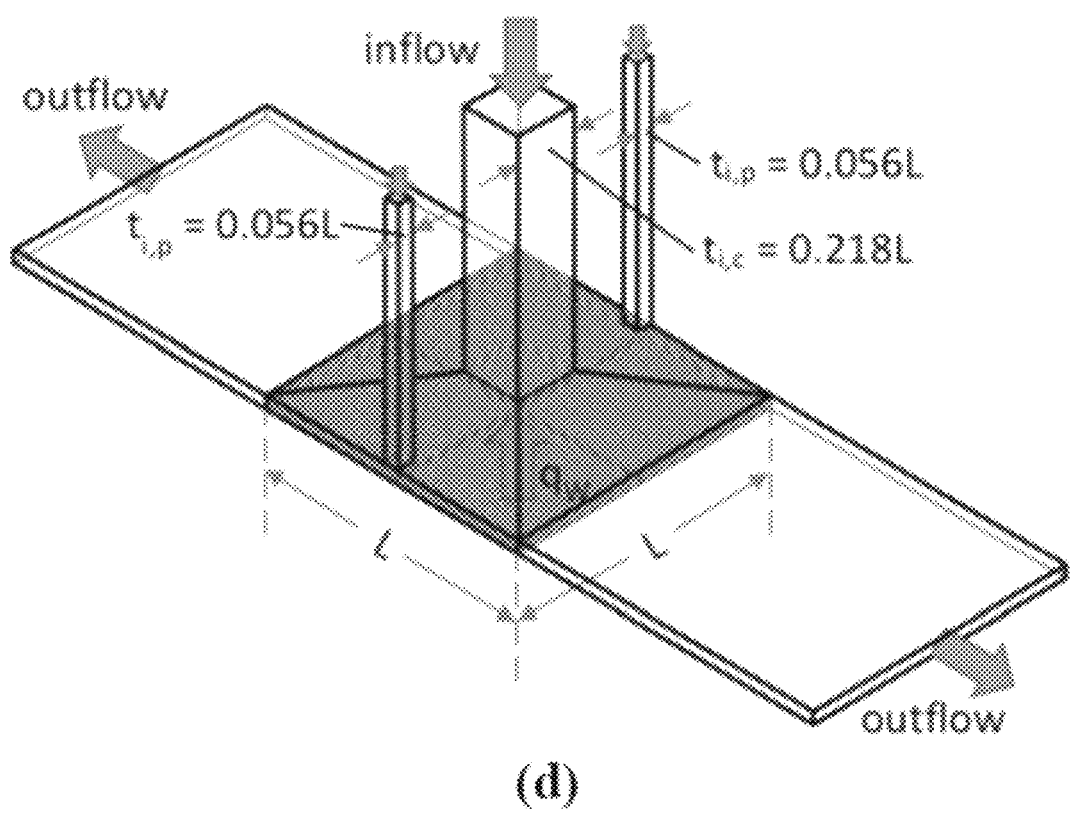

In this example, single and multi-jet inlets are investigated. The shape of the inlet cross section is either square or rectangular (elongated along the transverse direction), for both single and multi-jet injections. The heat exchangers with square jet inlets have porous inserts that taper off the same in all four directions from maximum central substrate thickness at each edge of the main central inlet to the minimum substrate thickness at the base's edges (FIG. 1D). The inlet channel thickness in the single inlet heat exchangers ($t_i$) is 0.33L. In multi jet cases, certain geometrical parameters are investigated such as location, orientation and size of jet inlet channels.

Several two-dimensional multi-inlet porous filled heat exchangers are numerically modeled to obtain an advantageous design for the size and location of multi jet inlets along streamwise direction (FIG. 33). The studied cases are categorized in three sets: the first set with the thickest inlet at the center and two narrow symmetric peripheral lateral jets, the second set with similar inlet sizes, and the third set with the narrowest inlet at the center and two thick symmetric peripheral lateral jets. The thicknesses of central and peripheral inlets are indicated in FIG. 33 for each set. For each set, the effect of distance between the central and peripheral inlet channels ($I_x$) is also examined by studying multiple cases for each set (FIG. 33). In addition, for studying the effect of inclined channel walls on base wall temperature value and uniformity, cases H2d and I2d are studied. These cases are equivalent to case B2d but with parallel channels with thickness of 0.048L and 0.13L, respectively, which are the minimum and maximum channel thicknesses of case B2d. For all two-dimensional studies, flow enters with a velocity of 3 cm/s and temperature of 300 K.

Figure 34:
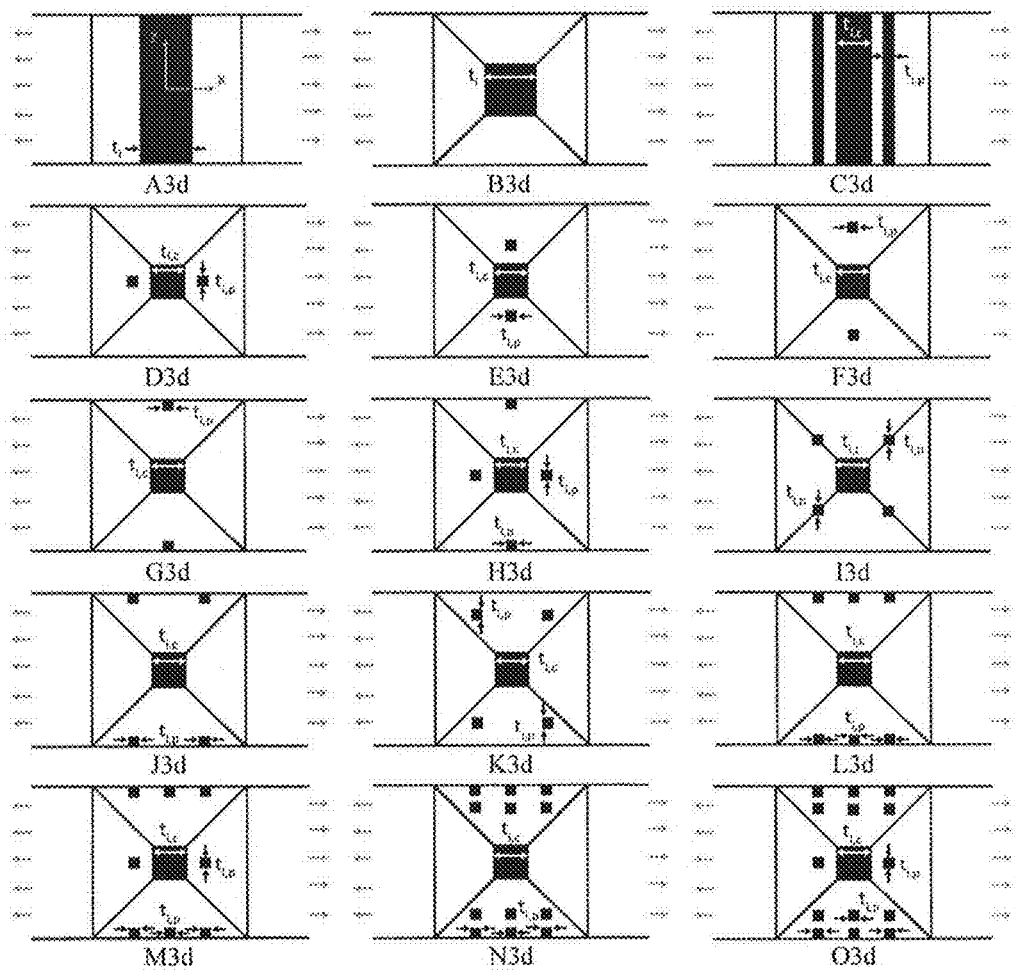
FIG. 34 shows the top view (x-y plane) of the investigated three dimensional single and multi jet impingement cases.

For three dimensional designs, single inlet Cases A3d and B3d are developed based on the two-dimensional case A2d with rectangular and square cross sections respectively, and so with the inlet thickness of $t_i$=0.33L (FIG. 34). To design three dimensional multi jet inlet cases, the obtained advantageous design from two-dimensional study (case B2d) is utilized indicating the size and location of inlet jets along streamwise direction. For the multi-inlet geometries (FIG. 34), the peripheral inlets are parallel to the central inlet and located along the narrowing channels. The central inlet channel in these cases has a thickness of $0.66t_i$ (i.e. $t_{ic}$=0.218L) and the thickness of peripheral channels are each $0.17t_i$ (i.e. $t_{ip}$=0.056L). However, for all studied three-dimensional cases (with single or multiple inlets), flow enters with similar overall flow rate of 27.29 cm³/s and temperature of 300 K. As such, the inflow velocity is adjusted for each design to provide similar volume flow rate. For single inlet channel cases of A3d and B3d, inflow velocity values are 3 cm/s and 9.091 cm/s, respectively. For each multi-inlet case, inflow velocity values are identical in all central and peripheral inlets. The inflow velocity is 3 cm/s for case C3d, while the velocity for the cases with multi square cross section inlets (FIG. 34, cases D3d-O3d) are 18.425 cm/s, 16.493 cm/s, 14.928 cm/s, 13.634 cm/s, 11.619 cm/s, and 10.82 cm/s for cases with 2, 4, 6, 8, 12, and 14 peripheral inlets, respectively.

Two coolants of water and 5% titanium dioxide ($TiO_2$) in water nanofluid are investigated. The coolants are treated as homogenous liquids with Newtonian behavior whose effective properties are presented in Table 1 [15, 30, 34-36]. Some of the represented data and discussions will focus on the streamwise and transverse centerlines of the three-dimensional geometries. The streamwise centerline is the center base line towards the exit channels (along x axis), and the transverse centerline is the center base line perpendicular to streamwise line (along z axis).

TABLE 3

| | ρ (kg/m³) | c (J/kg K) | k (W/m K) | μ (kg/m s) |
|---|---|---|---|---|
| Water | 998.2 | 4182 | 0.6 | 0.001003 |
| 5% titanium dioxide in water nanofluid | 1157 | 4007.5 | 0.774 | 0.001394 |

Governing Equations

Two different regions will be analyzed in this system: the porous substrate and the entrance/exit channels.

Inlet-Exit Channels:

The governing equations used for steady state, incompressible, single phase, and laminar flow inside the entrance and exit channels are:

$$\nabla \cdot \hat{v} = 0 \quad (1)$$

$$\rho_f \hat{v} \cdot \nabla \hat{v} = -\nabla P + \mu \nabla^2 \hat{v} \quad (2)$$

$$\rho_f c_f (\hat{v} \cdot \nabla T) = k_f \nabla^2 T \quad (3)$$

They represent the continuity, momentum, and energy equations, respectively.

Porous Substrate:

For the porous region of the system, the steady state, single phase, and volume averaged governing equations are [14]:

$$\nabla \cdot \langle \hat{v} \rangle = 0 \quad (4)$$

$$\frac{\rho_f}{\varepsilon} \langle (\hat{v} \cdot \nabla) \hat{v} \rangle = -\nabla \langle P \rangle^f + \frac{\mu}{\varepsilon} \nabla^2 \langle \hat{v} \rangle - \frac{\mu}{K} \langle \hat{v} \rangle - \frac{\rho_f F \varepsilon}{\sqrt{K}} [\langle \hat{v} \rangle \cdot \langle \hat{v} \rangle] J \quad (5)$$

$$k_{f,eff} \nabla^2 \langle T_f \rangle^f + h_i a_i (\langle T_s \rangle^s - \langle T_f \rangle^f) = \varepsilon \rho_f c_f \langle \hat{v} \rangle \cdot \nabla \langle T_f \rangle^f \quad (6)$$

$$k_{s,eff} \nabla^2 \langle T_s \rangle^s - h_i a_i (\langle T_s \rangle^s - \langle T_f \rangle^f) = 0 \quad (7)$$

where:

$$F = \frac{\beta}{\sqrt{\alpha \varepsilon^3}} \quad (8)$$

$$K = \frac{\varepsilon^3 d_f^2}{\alpha (1-\varepsilon)^2} \quad (9)$$

$$k_{f,eff} = \varepsilon k_f \quad (10)$$

$$k_{s,eff} = (1-\varepsilon) k_s \quad (11)$$

where β and α are equal to 1.75 and 150, respectively [5]. The interstitial heat convection coefficient ($h_i$) and interfacial surface area ($a_i$) are evaluated from the following equations [37]:

$$\frac{h_i d_f}{k_f} = 0.52 \left( \frac{u d_f}{\varepsilon \upsilon} \right)^{0.5} Pr^{0.37} \quad (12)$$

$$a_i = \frac{3 \pi d_f}{(0.59 d_p)^2} \left[ 1 - e^{-((1-\varepsilon)/0.04)} \right] \quad (13)$$

where u represents the average fluid velocity in the porous substrate region. The pore diameter ($d_p$) is obtained from the following equations [38]:

$$\frac{d_f}{d_p} = 1.18 \sqrt{\frac{(1-\varepsilon)}{3\pi}} \frac{1}{1 - e^{-((1-\varepsilon)/0.04)}} \quad (14)$$

Note that the pore diameter ($d_p$) could be representing cell diameter in [37-38]. Cell diameter is the diameter of the average polyhedron of the metal foam, while pore diameter is the diameter of the average face of the polyhedron.

Numerical Methodology

For numerical modeling, an implicit, pressure-based, cell-centered control volume method is employed to solve the coupled and non-linear governing equations [15]. Utilizing ANSYS FLUENT, the governing equations are first discretized to convert the nonlinear equations to linear forms. The gradients are evaluated utilizing the Least Squares Cell Based method. Convective terms are discretized using a second order upwind scheme, while a central differencing scheme is utilized for diffusive terms and cell face pressure. The SIMPLE pressure-based segregated algorithm is utilized and would iterate until the scalar's globally scaled residual reaches a minimum of $10^{-6}$, as convergence criteria. Iterative method of Gauss-Seidel along with Algebraic Multigrid (AMG) scheme is utilized [15].

Two equation energy model in porous media is employed in this study utilizing the assumption of local thermal non-equilibrium between solid and fluid phases. As such, two coincident grids are generated for porous filled region, one for the porous matrix solid phase and one for the fluid phase. Energy transfer between the phases is dictated by interstitial heat convective coefficient ($h_i$) and interfacial surface area ($a_i$). The fluid and solid phases are connected to the heat exchanger base wall that is subject to a uniform high heat flux. The coupled interface between the phases and the base would allow energy to freely flow between the base and the phases. Inflow and outflow boundary conditions are applied at the inlet and outlet boundaries, all other surfaces are adiabatic walls with no slip condition, except base surface, which is subjected to a uniform heat flux. To represent results, non-dimensional base temperature (Ow) is defined as:

$$\theta_w = \frac{k_s(T_w - T_{in})}{q_w t} \quad (15)$$

Grid Independence Study

Figure 2A:
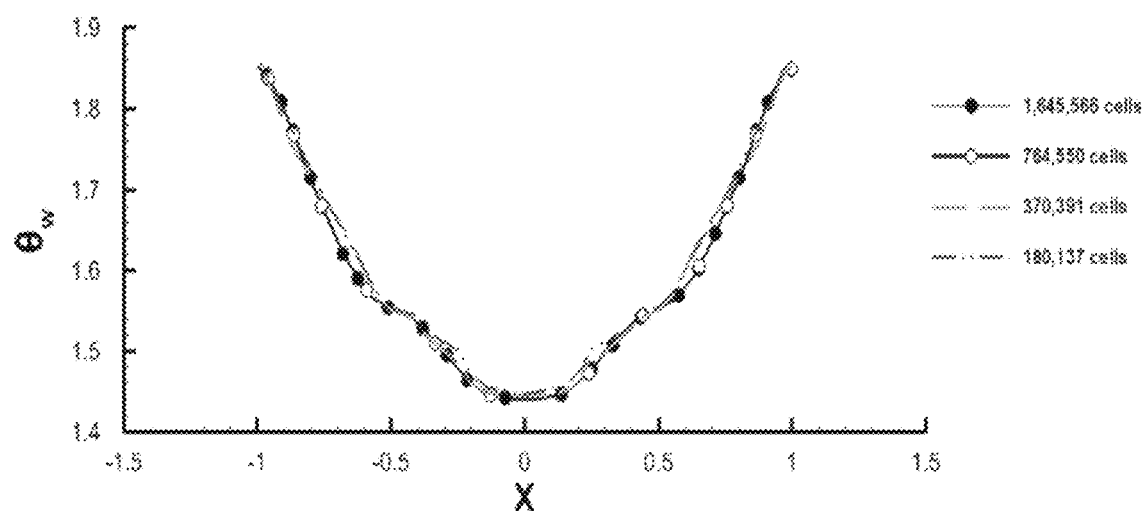
FIG. 2A-B shows non-dimensional base temperature profiles along the streamwise direction for grid independence study (a) Case C3d and (b) Case N3d.
Figure 2B:
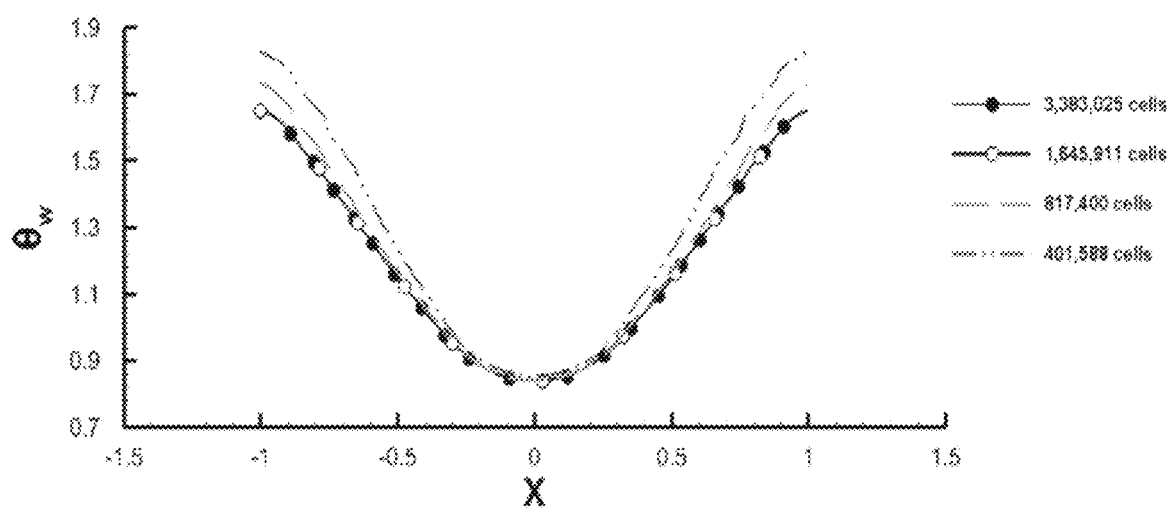

For grid generation, a quadrilateral structured multi-block mesh is utilized. In order to properly capture flow field characteristics, finer mesh sizes are applied within the porous region and adjacent to the wall boundaries. For each investigated studied case, grid independence study is performed by studying multiple grid sizes to make sure the results are independent of grid sizes. For instance, in FIG. 2, non-dimensional temperature distributions along the streamwise centerline for different grid sizes are compared for cases of C3d and N3d (defined in FIG. 33). All studied cases consist of a copper porous substrate with the porosity of 0.45 and are subject to a uniform heat flux of $10^5$ W/m$^2$. The working fluid is set to be water and the two-equation model with the assumption of local thermal non-equilibrium is employed for modeling thermal transport through porous media. The results indicate that the grids with 764,550 cells and 1,645,911 cells result in a grid independent solution for the cases of C3d and N3d, respectively (FIG. 2).

Code Validation Study

Figure 3B:
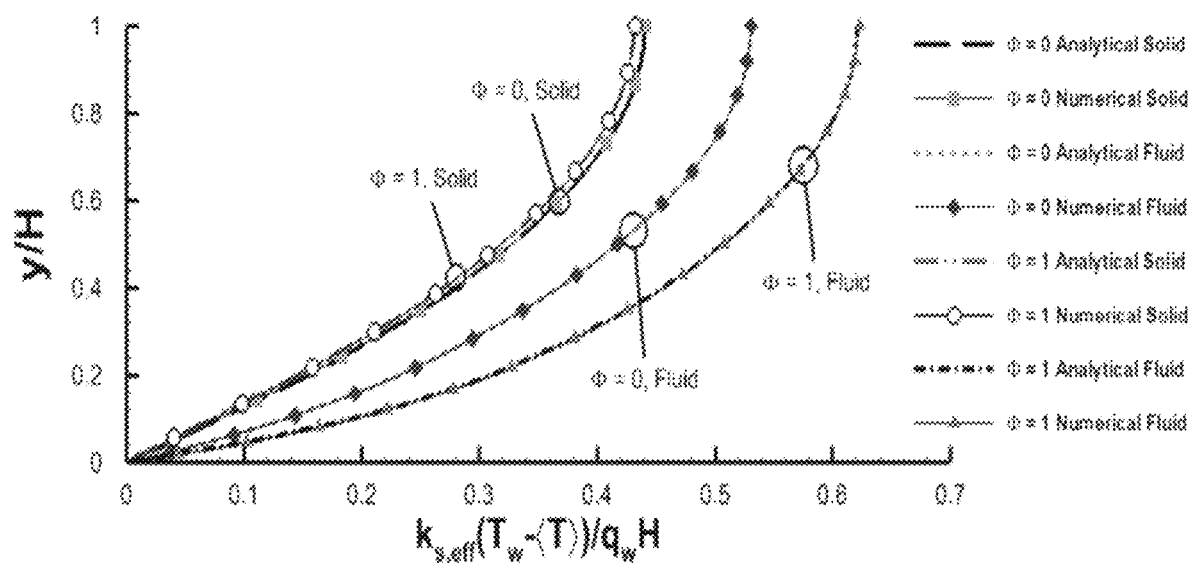

To validate numerical modeling and results, a uniform cross section porous filled channel subject to a constant heat flux at its one side is numerically simulated (FIG. 3A). The other side of the channel is insulated. The analytical solution for flow through this channel is presented in [39]. The non-dimensional temperature profiles for solid and fluid phases obtained from the present numerical study are validated against those of the analytical solution for two different values of non-dimensional heat generation (φ) within the porous solid matrix (FIG. 3). The Biot number (Bi), porosity (ε) and the ratio of the effective thermal conductivity of fluid to that of solid (κ), defined in the following equations [39], are selected to be 10, 0.1, and 0.11, respectively. The investigated non-dimensional heat generation values are 0 and 1 [39].

$$Bi = \frac{h_i a_i H^2}{k_{s,eff}} \quad (16)$$

$$\kappa = \frac{k_{f,eff}}{k_{s,eff}} \quad (17)$$

$$\Phi = \frac{(1-\varepsilon) H \dot{q}_{gen}}{q_w} \quad (18)$$

where, H is the channel height. The comparison of the numerical and analytical temperature profiles for both fluid and solid phases indicates an excellent agreement in the results for different non-dimensional heat generation values (FIG. 3).

Results

Multi-jet impingements through high conductive porous filled heat exchangers are developed based on earlier studies on single jet impingement [29]. Local thermal non-equilibrium model in porous media is employed to accurately capture solid and fluid phase temperatures. The temperature values for single and several multi jet impingement cases are compared and analyzed for different jet shape, location and orientation to obtain proper designs with low and uniform temperature values at the base wall subject to a high heat flux.

Size and Location of the Inlet Channels in Multi Jet Impingement

Figure 4A:
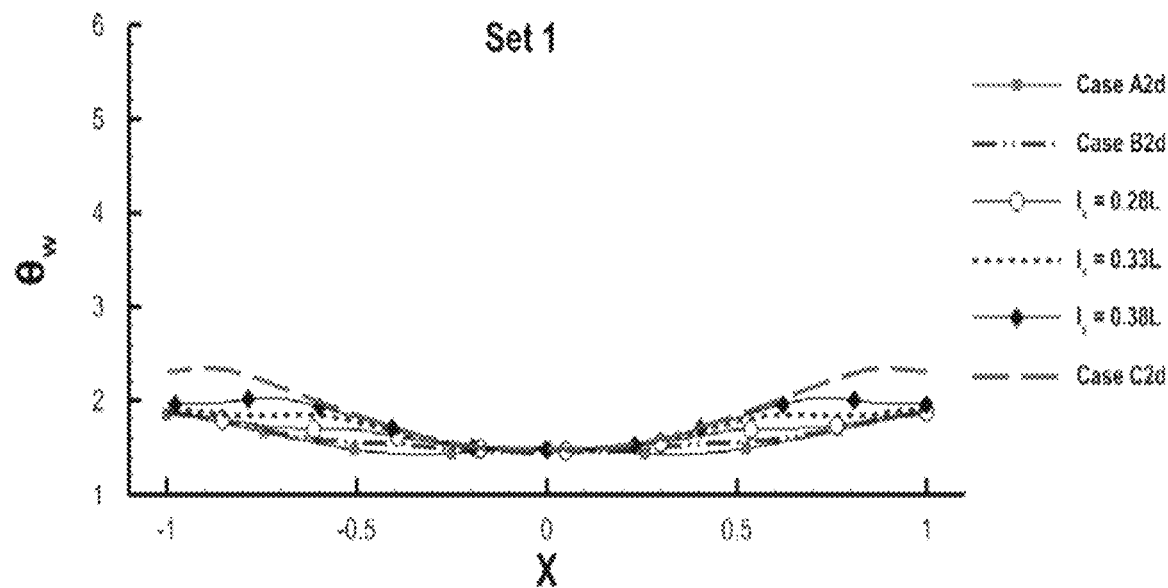
FIG. 4A-C shows non-dimensional base temperature for investigated two dimensional cases defined in FIGS. 33 (a) set 1 (b) set 2 (c) set 3.
Figure 4B:
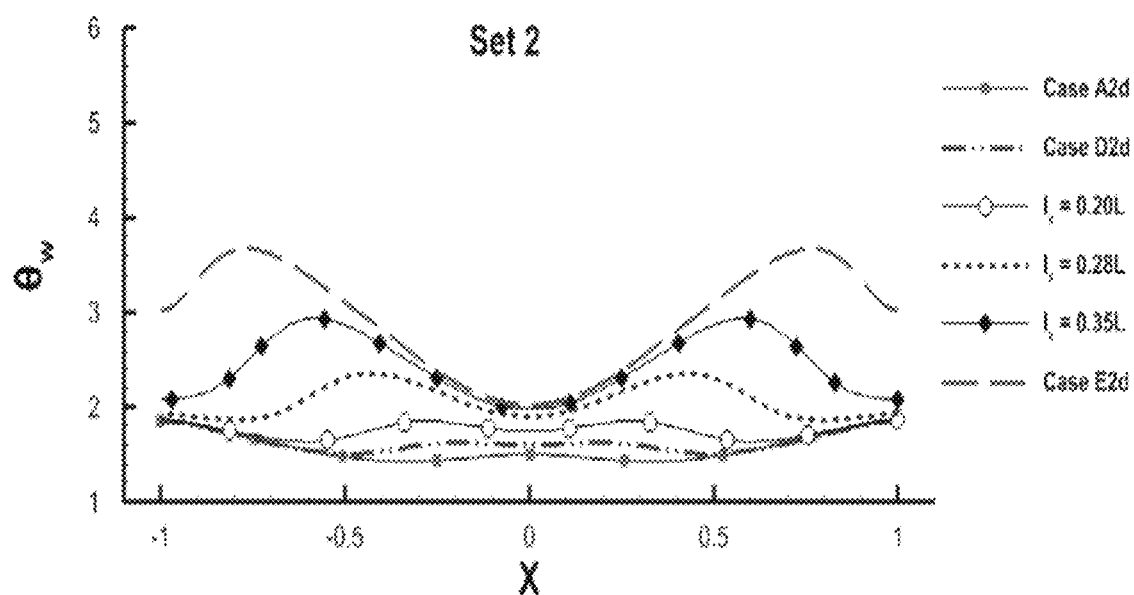
Figure 4C:
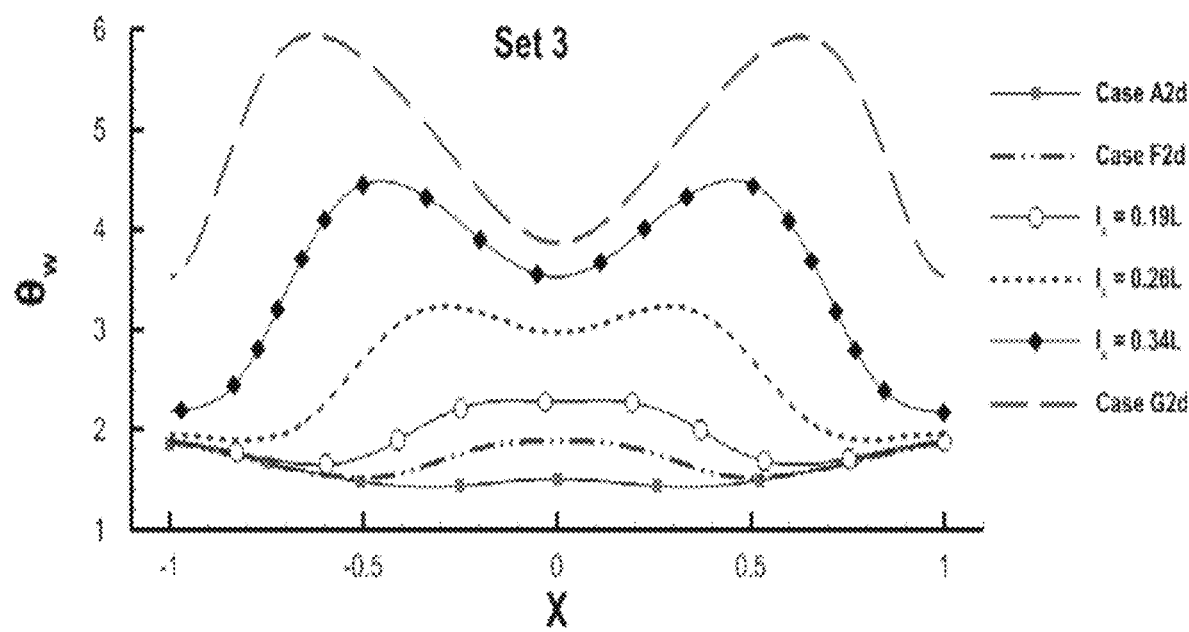

The size and location of multi jet inlets along streamwise direction is investigated by studying multiple cases categorized as three geometrical sets (FIG. 33). Comparing the results of three sets indicate that the cases with thicker cross-sectional central jet (set 1) provide lower and more uniform temperature values on the base wall and so more efficient cooling (FIG. 4). Note that the overall inflow volume flow rate and velocity are kept the same for all these studied cases. As such, a reduction in the thickness of the central jet inlet results in a larger thickness for the lateral peripheral jets and larger flow rate passing through peripheral jets. Therefore, lower flow rate would pass through the central jet resulting in less interaction between the coolant and conductive solid porous structure and less thermal transport and cooling effectiveness. That confirms the advantage of set 1 compared to the other sets.

In addition, multiple designs are investigated for each set to evaluate the effects of location of the jet inlets on the base temperature distribution (FIG. 33). The distance between the centers of central and peripheral jets is indicated as $I_x$. Comparing the base temperature distribution for all sets depicts that the further the peripheral jet inlets move away from the central jet, the higher and more non-uniform the surface temperatures are likely to be (FIG. 4). This is mostly due to the fact that the coolant injected from the peripheral jets would leave from the closest exits and so have less engagement with porous substrate during the cooling process when peripheral jet inlets get closer to the exits.

The studied multi jet inlet cases are also compared with single jet inlet case (Case A2d). In the single jet case, the stagnation region in front of the jet causes a sinusoidal like behavior temperature profile with a high temperature peak and low cooling effectiveness at the center of the base [29]. This issue can be resolved by proper design of multi jet impingement heat exchanger. For instance, case B2d can resolve this issue while providing low temperature and appropriate temperature uniformity on the base (FIG. 4). Having further or larger peripheral jets would also resolve the high temperature peak issue at the stagnation point in front of the jet impingement but results in higher temperature values and larger temperature non-uniformity (FIG. 4).

Porous Filled Channel Thickness and Inclined Walls

Figure 5:
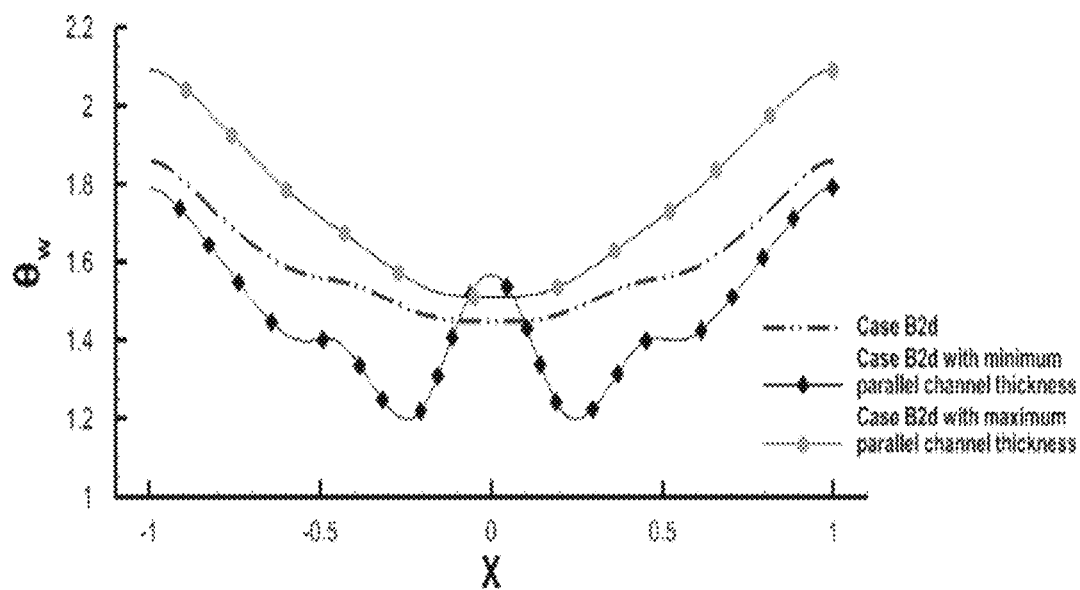
FIG. 5 shows non-dimensional temperature distribution along streamwise direction for channels with and without inclined walls.

The heat exchangers in this work employ inclined walls to better control the base temperature uniformity. It is shown that for the cases with single jet inlet, the selected inclination angle can better provide low and uniform temperature at the base compared to the cases without an inclination angle [29]. The effect of the inclined wall for multi jet impingement is investigated in FIG. 5 by comparing the advantageous design obtained earlier (caseB2d) with two parallel channels whose thicknesses are the same as the minimum and maximum thickness of case B2d, defined as cases F2d and G2d in FIG. 33. The non-dimensional temperature distribution indicates that caseB2d provides a more uniform temperature profile at the base. The thin parallel channel may provide less temperature values, but it provides a considerably non-uniform and sinusoidal like behavior temperature profile with a high temperature peak at the base center (FIG. 5).

Orientation and Placement of the Inlet Channels in Multi Jet Impingement

Figure 6A:
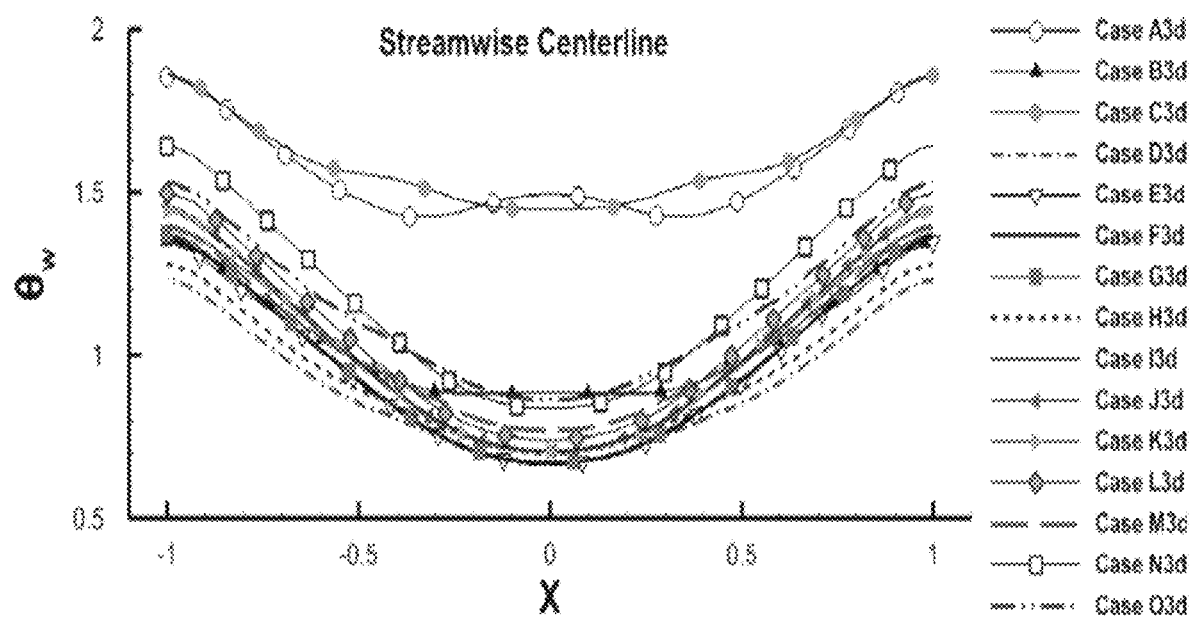
FIG. 6A-B shows non-dimensional temperature profiles across the base for investigated three dimensional single and multi-inlet cases A3d-O3d (a) along streamwise direction and (b) along transverse direction.
Figure 6B:
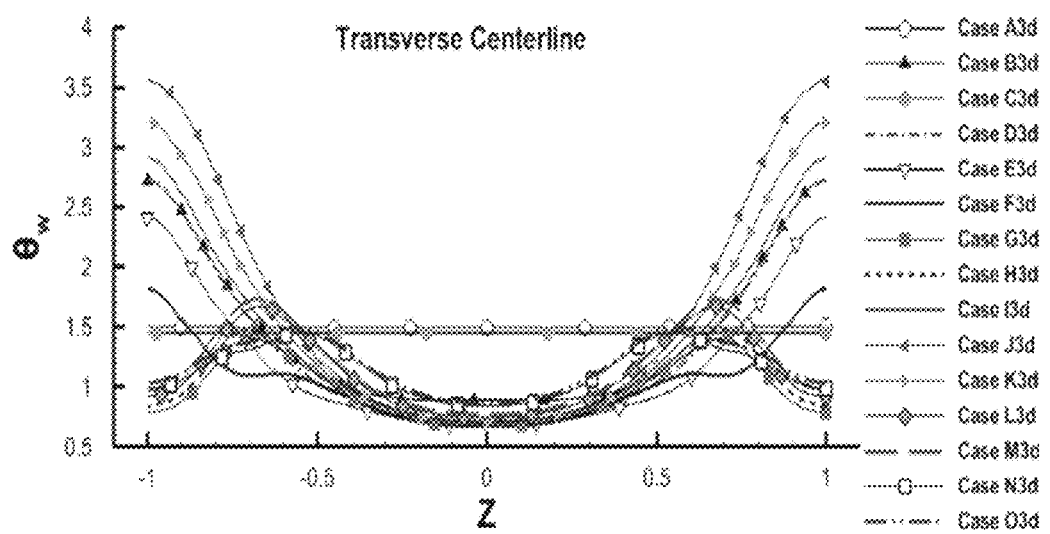

For evaluation of shape, location, and orientation of jets in multi jet injection, multiple designs are studied which are developed based on the advantageous case B2d (FIG. 34). Case C3d has rectangular multi-inlets elongated in transverse direction and cases D3d-O3d employ square cross section multi-inlets. In FIG. 6, non-dimensional temperature distributions along streamwise and transverse centerlines are compared for all these studied cases. The coolant is water and the base of each heat exchanger is subject to a heat flux of $10^5$ W/m². The results indicate that the cases with rectangular cross-section elongated in transverse direction (cases A3d and C3d) result in a more uniform temperature profile. However, the base wall temperature values are generally higher compared to those of the cases with square cross-sectional inlets, especially along streamwise direction (FIG. 6A). Comparing square cross sectional multi jet cases, cases with proper peripheral jets in transverse direction (G3d, H3d, L3d, M3d, N3d, O3d) can better provide temperature uniformity along transverse direction as well as having low temperature values. Note the entering flow rate is the same in all cases and the velocity is adjusted based on the cross-section surface area.

Figure 7:
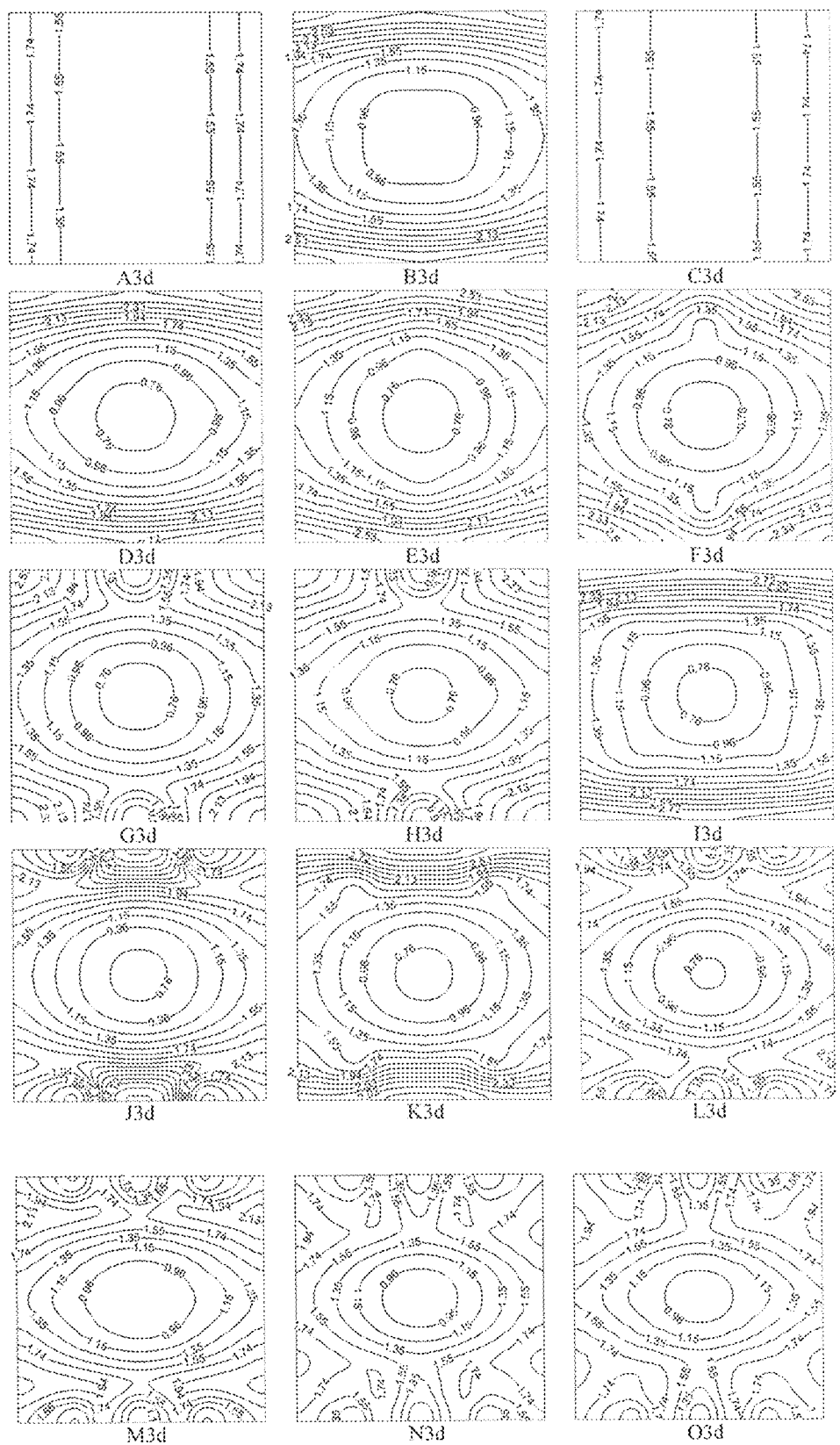
FIG. 7 shows non-dimensional temperature contours across the base of cases A3d-O3d.

Non-dimensional temperature contours at the base wall are presented for all studied cases (A3d-O3d) in FIG. 7. As expected, the contours depict an almost uniform temperature distribution along streamwise direction with no change in transverse direction for the cases of A3d and C3d with rectangular cross sections. The single inlet case B3d does not provide proper cooling along the walled edges (Z=−1 and Z=1). Among the cases with multi square cross-sectional inlets, higher temperature values are seen at the ends of the transverse direction in the cases with the closest peripheral jets to the central jet (cases D3d, E3d, I3d), indicating low heat transfer effectiveness in these designs (FIG. 7). In general, the flow moves towards the exits and avoid flowing in the transverse direction towards the walled edges. By moving the peripheral inlets closer to these walls, the low heat transfer band is minimized (Cases F3d and K3d, FIG. 7). When the peripheral jet inlets reach the edges, the low heat transfer band starts to break apart (Cases G3d, J3d, L3d, N3d, FIG. 7). In addition, adding peripheral jets near the central jet along streamwise direction can result in lower temperature values along streamwise direction (cases H3d, M3d, O3d, FIG. 7). In overall, cases G3d and H3d result in larger area with very low temperature values in the central region of the base, compared to the other cases. However, the cooling of the base corners is not as well as the other regions. Case O3d provides the most uniform temperature distribution over the base, in comparison with other cases with square inlets, especially in the central region. Case O3d results in a considerably smaller area of very low temperature at the base compared to cases G3d and H3d (FIG. 7).

Solid and Fluid Phase Temperature Profiles within Porous Substrate

Figure 8A:
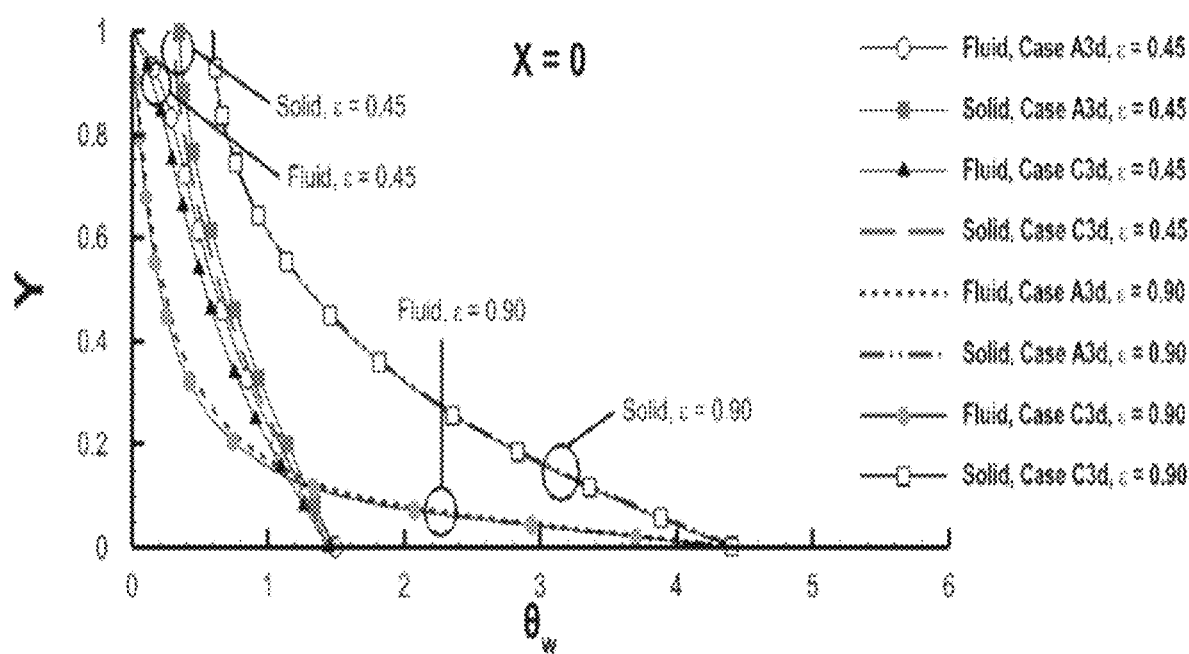
FIG. 8A-C shows non-dimensional fluid and solid temperature profiles for cases A3d and C3d with porosity values of 0.45 and 0.9 (a) X=0, (b) X=0.5, and (c) X=1.
Figure 8B:
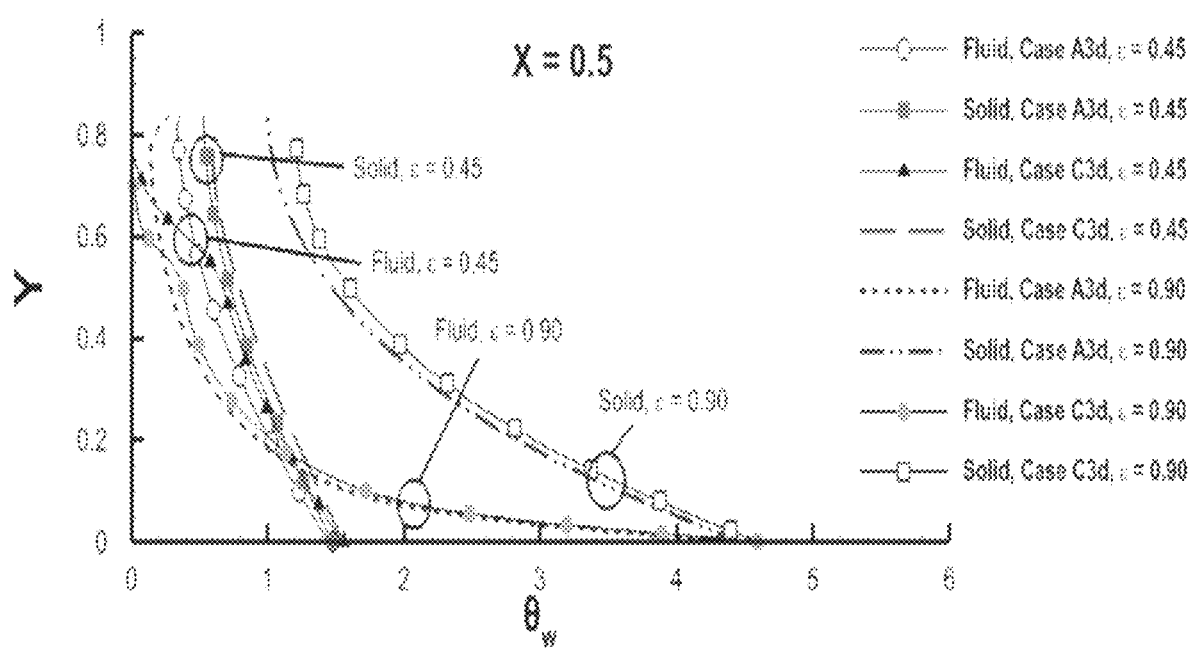
Figure 8C:
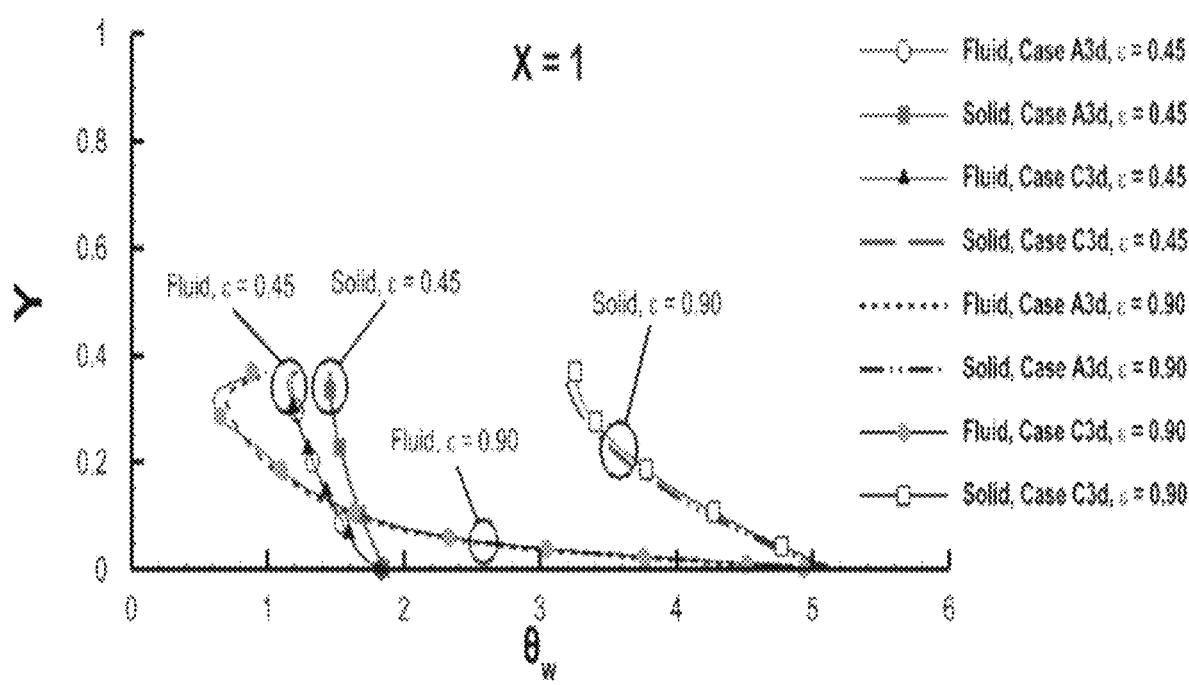

In this work, two equation energy model in porous media is employed considering local thermal non-equilibrium between fluid and solid phases. The obtained non-dimensional solid and fluid temperature profiles along the vertical coordinate are investigated for single and multi-inlet cases of A3d and C3d, for porosity values of 0.45 and 0.9. The profiles are presented for different locations within the porous substrate; at the center (X=0), at the porous exit (X=1), and in the middle of them (X=0.5) as depicted in FIG. 8. In all temperature profiles, the maximum temperature occurs at the base wall (Y=0) which is subject to a uniform high heat flux value. Both solid and fluid temperatures decrease while getting far from the base. In addition, the results show that increasing the porosity value results in more deviation between solid and fluid temperature profiles. This is due to the fact that porosity is inversely proportional to the volumetric heat transfer coefficient [40], i.e. high porosity corresponds to low volumetric heat transfer coefficient and so more temperature difference between solid and fluid phases. That indicates the importance of employing the two-equation model for studying thermal transport through porous substrate especially for high porosity values. At each point, the difference between the fluid and solid phase temperatures also changes by location and the largest deviation is observed near the exit of porous substrate (X=1). At high porosity values, the fluid temperature profile does not change considerably as flow moves through the substrate while the solid temperature values change. Comparing single and multi-inlet cases (A3d and C3d), non-dimensional fluid and solid temperature profiles show somehow similar behavior and a little difference is observed between the temperature values of these cases.

Effect of $TiO_2$ Nanofluid Coolant and Porosity

Figure 9A:
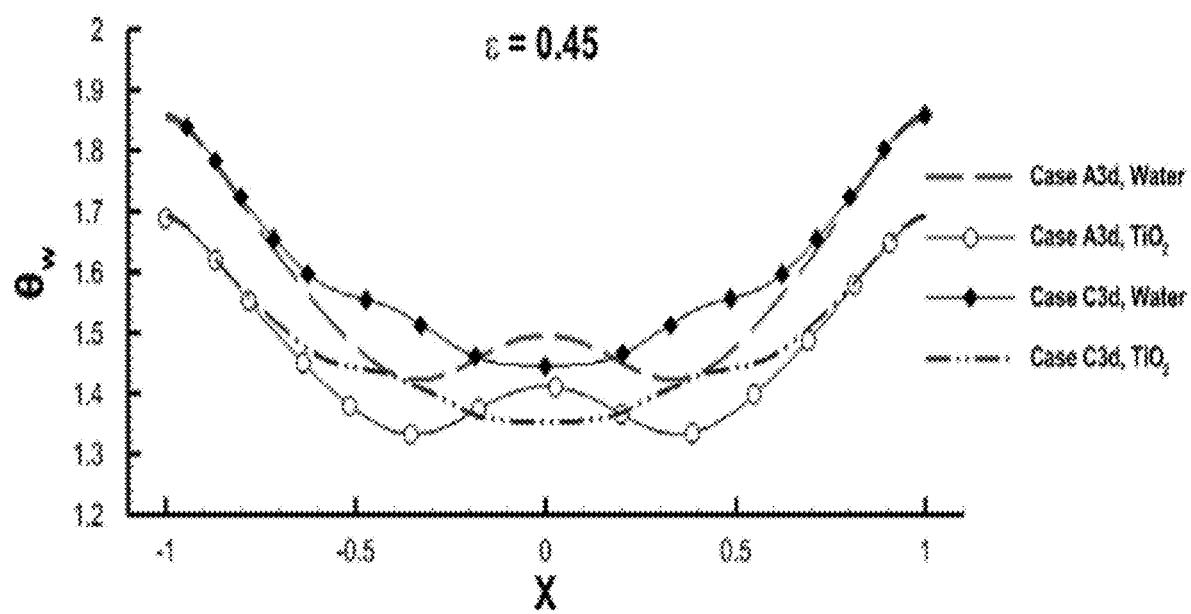
FIG. 9A-C shows non-dimensional base temperature along streamwise direction (a) cases A3d and C3d with water and $TiO_2$ coolants and ε=0.45, (b) cases A3d and C3d with water and $TiO_2$ coolants and ε=0.9, and (c) cases B3d, D3d, G3d, H3d, L3d, M3d, N3d, and O3d with Tio2 coolant and ε=0.45.
Figure 9B:
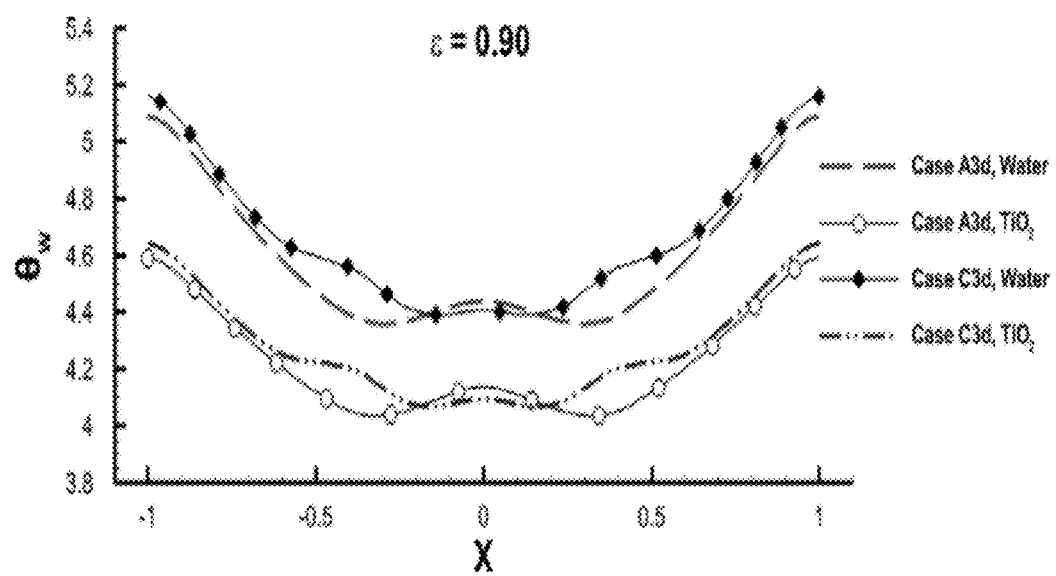

The effect of utilization of 5% titanium dioxide ($TiO_2$) in water nanofluid coolant is investigated for porosity values of 0.45 and 0.90 in FIG. 9. The comparison of non-dimensional temperature profiles of cases A3d and C3d at the base along streamwise direction are compared for water and TiO2 nanofluids coolants for porosities of 0.45 and 0.9 in FIGS. 9A and 9B. The results show that utilization of $TiO_2$ nanofluid reduces the base temperature and therefore improves cooling effectiveness regardless of the porosity value and geometry. Similar to the results for water coolant, the results indicate more temperature uniformity along the base of the multi-inlet case in comparison with the single inlet case (FIGS. 9A and 9B). A reduction in porosity results in lower base temperature but larger pressure drop. The multi-inlet channel design is developed to eliminate high temperature peak at the stagnation point and to provide more temperature uniformity along the base.

Figure 9C:
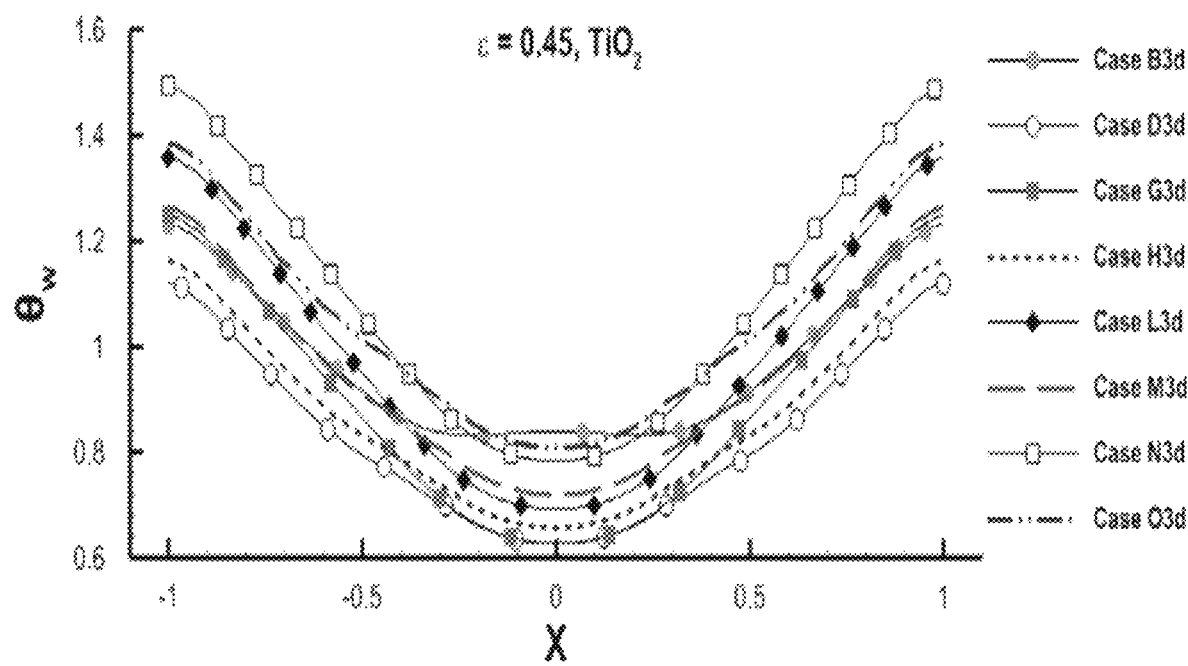

Non-dimensional temperature profiles of the single inlet case B3d and six different multi-inlet channel cases (D3d, G3d, H3d, L3d, M3d, N3d, and O3d) at the base along streamwise direction are studied employing 5% titanium dioxide ($TiO_2$) in water nanofluid coolant for porosity of 0.45 (FIG. 9C). Comparing the results presented in FIGS. 6A and 9C indicate the improvement of cooling either by utilization of $TiO_2$ nanofluid or by using cases G3d and H3d.

Example 2: Analysis of Contemplated Porous Filled Heat Exchangers

Code Validation Study

Figure 10A:
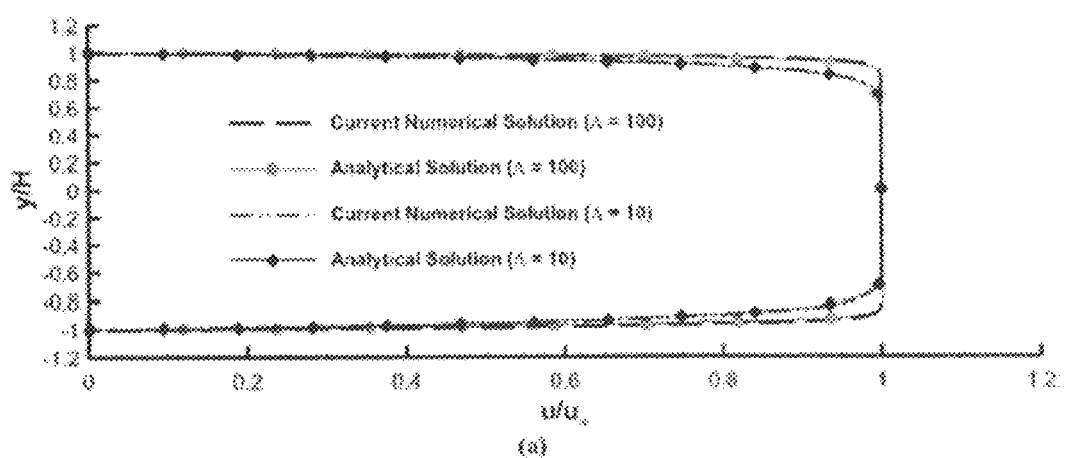
FIG. 10A-B shows a comparison of the non-dimensional velocity and temperature profiles in a porous filled channel with those of an analytical solution by Vafai and Kim at $Da^{-1/2}$ and Λ=10, 100 (a) non-dimensional velocity, (b) non-dimensional temperature.
Figure 10B:
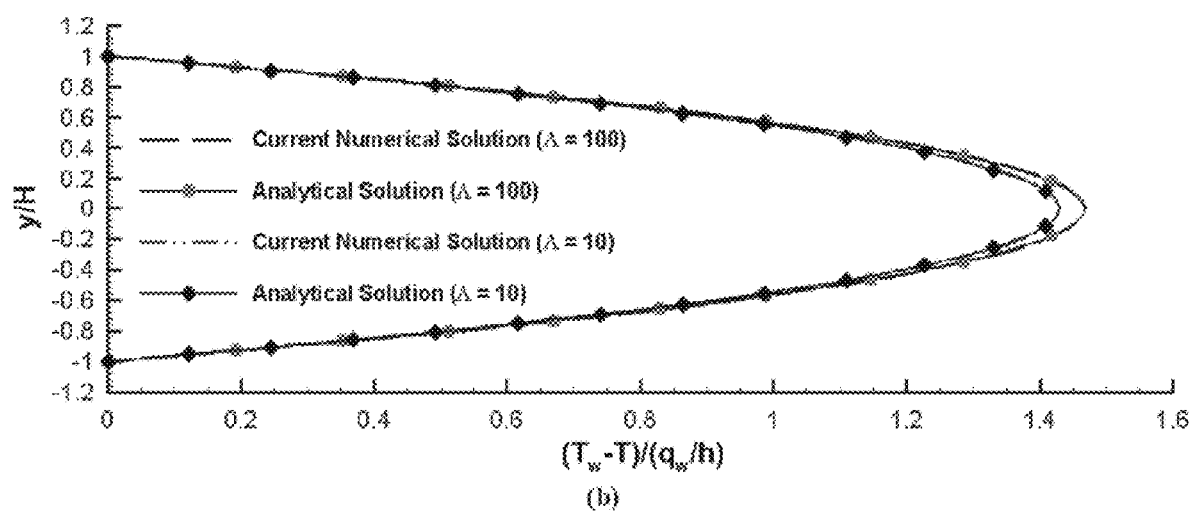

To validate the numerical modeling and the results, the velocity and temperature profiles are validated against those of analytical solution by Vafai and Kim [16], for a fully developed flow through a porous filled parallel-plate channel, subject to a uniform heat flux from both plates. The comparisons are performed for two different values of inertia parameters (K) at a Darcy number of $Da^{-1/2}=10$, defined as $$Da = \frac{1}{H^2}\frac{K}{\varepsilon} \quad (10)$$

$$\Lambda = \varepsilon^{3/2} F \frac{u_w H}{v_f} \quad (11)$$

where 2H indicates the channel height. The comparison of the results indicates an excellent agreement for velocity and temperature profiles for different inertia parameters (FIG. 10).

Grid Resolution Study

Figure 11A:
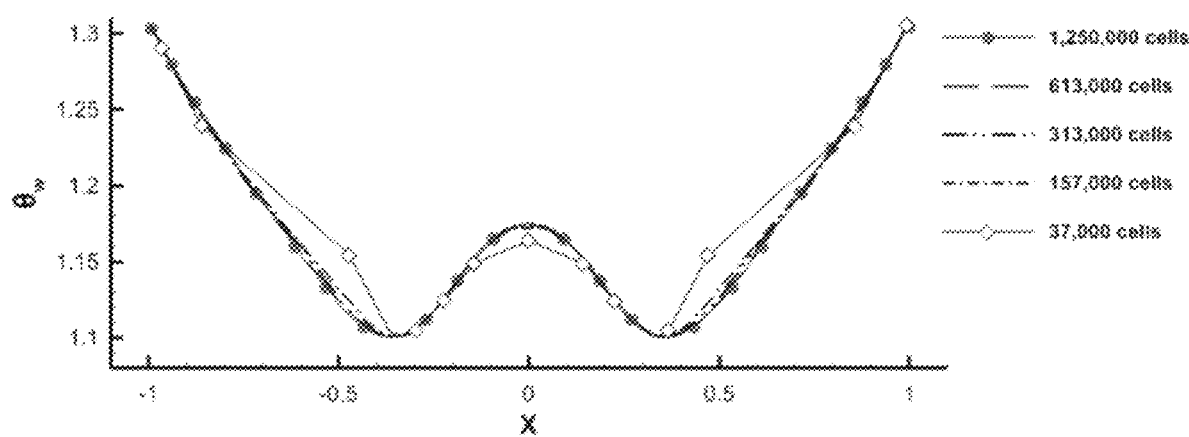
FIG. 11A-B shows non-dimensional temperature profile comparisons for grid independence study of the investigated geometries with a porosity of 0.45 for (a) rectangular and (b) square cross-sectional inlet channels, subject to a uniform heat flux of $10^6$ W/m$^2$.
Figure 11B:
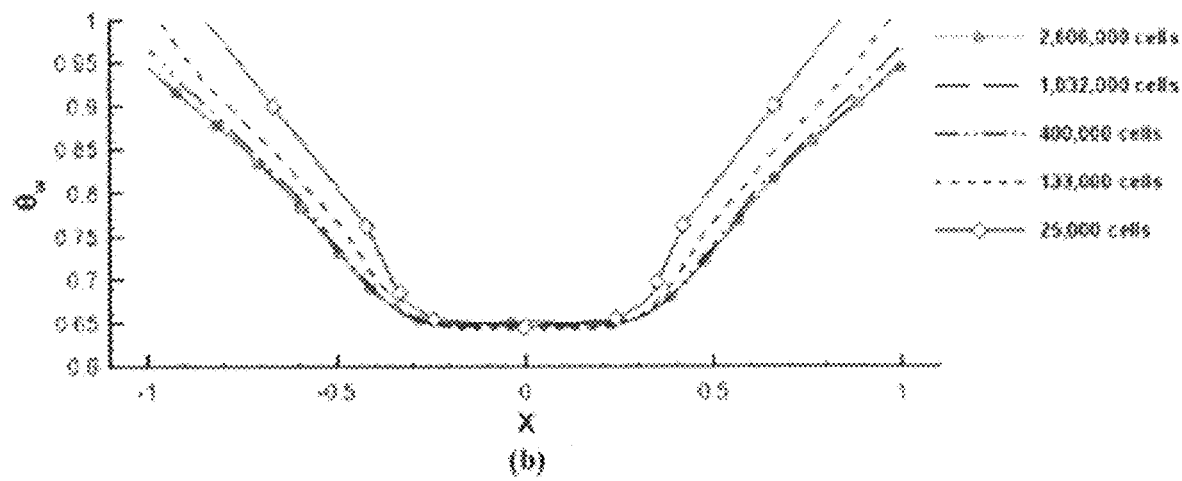

A multi-block structured quadrilateral grid is utilized for grid generation while mesh sizes are set to be finer within the porous region and near the wall boundaries to properly capture flow field characteristics. In order to study grid independence of the results, several grid sizes are examined. As an example, the non-dimensional temperature distributions along the streamwise centerline of the investigated heat exchanger, with rectangular and square cross sectional inlets and a porosity of 0.45, are presented for different grid sizes in FIG. 11. It can be seen that a gird resolution composed of 613,000 cells (for rectangular cross section) and 1,032,000 cells (for square cross section) result in a grid independent solution while properly capturing the flow field characteristics. Varying the imposed heat flux led to the same conclusion regarding the adequate number of cells for a grid independent solution.

Results

Figure 12:
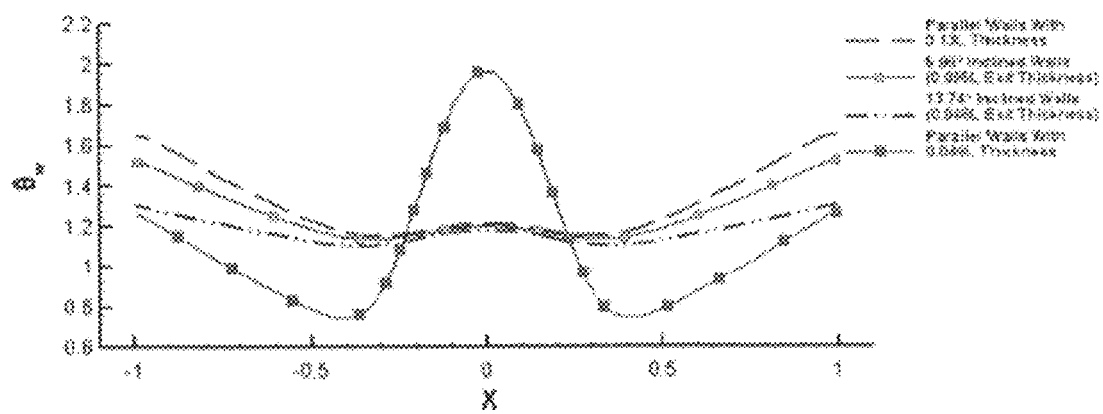
FIG. 12 shows non-dimensional temperature distribution along the streamwise direction on the base centerline of the cases with the inclination angles of 5.96° and 13.74° and parallel channel walls.

Porous filled heat exchanges with rectangular and square cross section inlet channels are investigated. The effect of inclination angle, heat flux, coolant velocity, porous material, porosity value and multiple nanofluid coolants are studied. The heat exchanger design utilizes inclined walls to improve temperature uniformity along the base subject to a high heat flux value. The importance of the channel inclined walls is investigated in FIG. 12. The streamwise non-dimensional temperature at the centerline of the base surface of four different copper porous filled heat exchanger designs are compared. The porosity of the copper is 0.45 and all designs are subject to a uniform heat flux of $10^6$ W/m² and employ rectangular cross section inlet. Two designs employ inclined walls; one with an inclination angle of 5.96° and the other one with an angle of 13.74°. As such, the thickness of the porous filled channels varies between 0.13 L and 0.095 L for the inclination angle of 5.96° and between 0.13 L and 0.048 L for the inclination angle of 13.74°. The other two designs employ parallel channels; i.e. zero inclination angle, whose thicknesses are the same as the maximum and minimum thickness of the investigated counterpart cases with inclined walls (0.13 L and 0.048 L). As the results indicate, the cases with inclined walls provide a considerably more uniform temperature distribution. Decreasing the channel thickness, without utilizing the inclined walls, may result in lower temperature at some locations but larger temperature non-uniformity would be obtained (FIG. 12). As such, a heat exchanger with an inclination angle of 13.74° is selected in this study providing low temperature values and most temperature uniformity along the base centerline. In many cooling applications, the goal is to provide a uniform temperature at the surface while keeping the surface at low temperature.

Figure 13:
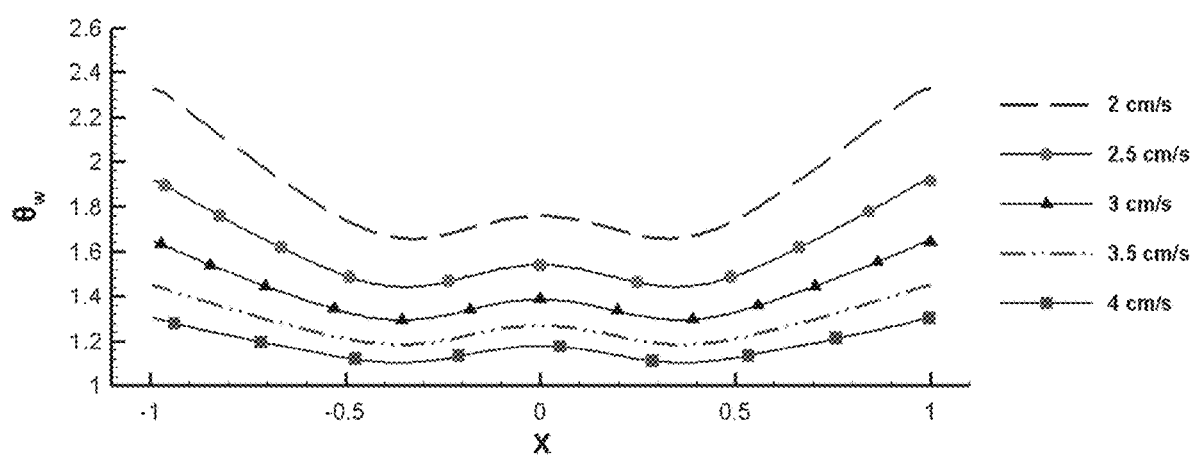
FIG. 13 shows non-dimensional temperature distribution along the streamwise direction on the base centerline for different inlet velocities.
Figure 14A:
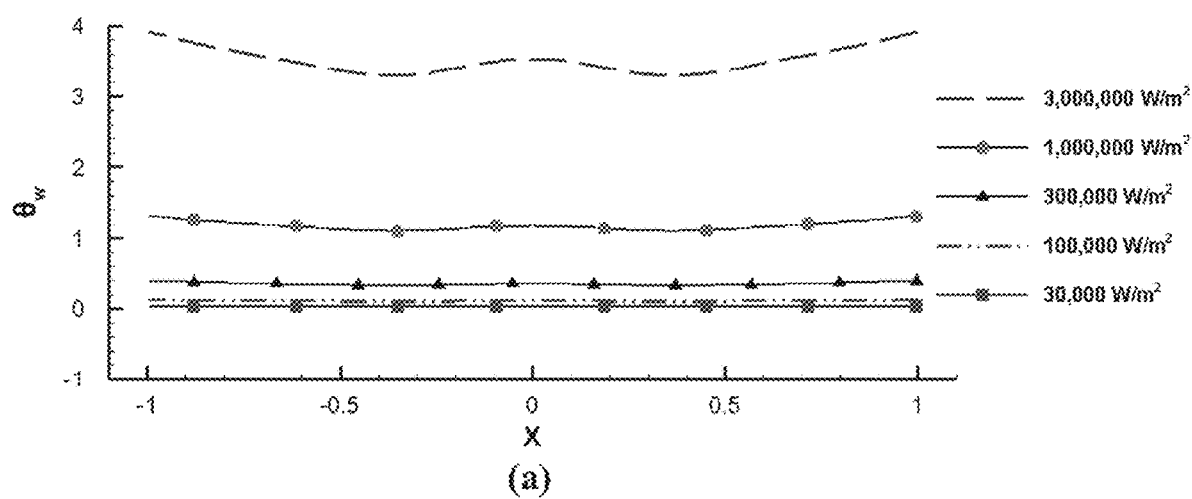
FIG. 14A-B shows non-dimensional temperature distribution along the streamwise direction on the base centerline for different wall base surface heat flux values. Temperature values are non-dimensional using (a) a heat flux of $10^6$ W/m$^2$ or (b) corresponding heat flux.
Figure 14B:
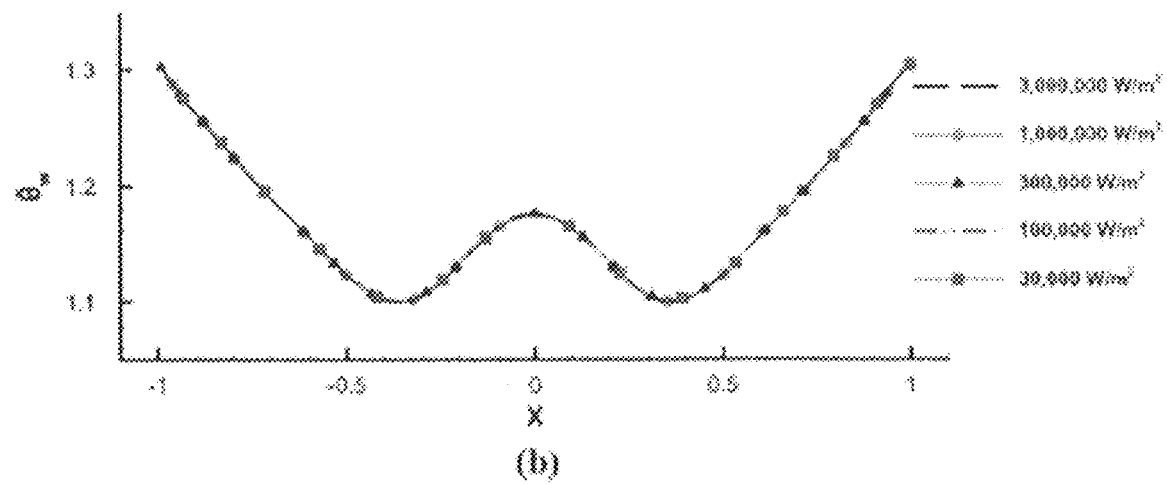

The effect of inlet velocity value on the temperature distribution on the base is also investigated for a copper foam filled heat exchanger with rectangular cross-sectional inlet and porosity of 0.45 which is subject to a uniform heat flux of $10^6$ W/m² for the same coolant temperature of 300 K (FIG. 13). An increase in the velocity, and so mass flow rate, will result in lower and more uniform temperature distribution on the base. However, a higher velocity value will cause a larger pressure drop and so higher required pumping power. To investigate the effect of heat flux in this study, different heat flux values are investigated for a copper foam filled heat exchanger with a porosity of 0.45. The coolant temperature and velocity are set to be 300 K and 4 cm/s, respectively. To better study the temperature distribution on the base, the temperature values are once non-dimensionalized using a fixed value of heat flux ($10^6$ W/m²) (FIG. 14A) and once non-dimensionalized using the corresponding heat flux (FIG. 14B). As expected, higher heat flux corresponds to a higher surface temperature (FIG. 14A). However, as FIG. 14B indicates, the non-dimensional temperature distribution and uniformity are independent of heat flux value when temperature is non-dimensionalized using the corresponding heat flux value. As such, regardless of the heat flux value, the temperature profiles are similar.

The effects of porous materials, namely copper and APG, and porosity value are studied for rectangular and square cross-sectional inlet channels (FIG. 15). The results indicate that both copper and APG can properly cool down the base which is subjected to a very high heat flux value. Our investigations confirm the importance of employing the porous substrate in the heat exchanger design to decrease the base temperature below a safe temperature value. Comparing the investigated porous substrates, APG porous substrate can provide a better cooling over the base, for all studied coolants of pure water and water based nanofluids, and for high and low porosity values. APG is a lighter and more conductive material, but fragile in comparison with copper. In addition, as expected, a reduction in porosity improves cooling effectiveness for all studied cases (FIG. 15). As such, the maximum temperature can be reduced by either utilization of a more conductive material or by a reduction in porosity. However, a lower porosity value results in a larger pressure drop and so higher required pumping power.

Figure 15A:
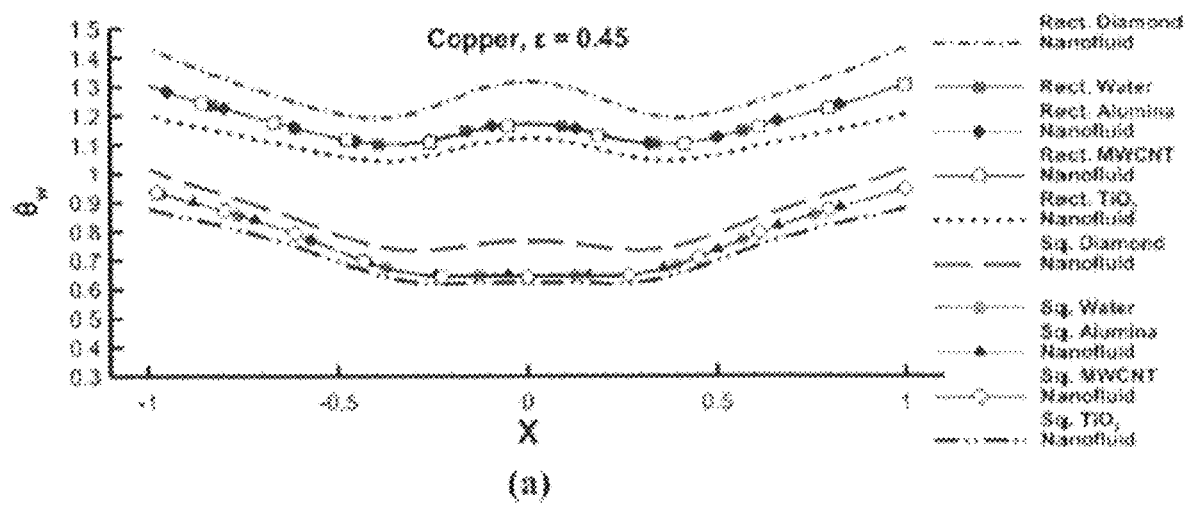
FIG. 15A-C shows non-dimensional temperature distribution along the streamwise direction on the base centerline, for rectangular (Rect.) and square (Sq.) cross-sectional inlet channels, for different coolants (a) Copper porous insert with a porosity of 45%, (b) APG porous insert with a porosity of 45%, and (c) APG porous insert with a porosity of 90%.
Figure 15B:
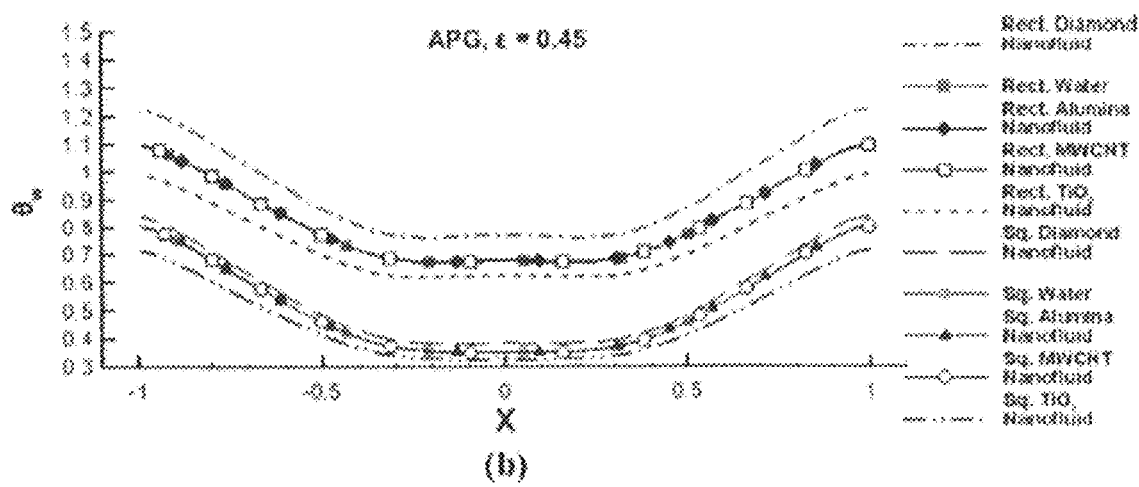
Figure 15C:
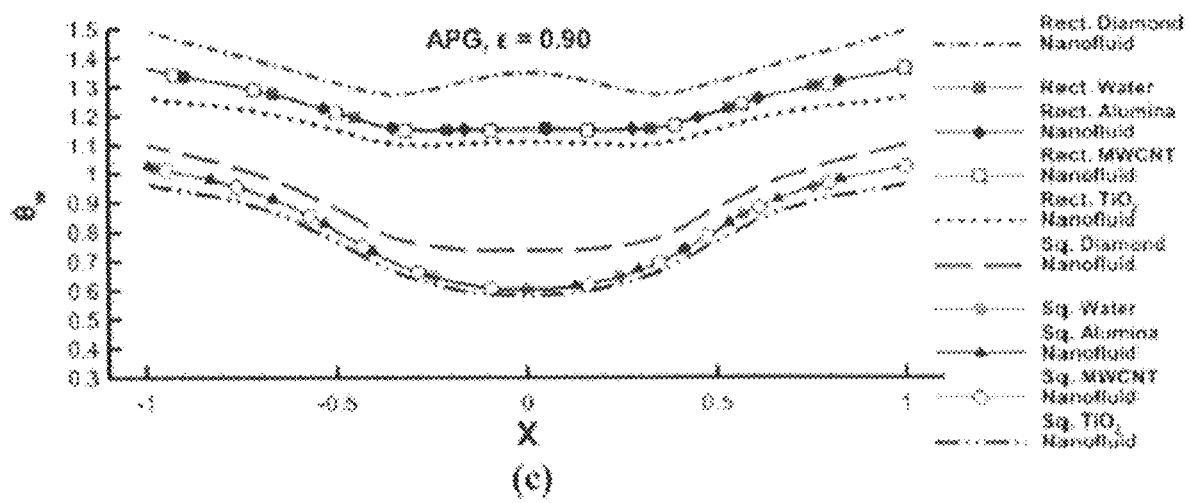

The effect of different nanofluid coolants is also investigated and the results shown in FIGS. 15A-C. The studied nanofluid coolants are 5% titanium dioxide ($TiO_2$) in water, 1% alumina in water, 0.03% multi walled carbon nanotubes (MWCNT) in water, and 1% diamond in 40:60 ethylene glycol/water. The results indicate that titanium dioxide ($TiO_2$) nanofluid coolant has more cooling effectiveness compared to other studied coolants (nanofluids and water), for both copper and APG porous matrices for high and low porosity values. Comparing the studied coolants, diamond nanofluid has the lowest thermal effectiveness in comparison with pure water and all other studied water based nanofluid coolants.

Investigation of temperature distribution over the base indicates a sinusoidal like behavior with a high temperature peak at the center point of the base, for all the studied cases (FIGS. 15A-C). The center peak is due to development of stagnation point at the center of the base and the fluid's deceleration as it moves towards that region. On both sides of the stagnation point, more efficient cooling is achieved as such minimum temperature regions are developed. As expected, the highest temperature values are observed near the exit channels for all cases.

The effect of the inlet cross section on temperature distribution is also presented in FIGS. 15A-C. To better investigate the effect of inlet cross section, the mass flow rate is kept the same at the entrance of both rectangular and square inlets. As such, the entrance velocity for the cases with rectangular cross section is set to be 4 cm/s while it is 12.12 cm/s for the cases with square cross section. The results indicate lower temperature values and therefore an improved cooling effectiveness along the streamwise direction, for all cases with square cross sections compared to those with rectangular cross section. In square cross-sectional inlet channel, titanium dioxide ($TiO_2$) nanofluid coolant provides more cooling effectiveness compared to other studied coolants (nanofluids and water), for both copper and APG porous matrices for different porosity values. In summary, similar results are observed regarding the effect of porous material, porosity and nanofluids for both square and rectangular cross section channels.

Figure 16A:
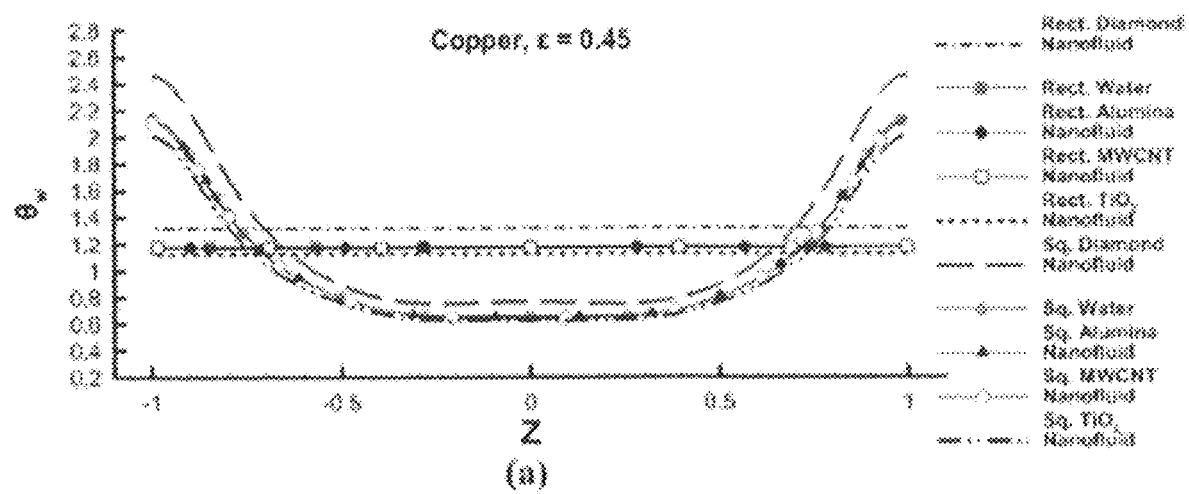
FIG. 16A-C shows non-dimensional temperature distribution along the transverse direction on the base centerline, for rectangular (Rect.) and square (Sq.) cross-sectional inlet channels, for different coolants (a) Copper porous insert with a porosity of 45%, (b) APG porous insert with a porosity of 45%, and (c) APG porous insert with a porosity of 90%.
Figure 16B:
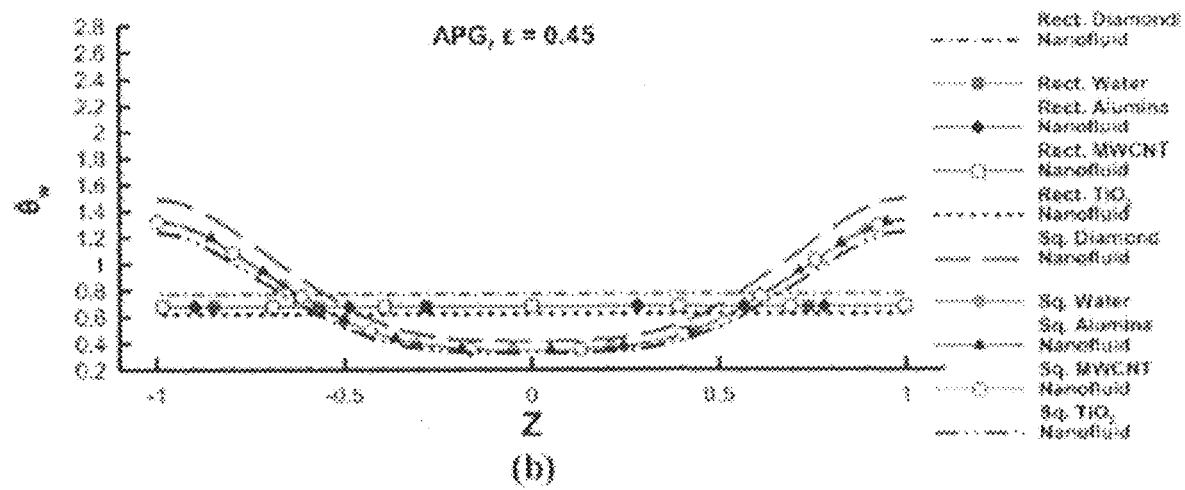
Figure 16C:
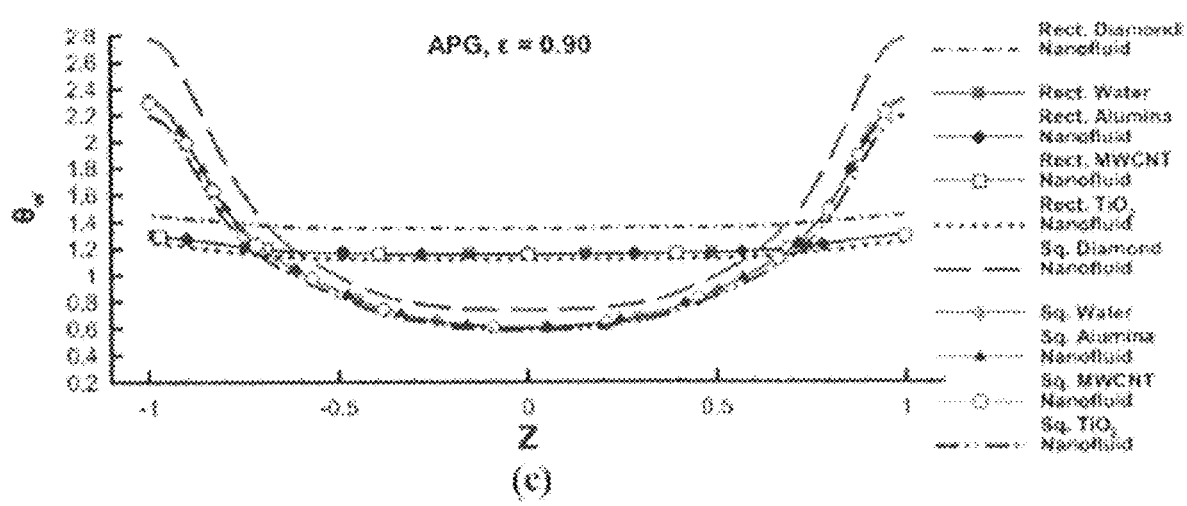

Temperature distribution along the transverse direction at the centerline of the base is also studied and compared for different coolants, porous materials, and porosity values (FIGS. 16A-C). The results confirm that titanium dioxide ($TiO_2$) nanofluid coolant has more cooling effectiveness compared to other studied coolants (nanofluids and water), for both copper and APG porous matrices for high and low porosity values. In addition, the diamond nanofluid has the lowest thermal effectiveness compared to pure water and all other studied water based nanofluid coolants. Also similar to the results for the rectangular cross-sectional inlet cases, APG porous substrates provides a better cooling along the transverse direction compared to that of copper substrate for the same coolant or porosity. In addition, the lower porosity would result in more efficient cooling along the transverse direction but at a greater pressure drop. Studying the effect of inlet cross section, the results indicate larger temperature non-uniformity along the transverse direction for the cases with a square cross section. In addition, larger temperature values are observed in the regions far from the inlet channel (FIGS. 16A-C). As such, the cases with square cross section provide lower temperature values along the streamwise direction while result in less uniformity specially along transverse direction. Utilization of APG or low porosity substrates improves cooling effectiveness along the transverse direction.

Electronic cooling is one of the main issues in the development of advanced devices such as electronics and biomedical components. In this work, an innovative porous filled heat exchanger is numerically modeled to investigate the thermal performance of different nanofluid coolants, porous materials, porosity values, and inlet channel geometry. The heat exchanger is filled with a highly conductive porous insert providing a large surface area for a given volume to enhance heat transfer and thermal control. Two different porous solid materials (copper and annealed pyrolytic graphite (APG)) with different porosity values, utilizing different nanofluids (5% titanium dioxide ($TiO_2$) in water, 1% alumina in water, 0.03% multi walled carbon nanotubes (MWCNT) in water, and 1% diamond in 40:60 ethylene glycol/water) are investigated. The results indicate the importance of proper selection of the porous medium and the coolant for improving the cooling process. Both copper and APG porous substrates can provide a proper cooling at the base of the heat exchanger with rectangular and square inlet channels. However, utilization of APG porous matrix provides a better cooling at the base leading to lower temperature values. APG is a lighter and more conductive material, but fragile in comparison with copper. The results also show that utilizing titanium dioxide ($TiO_2$) nanofluid as coolant improves cooling efficiency in all cases with rectangular and square cross-sectional inlets, copper and APG porous matrices, and low and high porosity values. The effect of inlet channel geometry, square and rectangular, was also investigated. The results indicate a lower temperature distribution along streamwise direction for the cases with square cross-sectional inlet, while along the transverse direction higher temperature values are observed far from the center for the square cross section inlet channel.

Example 3: Foam-Filled and Rib Structured Configurations

The cooling system employs jet impingement through a confined foam filled channel (FIG. 17). It consists of a vertical jet inlet channel, a non-uniform channel, two lateral horizontal exit channels and a heat spreader conductive plate subject to high heat flux at its bottom surface (FIG. 17A). The maximum and minimum heights of the non-uniform channel are 6.8 mm and 2.5 mm, respectively. The non-uniform channel is fully or partially filled by a metal foam substrate or combination of a metal foam substrate and a rib structured target surface. The inclined side walls of the converging channel provide better cooling effectiveness at the bottom base of the channel by enforcing the coolant to move closer to the base. The channel bottom side is closed by a conductive heat spreader plate (52.5 mm×52.5 mm×1 mm), made of copper with the density of 8978 kg/m³, specific heat of 381 J/kgK, and thermal conductivity of 387.6 W/mK. The heat spreader plate is subject to a uniform heat flux of 105 W/m², representing the heat leaving the electronics device to be cooled. Except the base, all other channel walls are well insulated.

Utilized and contemplated metal foam can be made of copper with porosity value of 0.86, ligament diameter of 0.3921 mm, permeability of 3.32×10⁻⁸ m2, and effective thermal conductivity of 54.8 W/mK. Both fully and partially foam filled channels are investigated. The coolant water is injected from either slot jet or circular jet with flow rate of 27.24 cm3/s and temperature of 300 K. The slot jet, with the cross-section size of 17.32 mm×52.5 mm, is elongated along the spanwise direction of the channel (Z). The jet with circular cross section has a diameter of 17.32 mm. The coolant water enters the inlet channels of slot jet and circular jet with velocities of 3 cm/s and 11.57 cm/s, respectively. As such, the jet Reynolds number for slot and circular jets are 778 and 1996, respectively. Passing through the inlet channel, the coolant flow is hydraulically developed before reaching the main section of the cooling system which is fully or partially filled by metal foam. Then, the coolant passes through the main channel and leaves from two similar horizontal lateral exits.

Figure 17A:
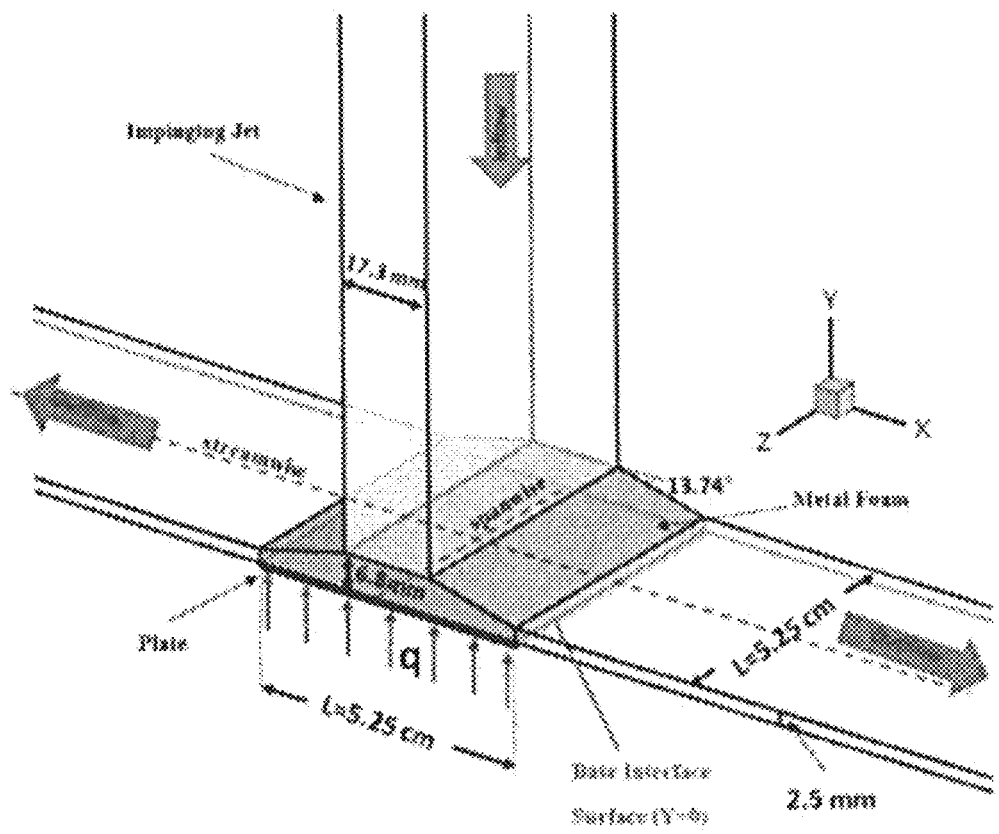
FIG. 17A-D shows schematics of the foam filled cooling system (a) slot jet impingement (b) circular jet impingement (c) slot jet impingement through foam-rib combination (d) circular jet impingement through foam-rib combination.
Figure 17B:
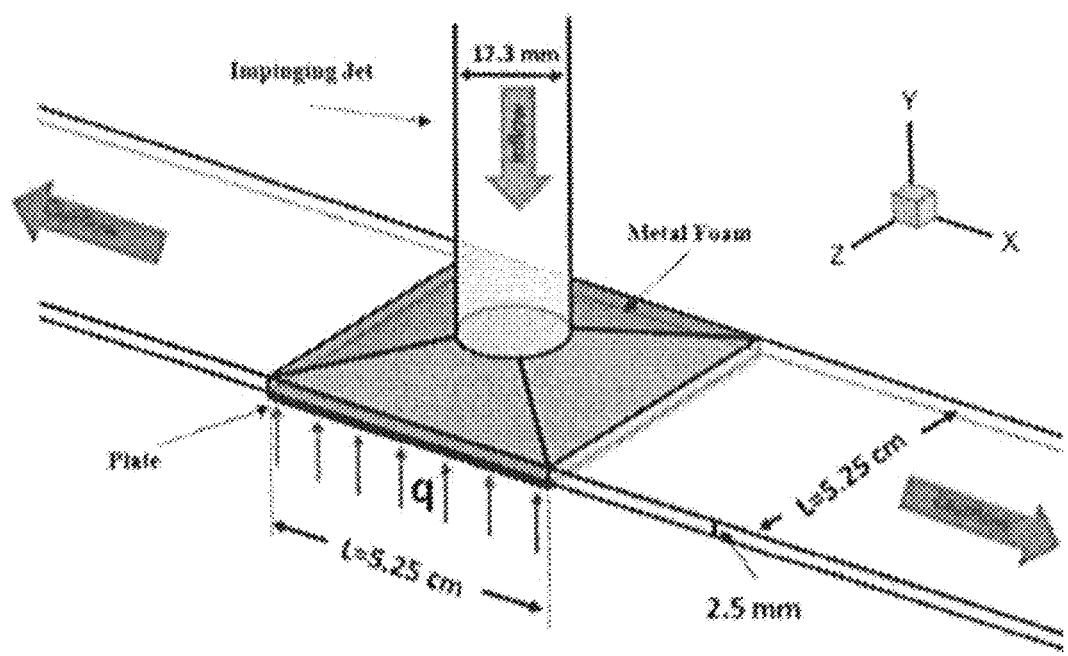
Figure 17C:
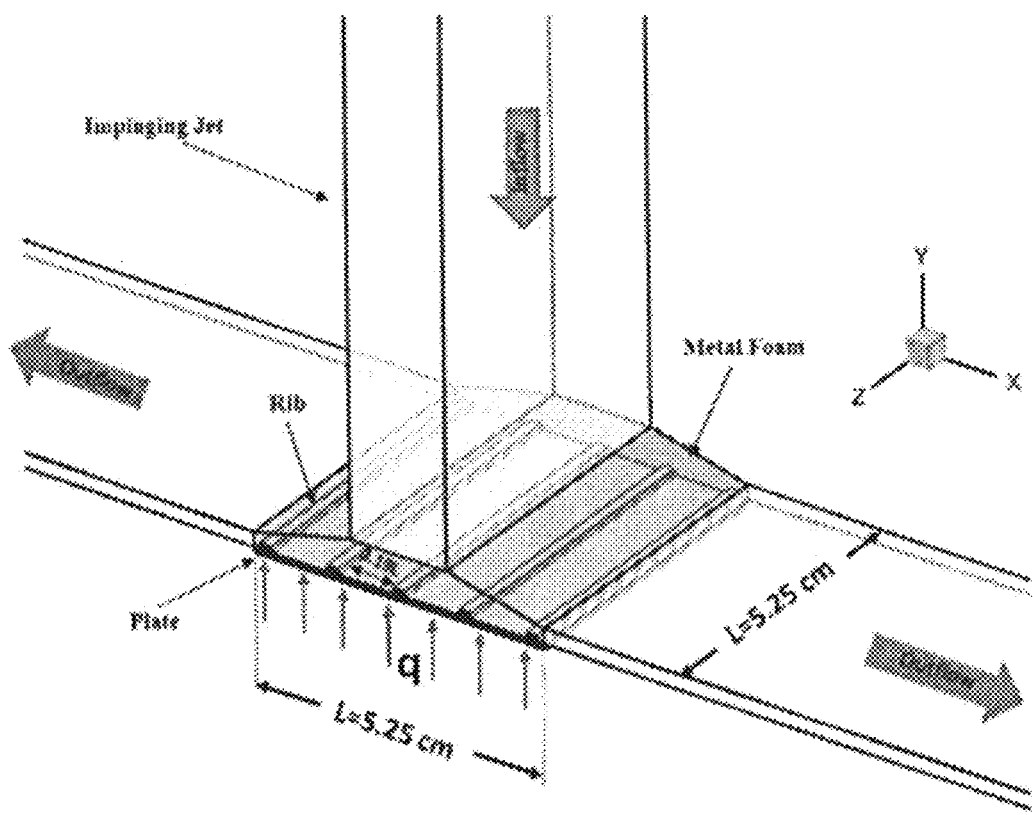
Figure 17D:
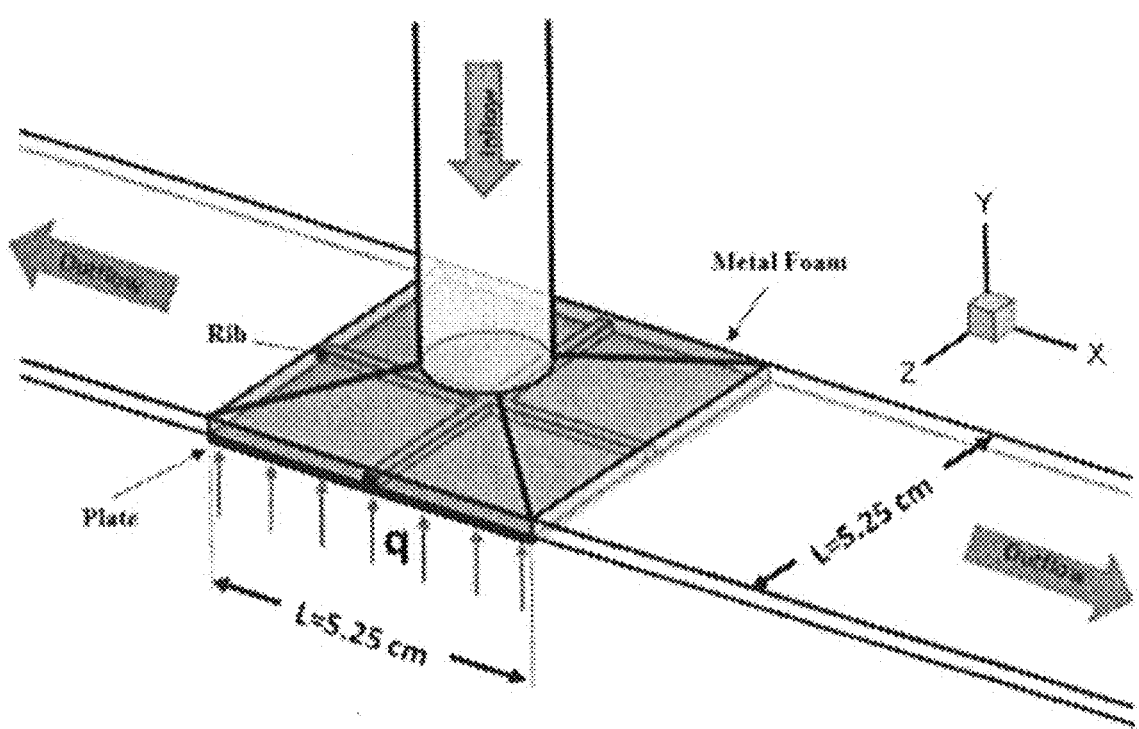
Figure 35:
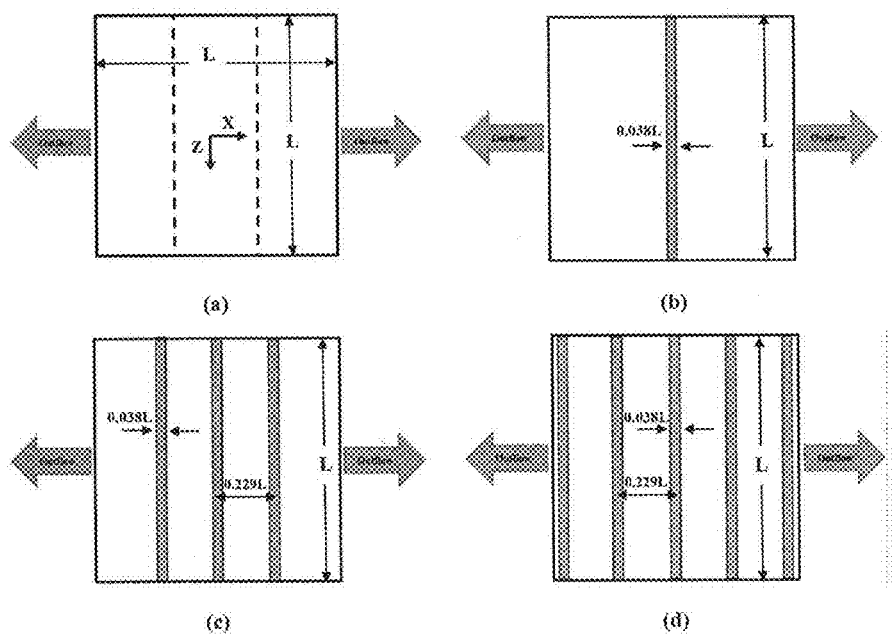
FIG. 35 shows that Case S1 represents the case without any rib.

In this example, the combination of jet impingement, rib structured surfaces, and metal foam in the confined channels are investigated. The ribs are made of copper material. For slot injection, single and multiple cuboid straight ribs elongated in spanwise direction (Z) are attached to the base interface of the foam filled channel and the heat spreader conductive plate, inside the channel (FIG. 17C). Since the ribs and the slot jet inlet are elongated in spanwise direction, the study provides a better understanding of thermal fluid characteristics of jet impingement in confined channels employing a combination of foam and structured target surfaces mainly in stream wise direction (X). As FIG. 35 depicts, for slot jet impingement through rib-foam combinations, the studied rib structured target surfaces employ one rib (Case S2), three parallel ribs (Case S3) or five parallel ribs (case S4), with two rib heights of 1 mm (i.e. 0.019L) and 2 mm (i.e. 0.038L). Case S1 represents the case without any rib (FIG. 35). The width of each rib, in stream wise direction (X), is 2 mm (0.038L) and the distance between the rib center lines, i.e. rib pitch, is 12 mm (0.229L) (FIG. 35). The projected slot cross section of the jet is shown in FIG. 35.

Based on the outcomes of the study of Cases S2-S4, multiple rib-foam combinations are designed and investigated for circular jet impingement (FIG. 36). In Cases C2-C9, the metal foam is combined with single and multi-rib structured base surfaces (FIG. 36). The figure depicts the top view of the structured base interface surfaces (Cases C2-C9) attached to the foam inside the confined channels. The rib structured channels (Cases C2-C9) are also compared to a foam filled channel with no-rib (Case C1, FIG. 36). In case C2, two small cubic ribs (0.038L×0.038L×0.029L) are attached to the base interface at the center of the side walls. In other rib structured cases, single and multiple cuboid ribs are elongated in streamwise and spanwise directions. The rib height in all studied cases is 1.5 mm (0.029L). The projected circular cross section of the jet is shown in FIG. 36.

Governing Equations

The cooling system consists of a central inlet channel, two lateral exit channels, and a confined channel filled by metal foam or a combination of metal foam and metal ribs. The coupled continuity, momentum, and energy equations for steady state, incompressible, single phase, laminar flow with constant properties are solved numerically for the regions of inlet, exit, and confined channel. The three-dimensional conduction equation is solved for conductive heat spreader plate and ribs that are connected to other regions by the interface boundary. The volume averaged governing equations are employed for the foam filled region that are presented in Eqs. 1-8 [25,63]. For energy equation, local thermal non-equilibrium assumption in porous media is utilized.

$$\nabla \cdot \langle \bar{v} \rangle = 0 \tag{1}$$

$$\frac{\rho_f}{\varepsilon}\langle(\bar{v}\cdot\nabla)\bar{v}\rangle = -\nabla\langle P\rangle^f + \frac{\mu}{\varepsilon}\nabla^2\langle\bar{v}\rangle - \frac{\mu}{K}\langle\bar{v}\rangle - \frac{\rho_f F\varepsilon}{\sqrt{K}}[\langle\bar{v}\rangle\cdot\langle\bar{v}\rangle]J \tag{2}$$

$$k_{f,eff}\nabla^2\langle T_f\rangle^f + h_i a_i(\langle T_s\rangle^s - \langle T_f\rangle^f) = \varepsilon\rho_f c_f\langle\bar{v}\rangle\cdot\nabla\langle T_f\rangle^f \tag{3}$$

$$k_{s,eff}\nabla^2\langle T_s\rangle^s - h_i a_i(\langle T_s\rangle^s - \langle T_f\rangle^f) = 0 \tag{4}$$

Where, $$K = \frac{\varepsilon^3 d_f^2}{\alpha(1-\varepsilon)^2} \tag{5}$$

$$F = \frac{\beta}{\sqrt{\alpha\varepsilon^3}} \tag{6}$$

$$k_{f,eff} = \varepsilon k_f \tag{7}$$

$$k_{s,eff} = (1-\varepsilon)k_s \tag{8}$$

In the equations, ε, df, K, kf,eff, and ks,eff are foam porosity, filament diameter, permeability, effective fluid thermal conductivity, and effective solid thermal conductivity, respectively. The parameters of α and β are taken to be 150 and 1.75, respectively [25].

The following equations (9-10) are employed to evaluate interstitial convection heat transfer coefficient (hi) and interfacial surface area (ai) used in energy equations (3-4) [25, 31]

$$\frac{h_i d_f}{k_f} = 0.52\left(\frac{u d_f}{\varepsilon v}\right)^{0.5} Pr^{0.37} \tag{9}$$

$$a_i = \frac{3\pi d_f}{(0.59 d_c)^2}\left[1 - e^{-\left(\frac{1-\varepsilon}{0.04}\right)}\right] \tag{10}$$

where, u is the average fluid velocity within the foam region and dC represents the cell diameter that can be obtained from the following equation [25, 31]

$$\frac{d_f}{d_c} = 1.18\sqrt{\frac{1-\varepsilon}{3\pi}}\frac{1}{1-e^{-\left(\frac{1-\varepsilon}{0.04}\right)}} \tag{11}$$

The utilized copper metal foam in this study has a porosity of 0.86 and the filament diameter of 0.3921 mm. As such, the cell diameter (dC) and interfacial surface area (ai) are evaluated as 2.644 mm and 1473.03 mm²/mm³, respectively. The interstitial convection heat transfer coefficient (hi) are evaluated as 5636.14 W/m2K, 7970.71 W/m2K, 9762.08 W/m2K, 11070.9 W/m2K, 11272.3 W/m2K, and 12602.8 W/m2K for jet inlet velocities of 3 cm/s, 6 cm/s, 9 cm/s, 11.575 cm/s, 12 cm/s, and 15 cm/s, respectively. For presenting the results, temperature values are expressed in non-dimensional form using the following equation:

$$\theta = \frac{k_s(T - T_{in})}{q \cdot H} \quad (12)$$

where ks, Tin, q, and H represent the solid foam thermal conductivity, coolant jet inlet temperature, applied heat flux, and the maximum height of the converging channel, respectively. The local Nusselt number is defined as:

$$Nu = \frac{h \cdot D_H}{k_{f,eff}} = \frac{q \cdot D_H}{k_{f,eff}(T_s - T_{in})} = \frac{2k_s}{\varepsilon k_f \theta} \quad (13)$$

where kf represents the fluid thermal conductivity. The hydraulic diameter (DH) is defined as twice the maximum height of the foam filled channel.

Numerical Modeling Setup

An implicit control volume method is utilized for numerical solution of the non-linear coupled governing equations employing ANSYS FLUENT [32]. For convective and diffusive terms, second order upwind and central differencing schemes are used, respectively. The employed iterative pressure-based segregated algorithm is run until the scalar's globally scaled residuals reach a minimum of $10^{-6}$ and the convergence criteria is satisfied. Inflow and outflow boundary conditions are applied at the entrance of the inlet channel and the outlet surface of the exit channel (FIG. 17). The bottom surface of the heat spreader conductive plate is subject to a uniform heat flux. The applied heat at the bottom surface passes through the conductive plate and ribs by multi-dimensional conduction. The heat is then transferred to the solid metal foam and the fluid passing through the interconnected pores of the metal foam substrate. The heat would distribute between the solid and fluid phases based on their thermal resistances. At the interface of the conductive plate and ribs with the foam region, wall matching boundary condition is assigned for conjugate heat transfer between these parts and the moving fluid as well as the foam substrate. For accurate modeling of thermal transport between the metal foam ligament and the infiltrated fluid, two energy equation method in porous media is utilized using the assumption of local thermal non-equilibrium between the solid and fluid phases. Except the bottom surface of the conductive plate, all wall surfaces of the cooling system are adiabatic.

Validation Study

Figure 18:
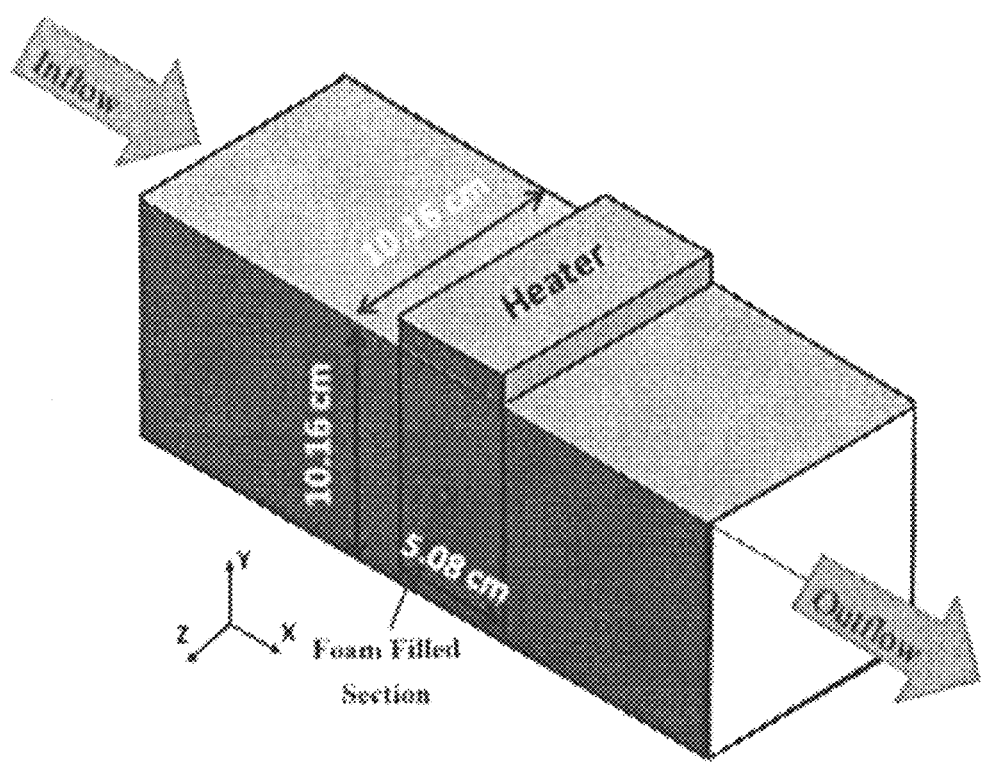
FIG. 18 shows a schematic of the foam filled channel subject to a uniform heat flux for validation study.

The validation study is performed to evaluate the numerical modeling and employed models discussed in the governing equation section. As such, flow through a foam filled channel subject to a uniform heat flux is numerically simulated and the obtained numerical data is validated against the experimental data in literature for the same setup [64]. The size of the foam filled section is 5.08 cm×10.16 cm×10.16 cm which is subject to a heat flux of 2.99 W/cm2 at its top surface (FIG. 18). The heat is provided by a thin thermofoil heater attached to a solid aluminum plate with a thickness of 12.7 mm placed at the top of the foam. The studied aluminum metal foam has a porosity of 79.6%, solid effective thermal conductivity of 22.3 W/mK, and interfacial surface area (ai) of 1113 m2/m3 [64]. The foam filled section is attached to inlet and exit sections to deliver air coolant. The air coolant enters the inlet channel at Reynolds number of 13737, defined based on the foam Darcy velocity of 2.5 m/s and the channel height. Except the upper surface of the solid aluminum plate which is attached to the heater, all surfaces are insulated.

Figure 19A:
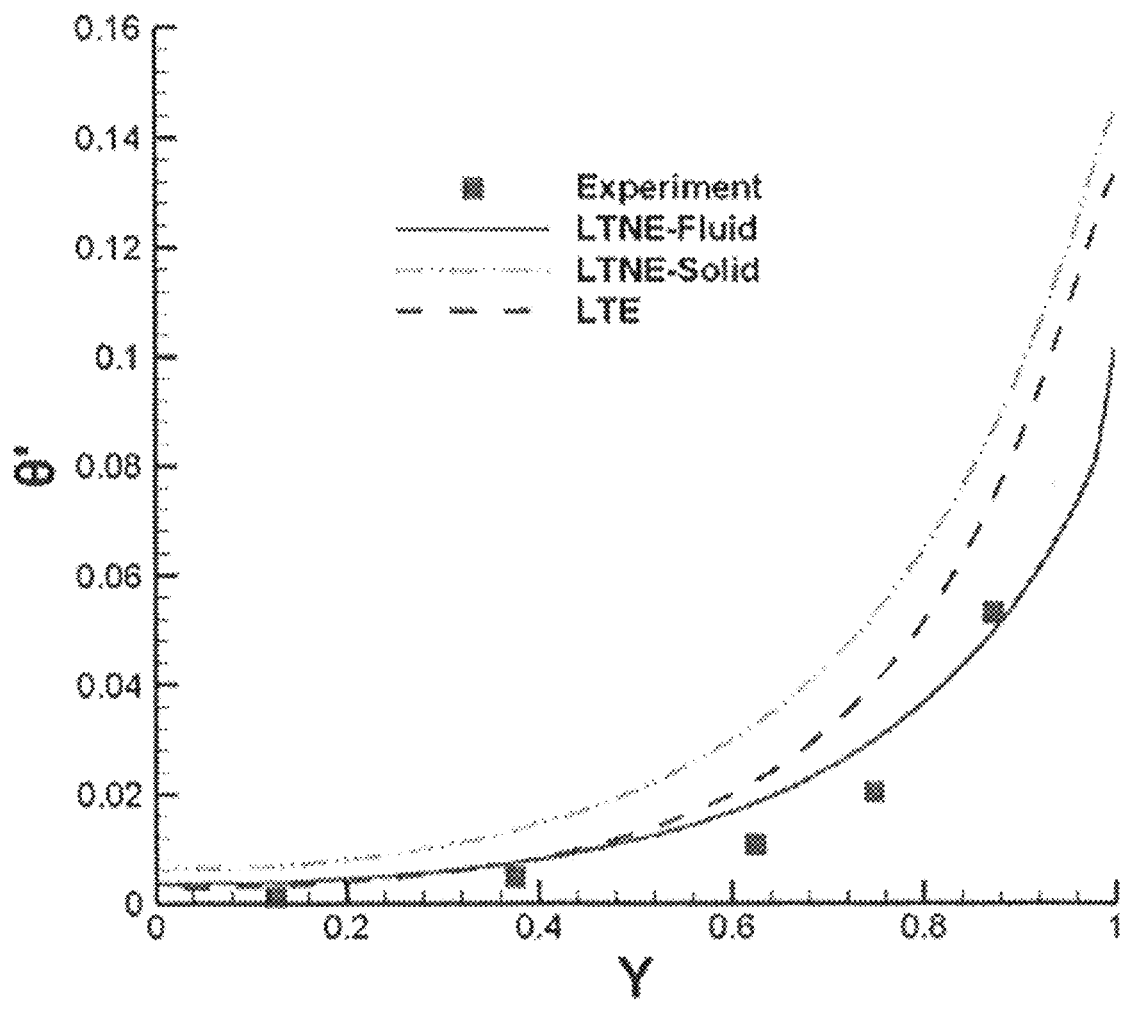
FIG. 19A-C shows non-dimensional temperature distributions along the channel height (Y) obtained numerically from LTNE assumption for both fluid and solid phases, and from LTE assumption, in comparison with the experimental data [33], at different horizontal locations in the foam central surface from the foam inlet FIG. 19(a) X1=1.27 cm, FIG. 19(b) X2=2.54 cm, and FIG. 19(c) X3=3.81 cm.
Figure 19B:
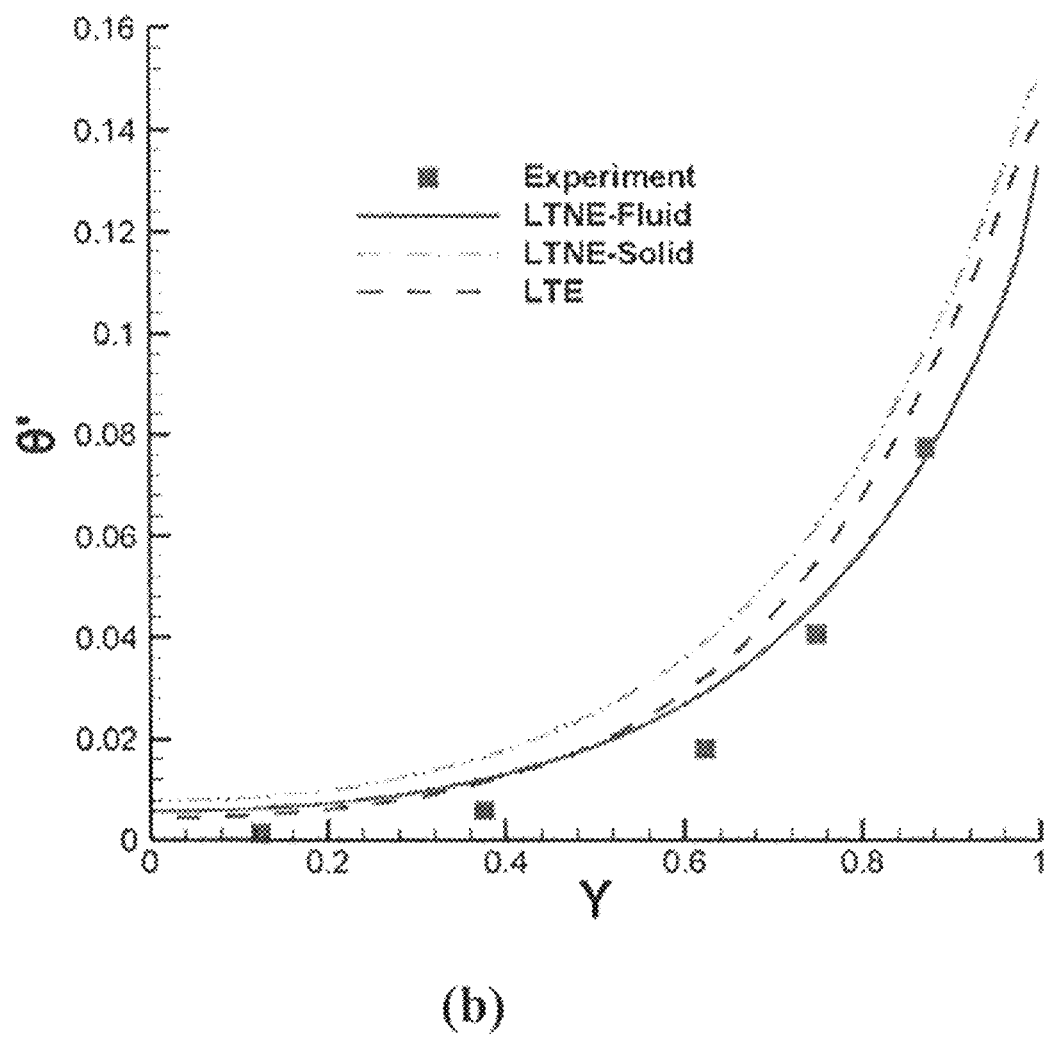
Figure 19C:
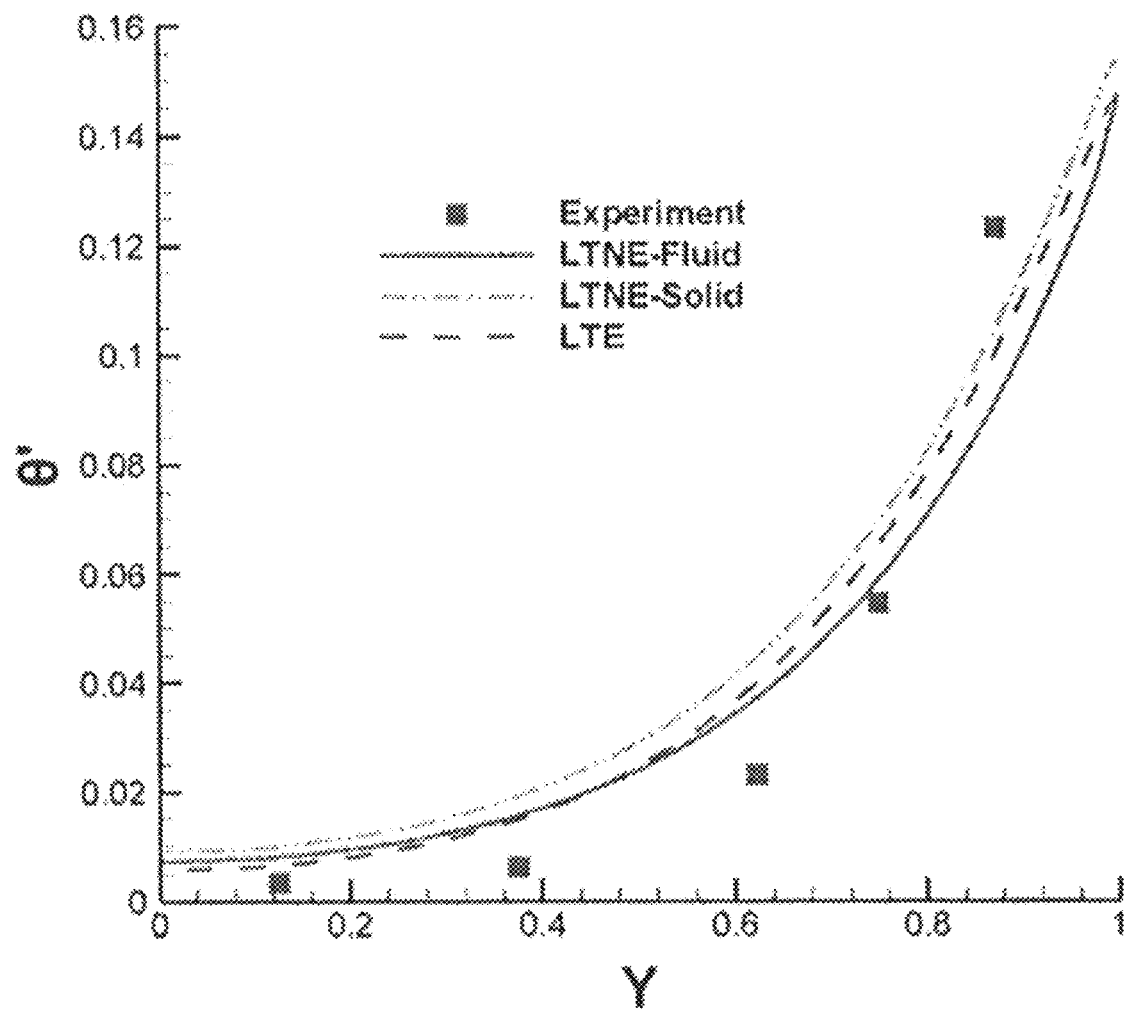

The obtained numerical results are compared with the experimental data at different sections within the foam (X1, X2, X3) along the vertical direction (Y) (FIG. 18). The numerical modeling is performed using both local thermal non-equilibrium assumption, i.e. two energy equations, and local thermal equilibrium assumption, i.e. one energy equation. As such, temperature variations for fluid and solid phases obtained from local thermal non-equilibrium model are compared with the experimental data and numerical data from local thermal equilibrium model at the distance of 1.27 cm from the foam inlet (X1), 2.54 cm from the foam inlet (X2) and at 3.81 cm from the foam inlet (X3). As defined in the reference paper [64], the temperature values are non-dimensionalized using the following equation:

$$\theta' = \frac{(T - T_\infty)}{q \cdot H / k_{s,eff}} \quad (14)$$

where, $T^\infty$ is the coolant temperature entering the channel, q is the applied heat flux, H is the height of the channel, and ks, eff is the solid effective thermal conductivity. FIG. 19 compares the obtained numerical data from local thermal non-equilibrium model (LNTE) and local thermal equilibrium model (LTE) with the experimental data presented in the reference paper [64]. The comparisons indicate a good agreement between the obtained numerical data and the experimental data. As expected, the numerical data for fluid phase using LTNE matches better with the experimental data since the fluid phase temperature is measured experimentally.

In FIG. 19, the fluid and solid phase temperatures (LTNE-Fluid and LTNE-Solid) are also compared with the temperature values obtained from local thermal equilibrium model (LTE). The comparison shows that LTE temperature value are mainly between the fluid and solid phase temperatures at each location. Also, the deviation between the fluid and solid phase temperatures gets smaller by getting further from the foam inlet.

Grid Resolution Study

A multi block quadrilateral structured mesh is generated for each studied geometry employing very fine mesh specially near the wall boundaries. For applying local thermal non-equilibrium model, two coincident grids are generated for modeling flow through metal foam substrate. One grid represents the foam metal solid phase and the other grid is for the fluid phase flowing through the foam substrate. The interface boundary condition is applied at the interface of coincident grids with the generated grids for the conductive heat spreader plate and ribs, to properly match the grids and solve the governing equations [25].

Figure 20A:
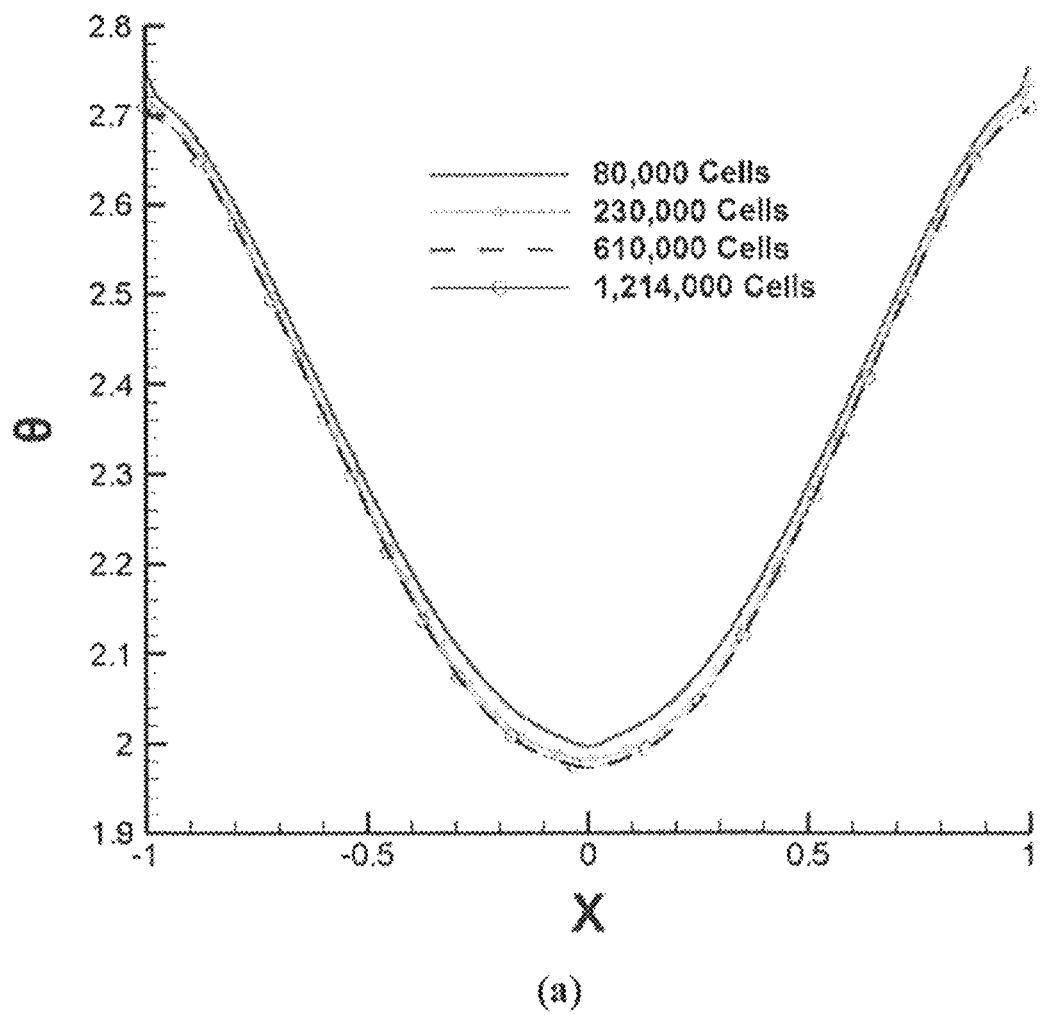
FIG. 20A-B shows the results of a grid independence study for two cases with ribbed structured target surface in the foam filled channel shown in FIG. 36 and FIG. 20(a) Case C5 and FIG. 20(b) Case S3 with the rib height of 0.019L.
Figure 20B:
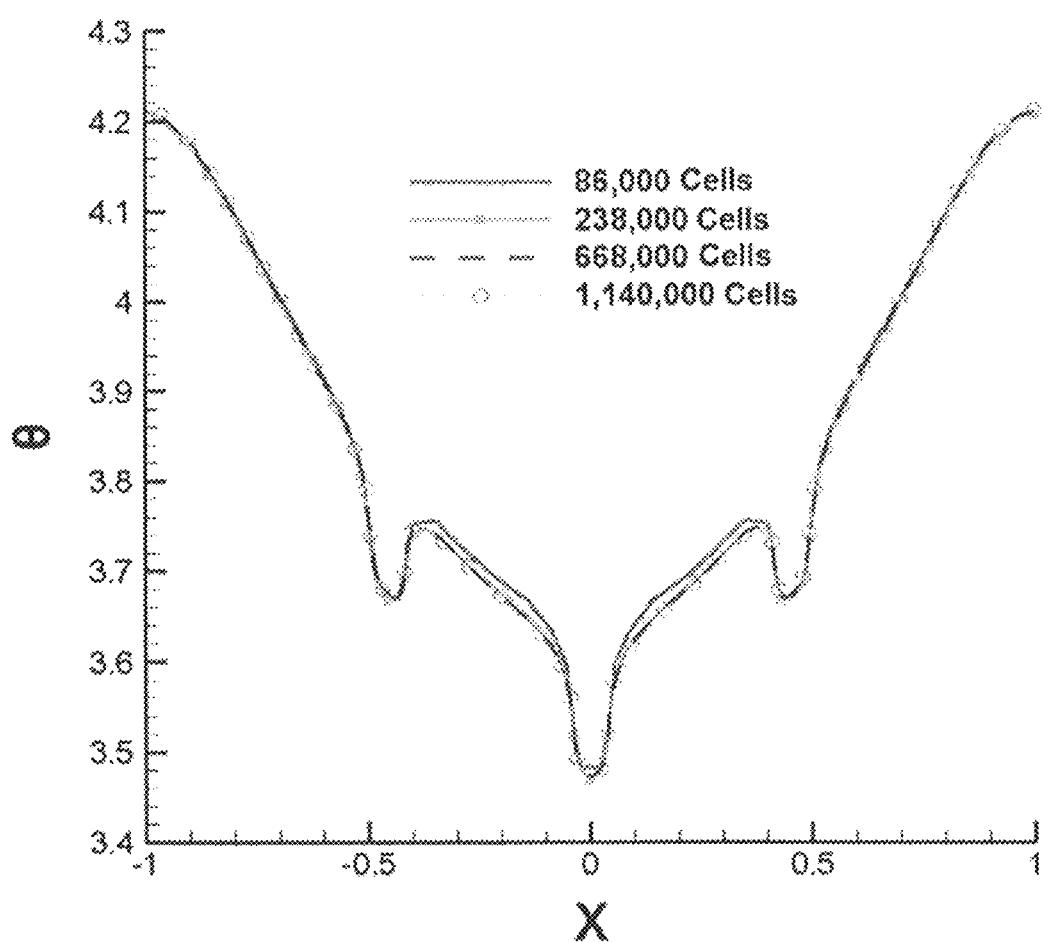

Grid independence study is performed for the studied cases to obtain results that are independent of grid sizes. For instance, the non-dimensional temperature distributions along the streamwise direction (X) at the centerline of the base interface surface (Y=0 and Z=0) are presented for the studied Case C5 and Case S3 with the rib thickness of 0.038L in FIG. 20. The base interface surface is the upper side of the conductive heat spreader plate that is attached to either the foam or the ribs located inside the channel, shown in FIG. 17A. Four different grid sizes are presented for each case, employing local thermal non-equilibrium model in porous media (FIG. 20). The results indicate that the grid with 610,000 cells results in a grid independent solution for Case C5. The mesh with 668,000 cells provides grid independent solution for Case S3. In addition, the numerical uncertainty for the fine grid is evaluated using the Grid Convergence Method (GCI) explained by Celik et al. [65]. For instance, the GCI values for Case C5 and Case S4 with the rib thickness of 0.038L are evaluated as 0.115% and 0.028%, respectively.

Results

In this example, slot and circular jet impingement through foam filled confined converging channels, with and without rib structures, are investigated. The effects of several parameters are discussed including jet cross section shape, partially and fully foam filled confined channels, different rib structured surfaces, rib size and orientation, jet velocity, applied heat flux, and the thickness of the conductive heat spreader plate. Some of the results are presented at the centerlines of the channel base interface surface between the foam filled channel and the conductive heat spreader plate, as shown in FIG. 17A. As such, the temperature values along the base interface streamwise centerline represents the values along X direction at Y=0 and Z=0. Also, the temperature values along the base interface spanwise centerline depicts the values along Z direction at X=0 and Y=0.

Slot and Circular Jet Impingements

Figure 21:
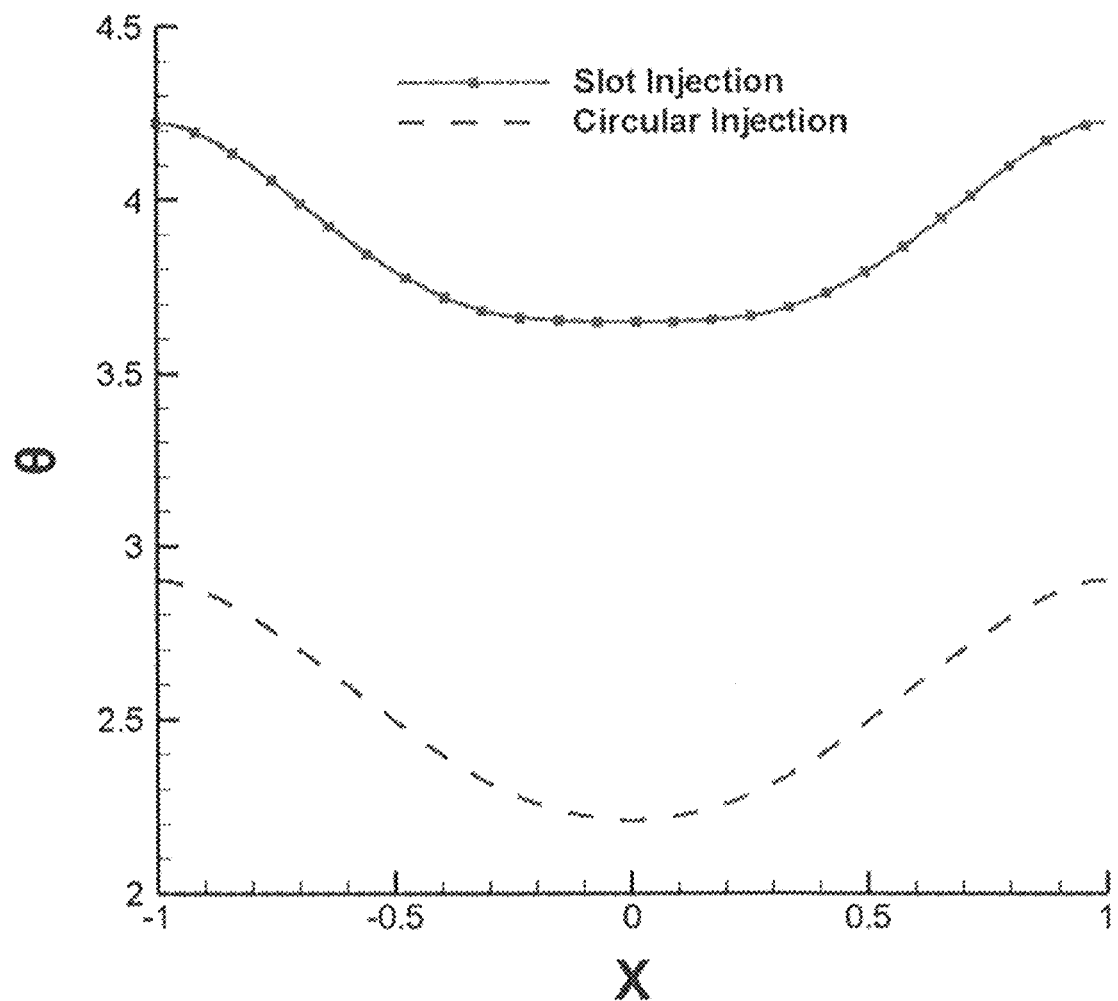
FIG. 21 shows a non-dimensional temperature distribution for slot and circular jet impingement along the central streamwise direction at the base interface (Y=0, Z=0).

The effect of jet impingement cross section shape, i.e. slot and circular (FIGS. 17A and 17B), is studied for similar impinging jet mass flow rate. The base of both channels, with slot and circular jets, are subject to a uniform heat flux of $10^5$ W/m$^2$. The temperature profiles along the streamwise centerline at the channel base interface surface is depicted in FIG. 21. For both jet cross sections, the minimum temperature occurs right in front of the impinging jet in the stagnation zone. The temperature increases as flow moves away from the center. The results also show that circular jet impingement provides a better cooling in the stagnation region at the base, in comparison with the slot injection. The cross-section area of the slot injection is larger than that of circular jet. Since the mass flow rate is kept similar for both cases, the jet inlet velocity is smaller for the slot injection resulting in higher temperature values at the base and less cooling effectiveness. However, the slot impingement can result in a more uniform cooling along the spanwise direction.

Partially and Fully Foam Filled Channels with Slot Jet Impingement

The investigated confined channels are filled by metal foam. The effect of employing partially foam filled channel versus fully foam filled channel is studied for slot injection with the jet velocity of 3 cm/s while the channel is subject to a uniform heat flux of $10^5$ W/m$^2$. To do so, partial foams with different foam substrate heights are simulated. All studied partial foams cover the whole surface of the base, but their corners may have been tapered by the inclined walls of the channel. The foam maximum height in the fully filled channel is 0.13L. The studied partial foams have the heights of 5.7 mm (0.109L), 4.5 mm (0.086L), 3.7 mm (0.07L), and 3 mm (0.057L).

Figure 22A:
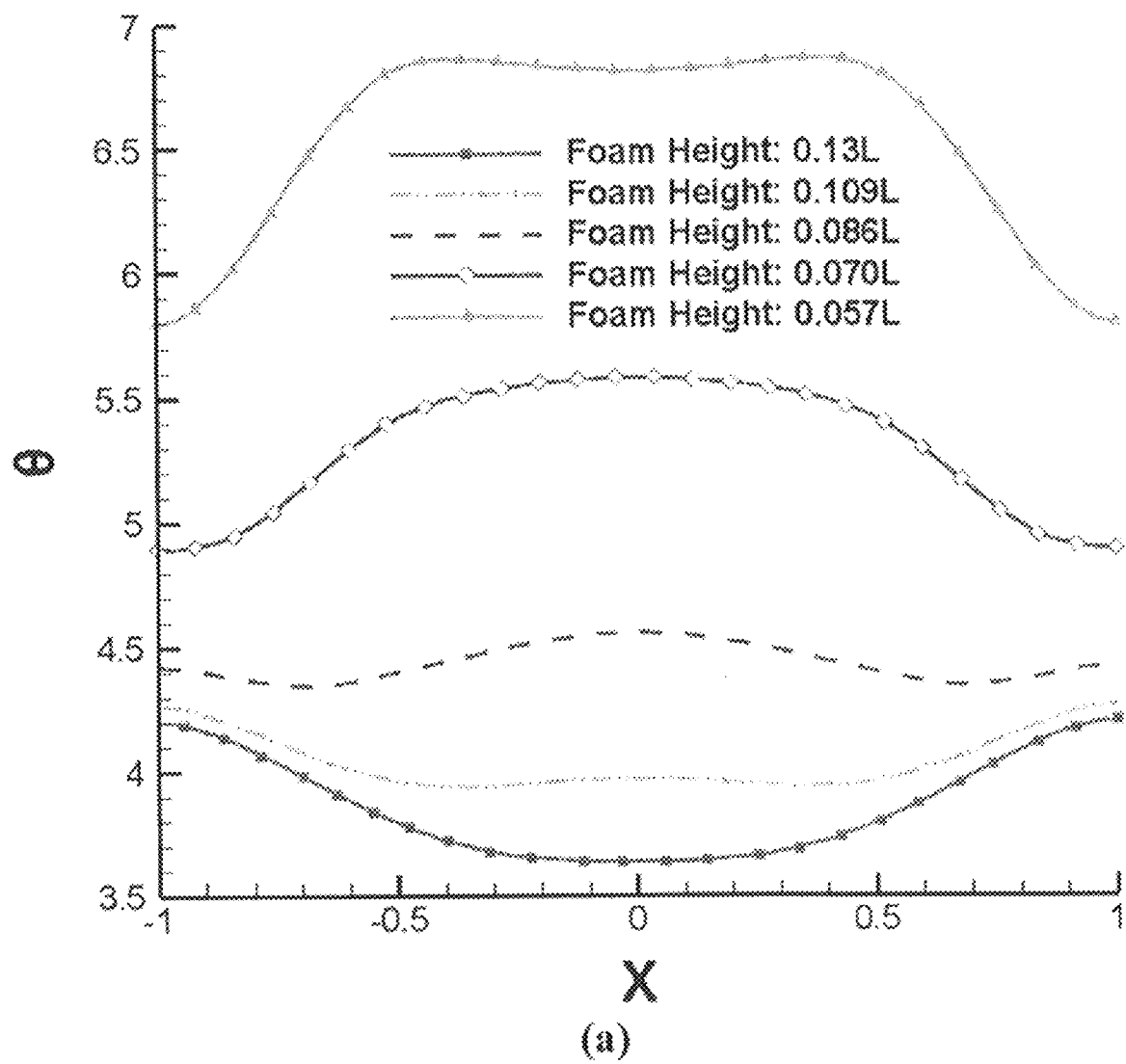
FIGS. 22A and B shows a non-dimensional temperature distribution along the centerlines at the base interface surface for slot jet impingement through partially and fully foam filled channels in (a) streamwise direction (b) spanwise direction.
Figure 22B:
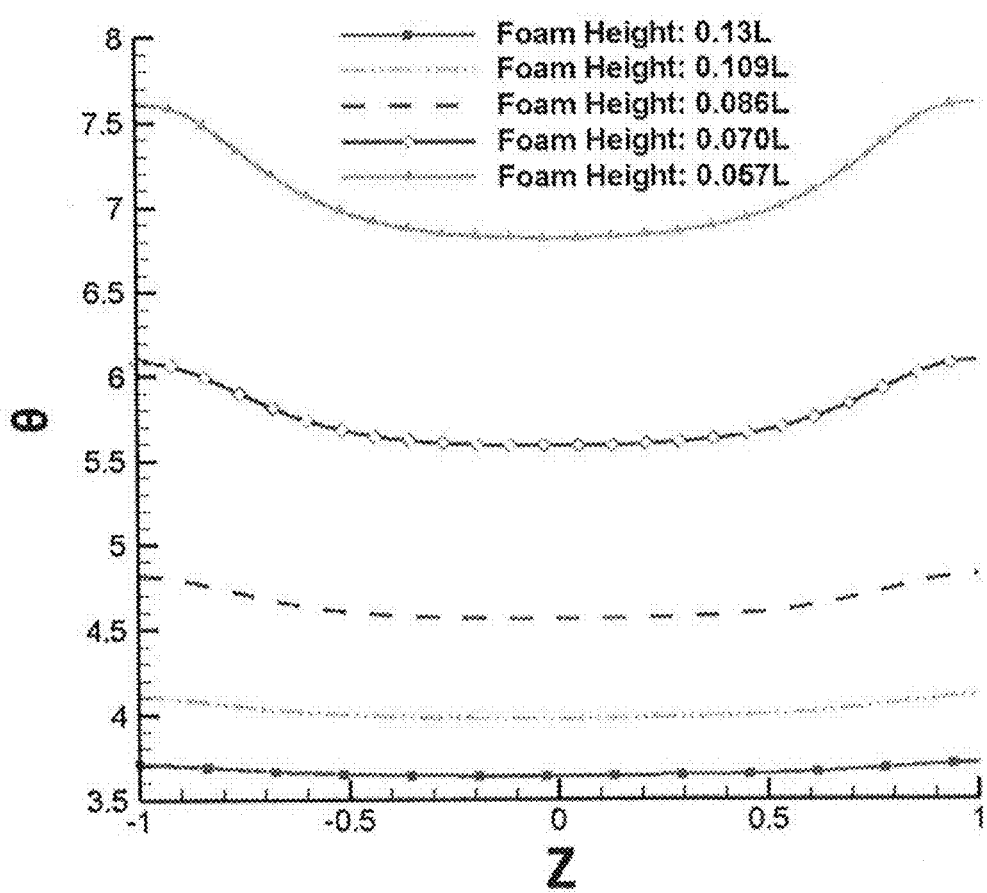

As the results indicate the fully foam filled channel provides less temperature values and a more efficient cooling (FIG. 22). A foam metal substrate provides a large surface area and thermal interaction between the coolant and the solid foam, resulting in a more efficient cooling at the base. As the foam thickness decreases, the temperature values at the base interface increase. In the partially foam filled channels, the coolant intends to pass through the non-foam area resulting in less thermal transport in foam region. A reduction in the foam thickness makes the situation worse. As the foam thickness decreases, a larger local velocity is observed in the non-foam region. As such, if the confined channel is partially filled by foam, the cooling effectiveness drops considerably. Due to the inclined walls of the channel, the coolant is directed to move closer to the base, providing a more efficient cooling and lower base temperature values towards the exit channels especially for thin foams (FIG. 22A). Although slot injection is employed, the temperature uniformity in span-wise direction is disturbed for partially foam filled channels (FIG. 22B). In thin foams, the central area next to the side walls (Z=±1) are not properly cooled.

Slot Jet Impingement Through Combined Rib-Foam Filled Channel

Figure 23:
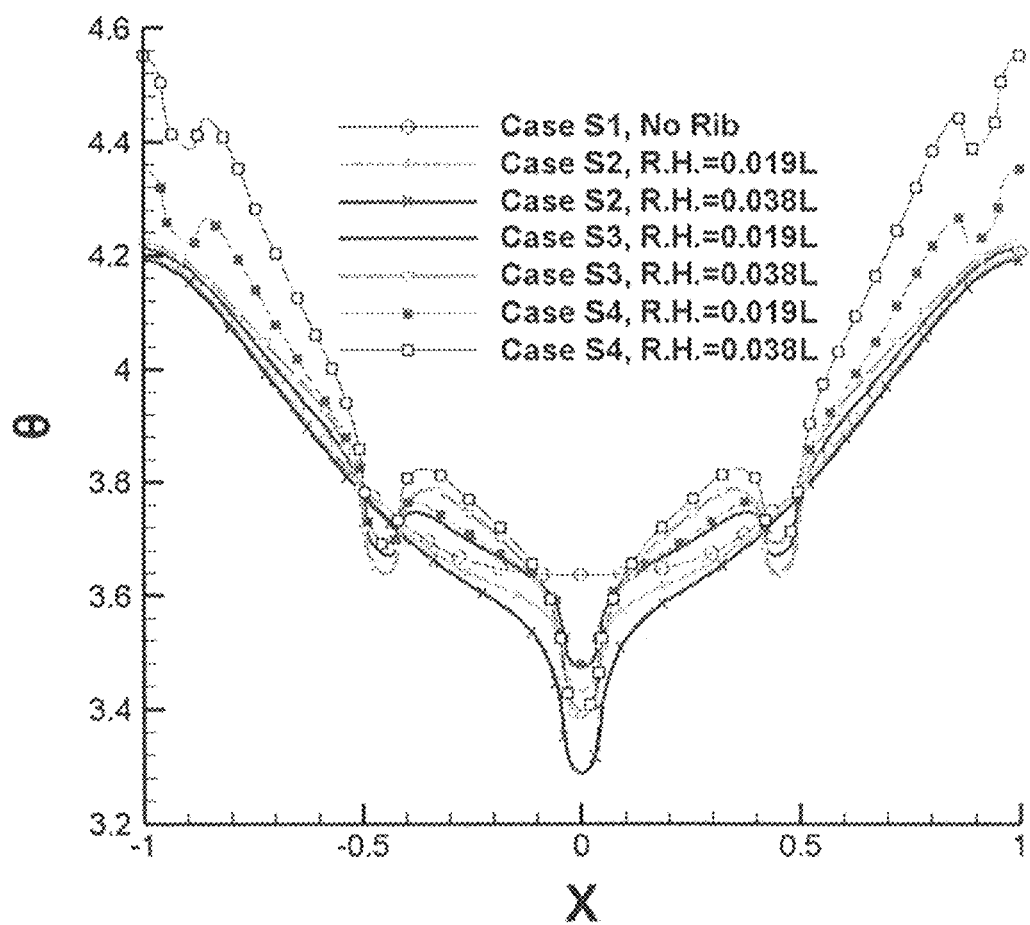
FIG. 23 shows a non-dimensional temperature distribution along the central streamwise direction at the base interface surface for slot jet impingement through combined rib-foam filled channels (Cases S2-S4) with the rib heights (R.H.) of 0.019L and 0.038L in comparison with no-rib foam filled channel (Case S1).
Figure 24A:
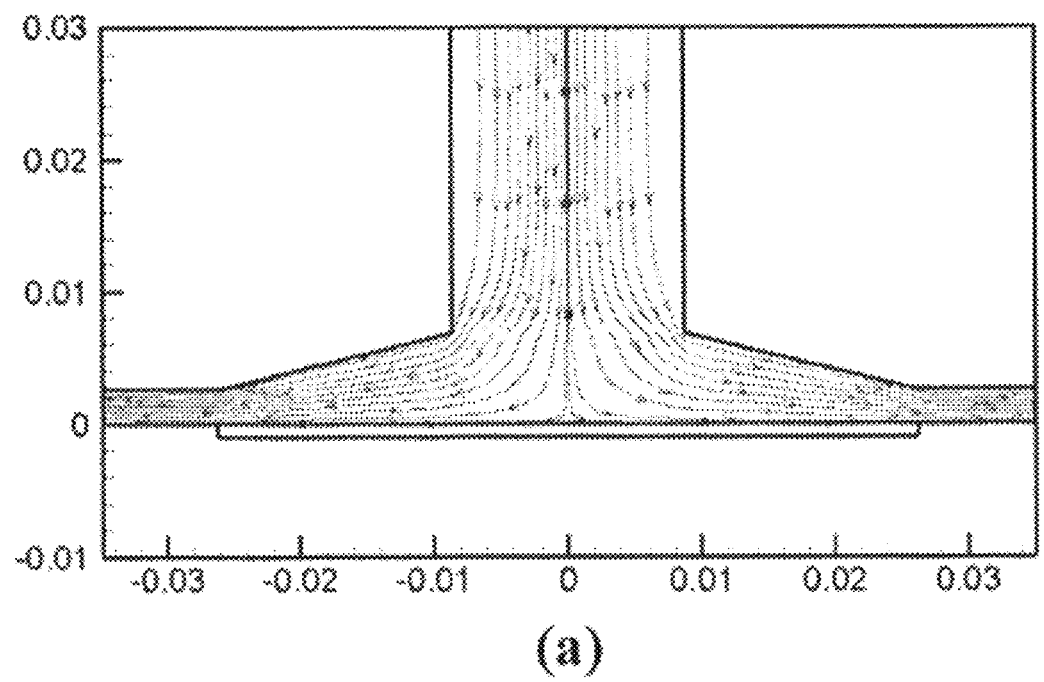
FIG. 24A-E shows streamlines at the central surface (Z=0) of the channel with slot injection (a) Case S1 without any rib, (b) Case S3 with the rib height of 0.019L, (c) Case S3 with the rib height of 0.038L, (d) Case S4 with the rib height of 0.019L, and (e) Case S4 with the rib height 0.038L.
Figure 24B:
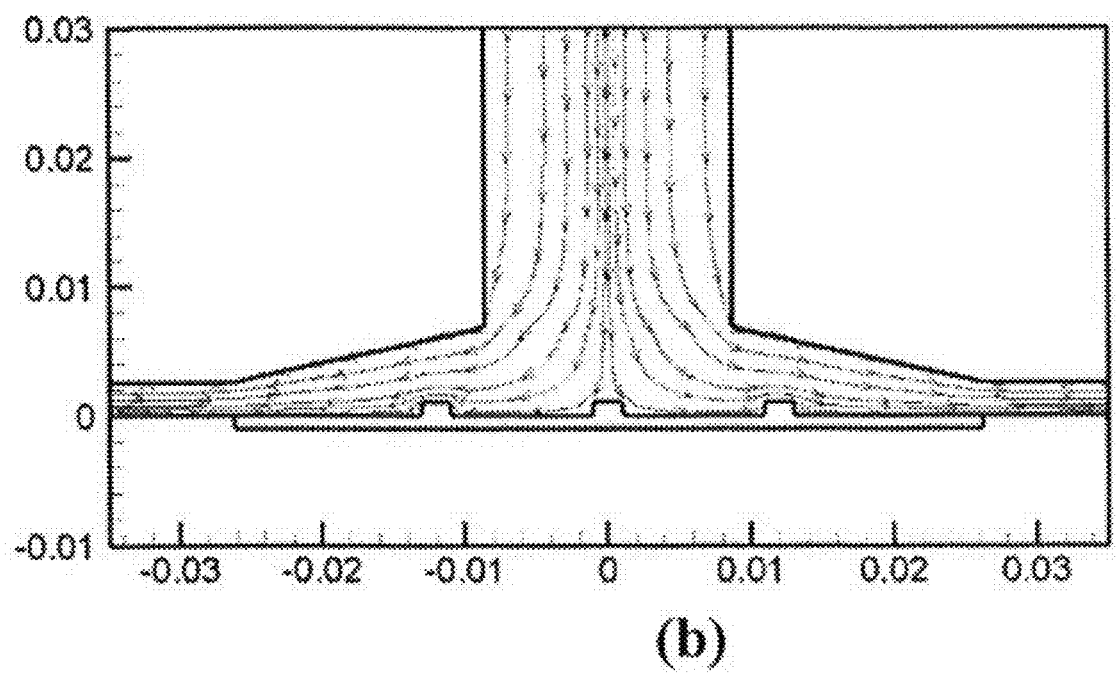
Figure 24C:
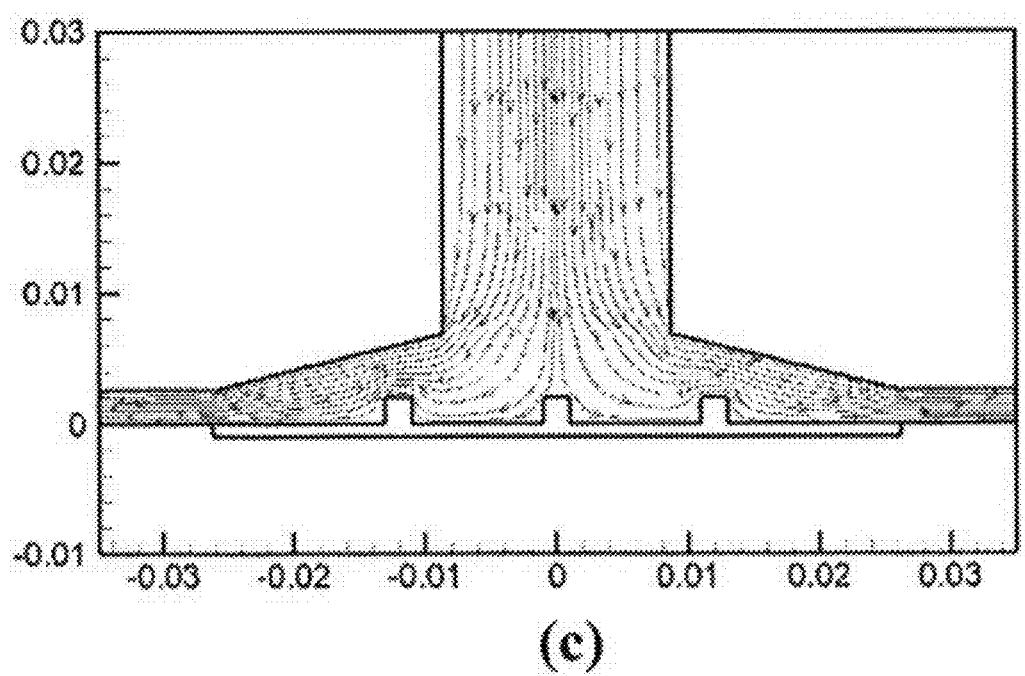
Figure 24D:
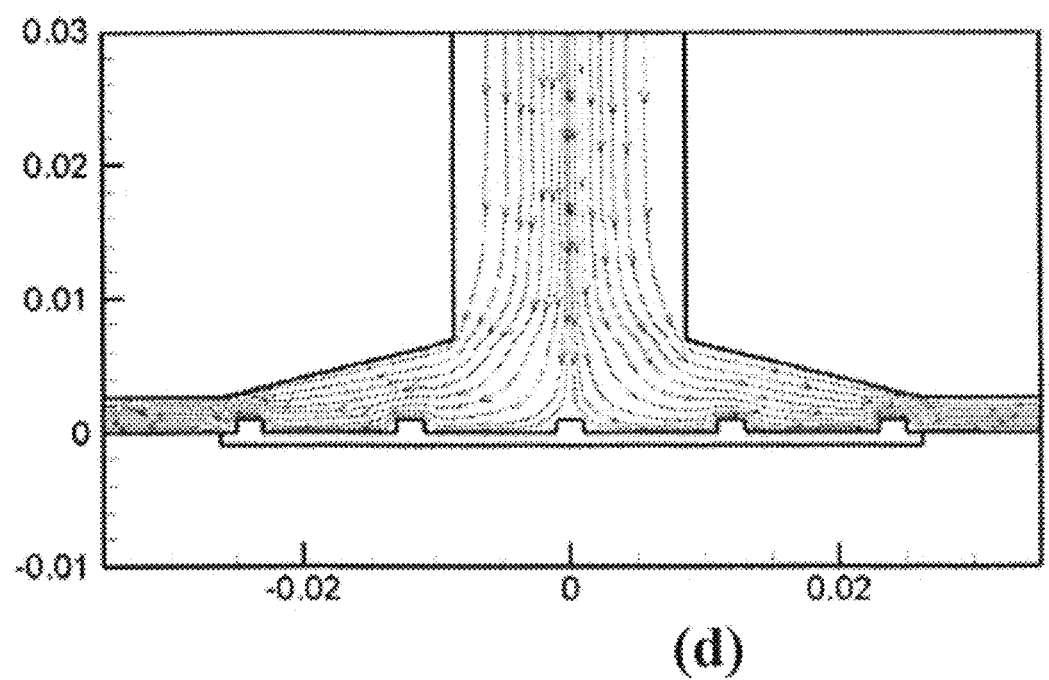
Figure 24E:
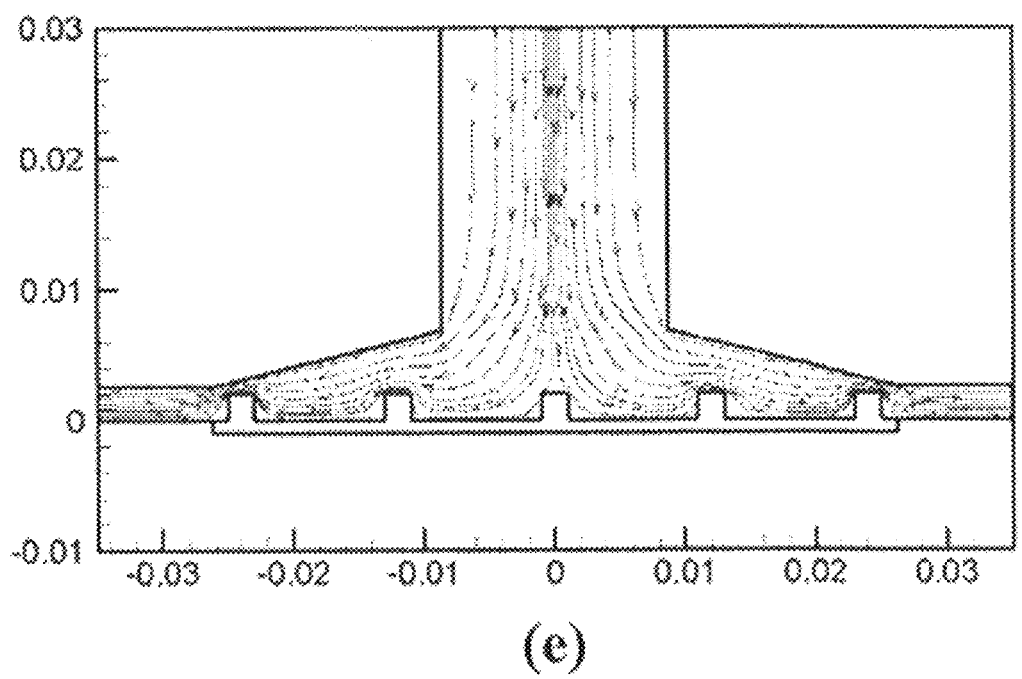

Single and multiple cuboid straight ribs elongated in spanwise direction are attached to the base interface surface of the fully foam filled channel subject to slot jet impingement. The jet inlet velocity is 3 cm/s and the channel is subject to the heat flux of $10^5$ W/m$^2$. The studied rib structured surfaces employ one, three or five parallel ribs. Each ribbed case is studied for two rib heights of 1 mm (0.019L) and 2 mm (0.038L). The width of each rib, in stream wise direction (X), is 0.038L and the distance between the rib center lines, i.e. rib pitch, is 0.229L (FIG. 35). The results indicate that the addition of rib structures results in lower temperature values at the base where the ribs are located (FIG. 23). As such, the ribs can be employed for hotspot removal when more efficient cooling is required locally. However, the proper selection of rib shape, rib size, and number of ribs has an important role in overall cooling effectiveness. As FIG. 23 indicates the single rib structured base surface results in the lowest local temperature values compared to multi rib cases, for similar rib heights. Note that the single rib is placed right in front of the jet impingement at the centerline of the stagnation region at the base. Comparison of the studied multi rib cases depicts that adding ribs results in more number of places with local lower temperature values compared to the case without any rib at that location (Case S1). However, the rib addition outside the central stagnation region decreases the overall thermal performance at the base.

The distance between the ribs is an important factor for designing multi parallel ribs. For this study pitch size is selected in a way to fit enough number of ribs while flow does not get trapped between the ribs. However, the comparison of the single and multi-rib cases with the same rib sizes shows that the lateral ribs disturb flow movement through the metal foam adjacent to the base wall. That results in higher local temperature values at the space between the ribs. Due to the presence of inclined walls, the distance between the base and the inclined walls are smaller near the exits than other locations. Therefore, the employment of lateral ribs near the exits results in even higher local temperature values at the rib locations and around the foam exits. As FIG. 23 shows, an increase in the rib height results in even lower local temperature values at the base for single rib Case S2 and most regions of three-rib Case S3. Local temperature enhances in most regions of five-rib Case S4, by an increase in the rib height.

In FIG. 24, streamlines at the mid plane of the channel (Z=0) are depicted for Case S1, Case S3, and Case S4, with the rib heights of 0.019L and 0.038L. The streamlines confirm the earlier discussion on temperature values at the base. By adding ribs outside the stagnation region of the jet and near the exits, flow blockage is observed at the exits, especially for the ribs with larger height (0.038L). Also, the lateral ribs may disturb the flow movement adjacent to the base and cause flow detachment resulting in less overall cooling effectiveness.

Circular Jet Impingement Through Combined Rib-Foam Filled Channel

Figure 25A:
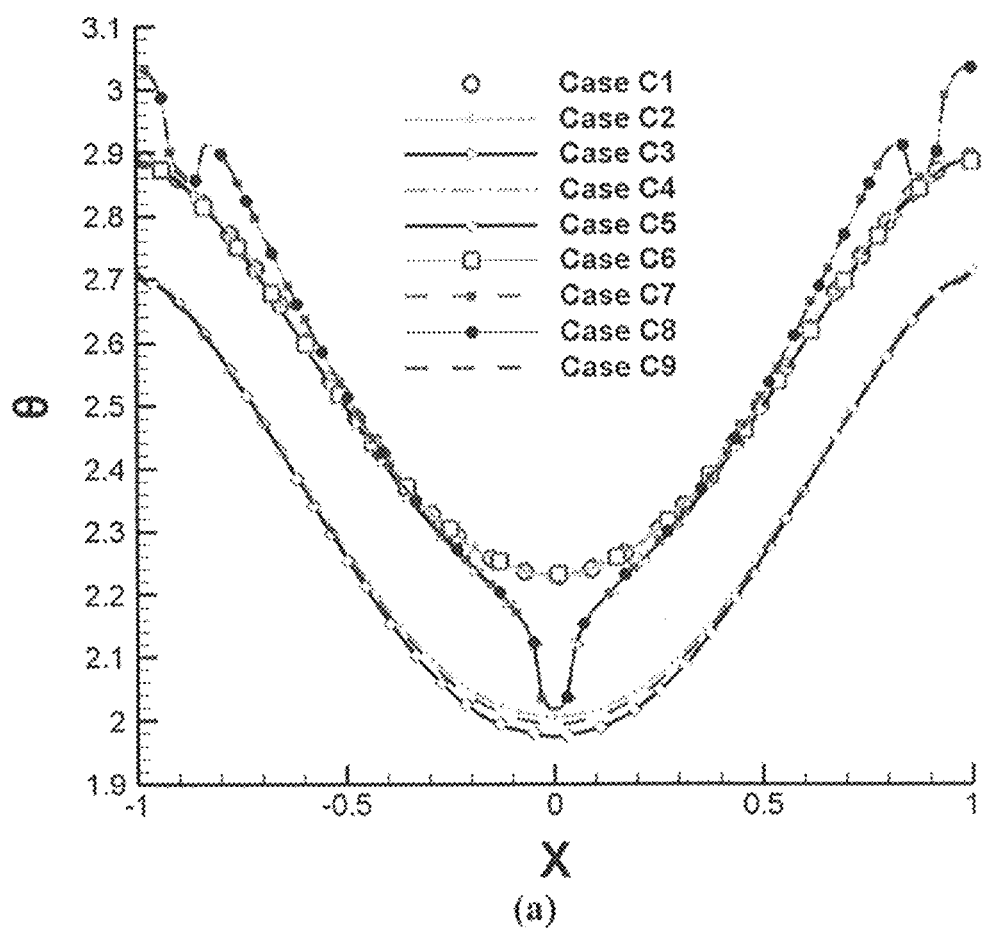
FIG. 25A-B shows non-dimensional temperature distribution along the centerlines at the base interface surface with circular jet impingement through combined rib-foam filled channels (Cases C2-C9) in comparison with foam filled channel (Case C1) in (a) streamwise direction (b) spanwise direction.
Figure 25B:
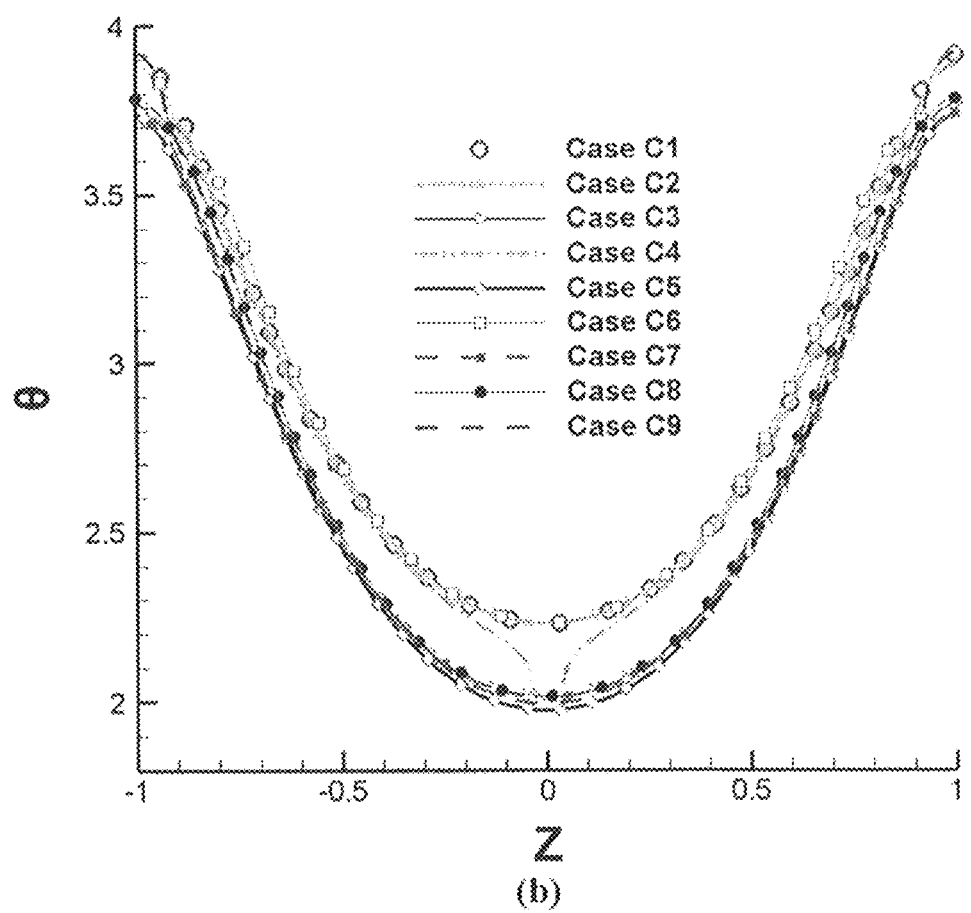

Different single rib and multi-rib structured foam filled channels are simulated to investigate the effects of number of ribs, rib location and rib orientation. The channels are subject to the uniform heat flux of $10^5$ W/m$^2$ and the circular jet impingement with the inlet velocity of 11.57 cm/s. The cuboid ribs are elongated in both streamwise and spanwise directions to better investigate the three-dimensional effects and obtain the advantageous combined rib-foam designs for hot spot removal (FIG. 36). FIG. 25 represents the temperature profiles along the streamwise and spanwise centerlines at the base interface surface for the rib structured Cases C2-C9 and the no-rib Case C1 (FIG. 36). For both with and without rib cases, the comparison of maximum temperature values in central streamwise and spanwise lines (FIGS. 25A and 25B) indicates that higher temperature values and less efficient cooling at the centerlines are occurred in spanwise direction towards the side walls.

The temperature profiles also show that Case C2 with two singular cubic ribs at the side walls does not affect the centerline temperature profiles (FIG. 25). The case with the central cuboid rib elongated in spanwise direction (Case C3) results in much lower temperature values compared to no-rib case (case C1), at the central area of the stagnation region at the base interface along the spanwise direction (FIG. 25B). In streamwise direction (FIG. 25A), case C3 results in low local temperature values mainly at the base center, with minimum temperate right at the center of the stagnation region. When the single rib is placed along centerline streamwise direction (Case C4), the low temperature region occurs along the streamwise direction at the base. In spanwise direction, the local low temperature values are observed only at the base center for Case C4. That shows the advantage of Case C3 for spanwise cooling and Case C4 for streamwise cooling.

A combination of Case C3 and Case C4 is also investigated (Case C5) that indicates the combined advantages obtained for each of the single rib cases (FIG. 25). Case C5 results in low temperature values in the stagnation region in both directions resulting in an efficient local hot spot removal. The low temperature regions in both streamwise and spanwise directions are considerably wider than the rib width. In Case C6, two cuboid ribs are placed near the side walls along the streamwise direction. This case does not provide any cooling advantages at the stagnation area or along the streamwise and spanwise centerlines, in comparison with Case C1 as a no-rib case. In Case C7, three parallel ribs are elongated in spanwise direction at the base interface surface. This case has similar results to those of Case C3 along spanwise direction. However, the temperature values near the exits in streamwise direction are even higher than those of Case C1. Case C8 is the combination of Case C6 and Case C7. The temperature values in streamwise and spanwise centerlines are similar for Case C7 and Case C8. Case C9 is a combination of Case C5 and Case C6. The temperature values of Case 9 are a little more than the temperature values of Case C5 along both centerlines.

Among all studied cases, Case C5 presents the best design for local hot spot heat removal. That is also confirmed by studying the temperature contours at the base interface (FIG. 26). In addition, the comparison of Case C3 and Case C4 indicates that the central rib elongated in streamwise direction provides a better cooling at the base corners (FIG. 26). Furthermore, a single rib placed at any of the base centerlines (Case C3 and Case C4) provides better cooling at the base corners compared to the case with two ribs at the sides (Case C6). However, adding the cuboid ribs next to the side walls (Case C6) can slightly improve the cooling of the base corners compared to the case with no rib (Case C1). The addition of two spanwise ribs at the base near the exits (Case C7 and Case C8) can improve cooling effectiveness at the corners (FIG. 26). However, higher local temperature values are observed near the exits for these cases. Comparing the results of Case C5 with those of Case C9 depicts that Case C5 can result in slightly lower temperature values at the stagnation region in front of the circular jet, while Case C9 results in marginally lower temperature values near the side walls.

Figure 27:
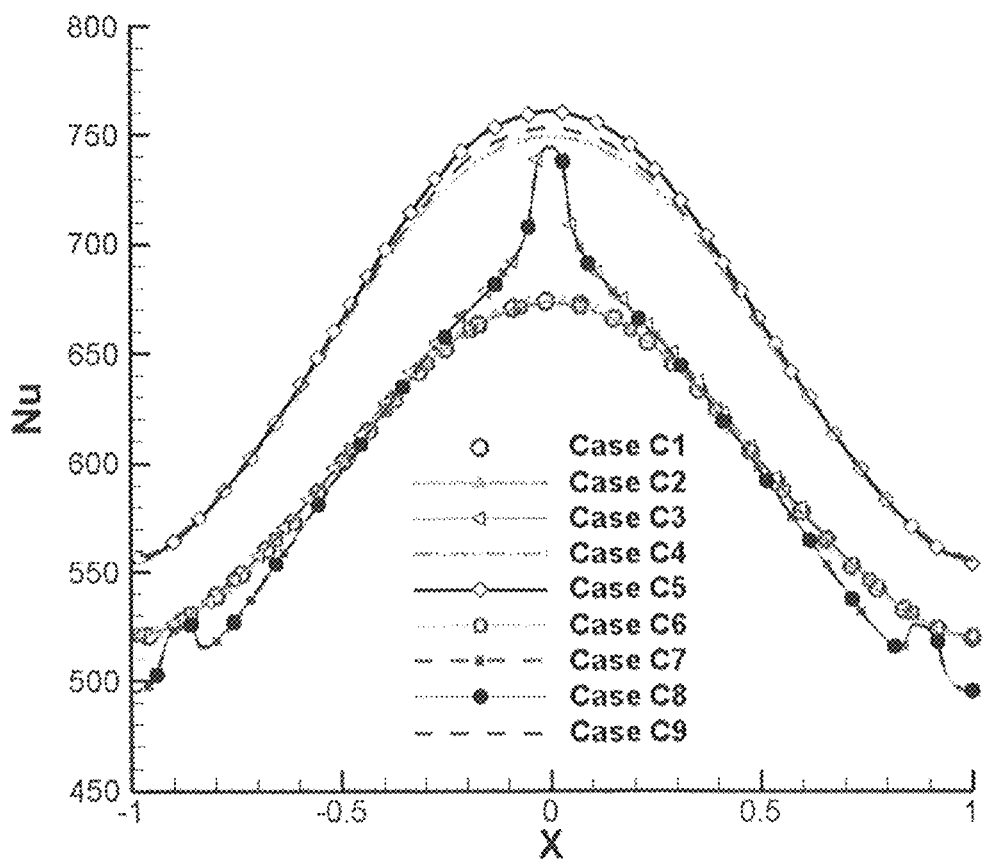
FIG. 27 shows local Nusselt number variation along the streamwise centerline at the base interface surface with circular jet impingement through combined rib-foam filled channels (Cases C2-C9) in comparison with foam filled channel (Case C1).

Thermal development is also discussed by studying local Nusselt number as defined in Eq. 13. The variation of local Nusselt number along the streamwise centerline at the base interface surface for the rib structured Cases C1-C9 is depicted in FIG. 27. The figure indicates that the maximum local Nusselt number occurs at the stagnation area in front of the impinging jet. In addition, Case C5 results in the highest local Nusselt number values compared to other studied cases. For instance, the maximum local Nusselt number of Case C5 is 13% larger than that of Case C1, indicating that adding the perpendicular ribs at the stagnation region to Case C1 has increased the maximum local Nusselt number by 13%. That confirms the thermal advantage of placing ribs at the stagnation zone of the impinging jet.

Adding the ribs slightly increases the pressure drop in the cooling system. The pressure drop is evaluated as 254.5 Pa, 254.5 Pa, 255.7 Pa, 260 Pa, 265.3 Pa, 259.2 Pa, 330.2 Pa, 338.6 Pa, and 266.1 Pa for Cases C1, C2, C3, C4, C5, C6, C7, C8, and C9, respectively. The required pumping power is evaluated as 6.9 mW, 6.9 mW, 7 mW, 7.1 mW, 7.2 mW, 7.1 mW, 9 mW, 9.2 mW, 7.2 mW, for Cases C1, C2, C3, C4, C5, C6, C7, C8, and C9, respectively. Note, the power values are presented in milli-Watts. The pressure drop enlargement is higher when the ribs are placed near the exits, i.e. Case C7 and Case C8, due to the channel inclined walls and lower thickness of the channel near the exits. Comparison of Cases C1 and C5 indicates that adding perpendicular ribs at the stagnation region to Case C1 has increased the pressure drop and the required pumping power by 4.2%.

Jet Impingement Velocity

Figure 28:
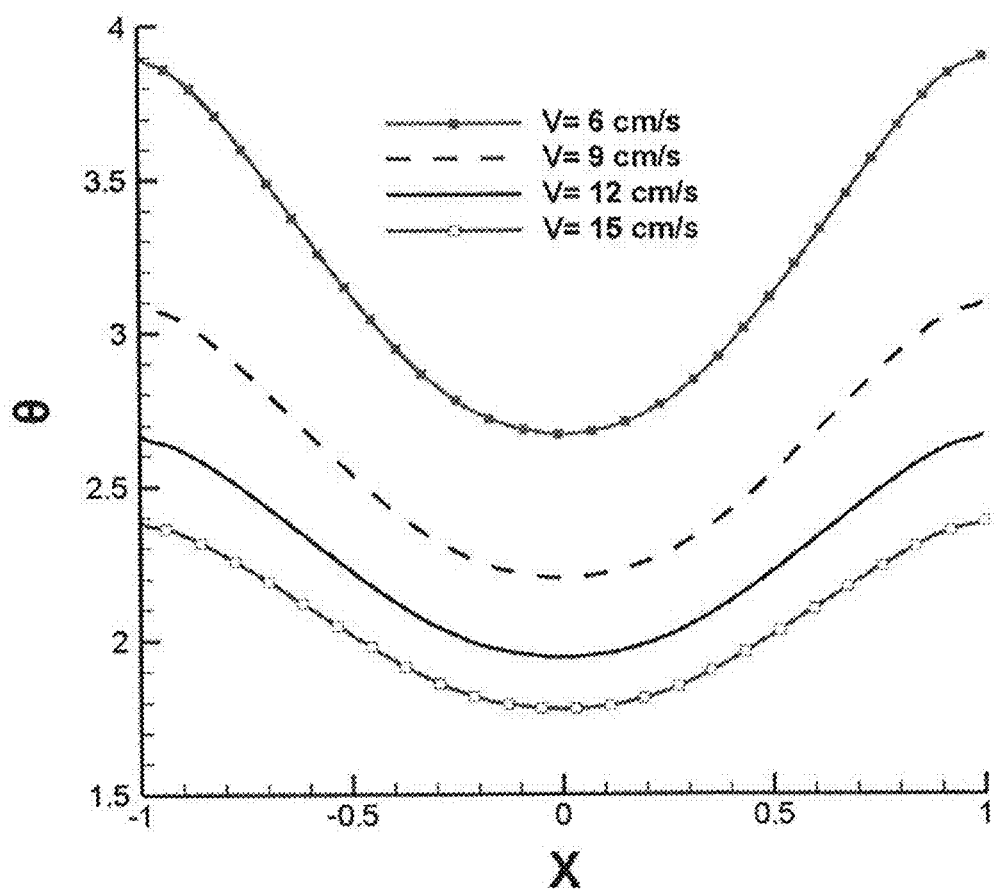
FIG. 28 shows impinging jet velocity effect on non-dimensional temperature distribution along the central streamwise direction at the base interface surface for Case C5.

The effect of the impinging jet velocity is investigated for the rib-structured foam filled Case C5. The foam filled channel is subject to the heat flux of $10^5$ W/m2. The studied jet inlet velocities are 6 cm/s, 9 cm/s, 12 cm/s, and 15 cm/s. FIG. 28 indicates the temperature distribution along the streamwise centerline at the base interface of the channel. The results show that an increase in the velocity decreases the temperature values and improves thermal uniformity. For the studied Case C5 with the jet velocity of 6 cm/s, the maximum local Nusselt number occurred at the center of the stagnation region is 509.6. The maximum Nusselt number is evaluated as 611.5, 689.5, and 753.8 for the jet velocity of 9 cm/s, 12 cm/s, and 15 cm/s, respectively. It shows that by increasing the velocity from 6 cm/s by 50%, 100%, and 150%, the maximum local Nusselt number increases by 20%, 35.3%, and 48%, respectively.

As discussed in literature, velocity enhancement increases the pressure drop and the required pumping power [14, 66]. For the studied Case C5 with the jet velocity of 6 cm/s, the pressure drop and the required pumping power are evaluated as 99.24 Pa and 1.4 mW. The pressure drop is evaluated as 178.67 Pa, 277.74 Pa, and 396.35 for the jet velocity of 9 cm/s, 12 cm/s, and 15 cm/s, respectively. The required pumping power is evaluated as 3.79 mW, 7.85 mW, and 14.01 mW for the jet velocities of 9 cm/s, 12 cm/s, and 15 cm/s, respectively. It indicates that by increasing the velocity from 6 cm/s by 50%, 100%, and 150%, the pressure drop increases by 80%, 180%, and 299.4%, and the required pumping power increases by 170.7%, 460.7%, and 900.7%, respectively.

Applied Heat Flux

Figure 29:
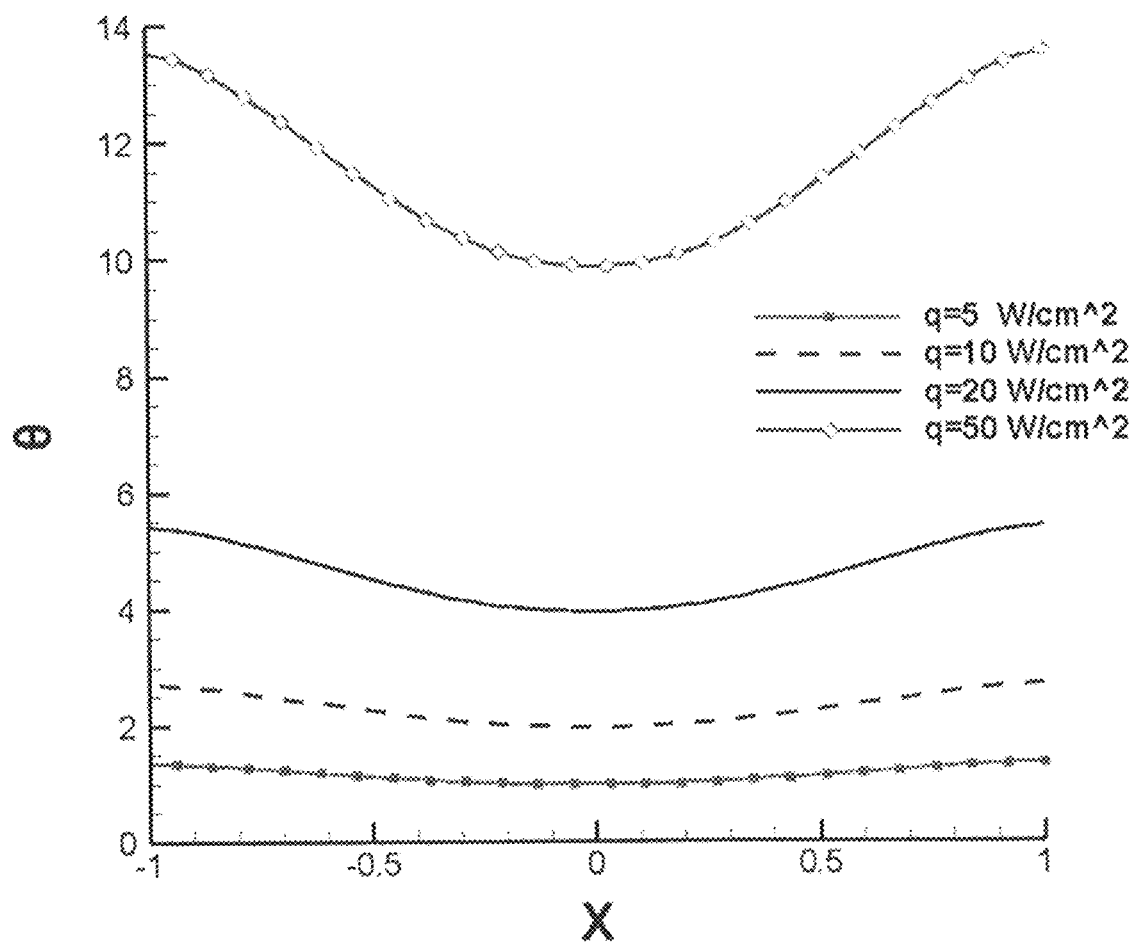
FIG. 29 shows the effect of applied heat flux value on non-dimensional temperature distribution along the central streamwise direction at the base interface surface for Case C5.

The base of the cooling system is subject to a uniform heat flux representing a heat dissipating electronics component. The effect of different heat flux values ($5\times10^4$ W/m2, $10^5$ W/m2, $2\times10^5$ W/m2 and $5\times10^5$ W/m2) on temperature distribution along the streamwise centerline at the base interface of Case C5 is depicted in FIG. 29. In Case C5, the coolant is injected from a circular cross section jet and the target surface is structured by two perpendicular ribs (FIG. 36). For all studied heat flux values, the impinging jet velocity is kept the same as 11.57 cm/s. As expected, the results show that increasing the heat flux value enlarges the temperature values along the centerline (FIG. 29). Note that in FIG. 29, all temperature values are non-dimensionalized using similar heat flux value of $10^5$ W/m2. If the dimensional temperature profiles for each studied heat flux are non-dimensionalized by their corresponding heat flux, the temperature profiles would match each other. As such, the temperature profiles for all heat fluxes would be the same as the profile shown in FIG. 29 for the heat flux of $10^5$ W/m2.

Thickness of Conductive Heat Spreader Plate

Figure 30A:
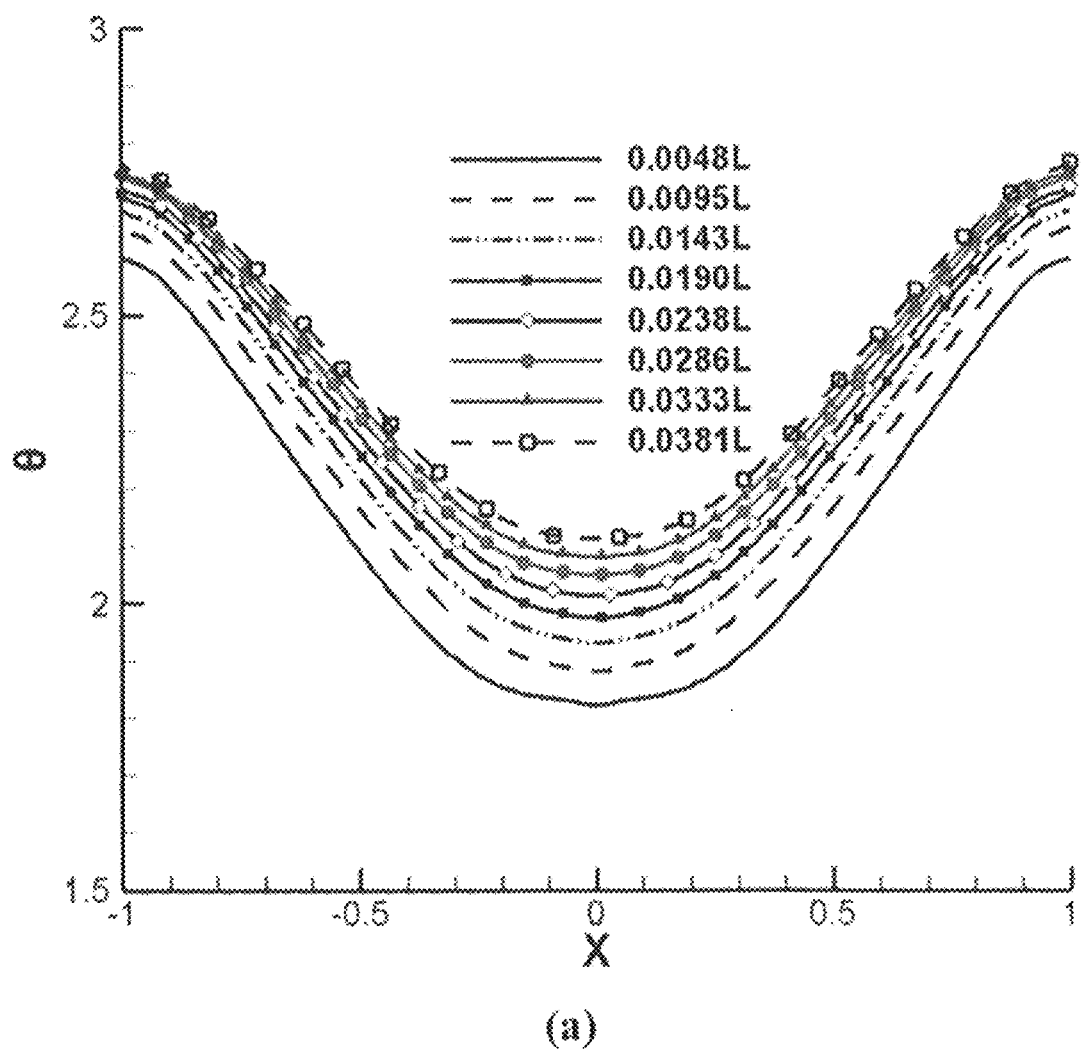
FIG. 30A-B shows the effect of conductive heat spreader plate thickness on non-dimensional temperature distribution along the centerline at the base interface of Case C5 in (a) streamwise direction (b) spanwise direction.
Figure 30B:
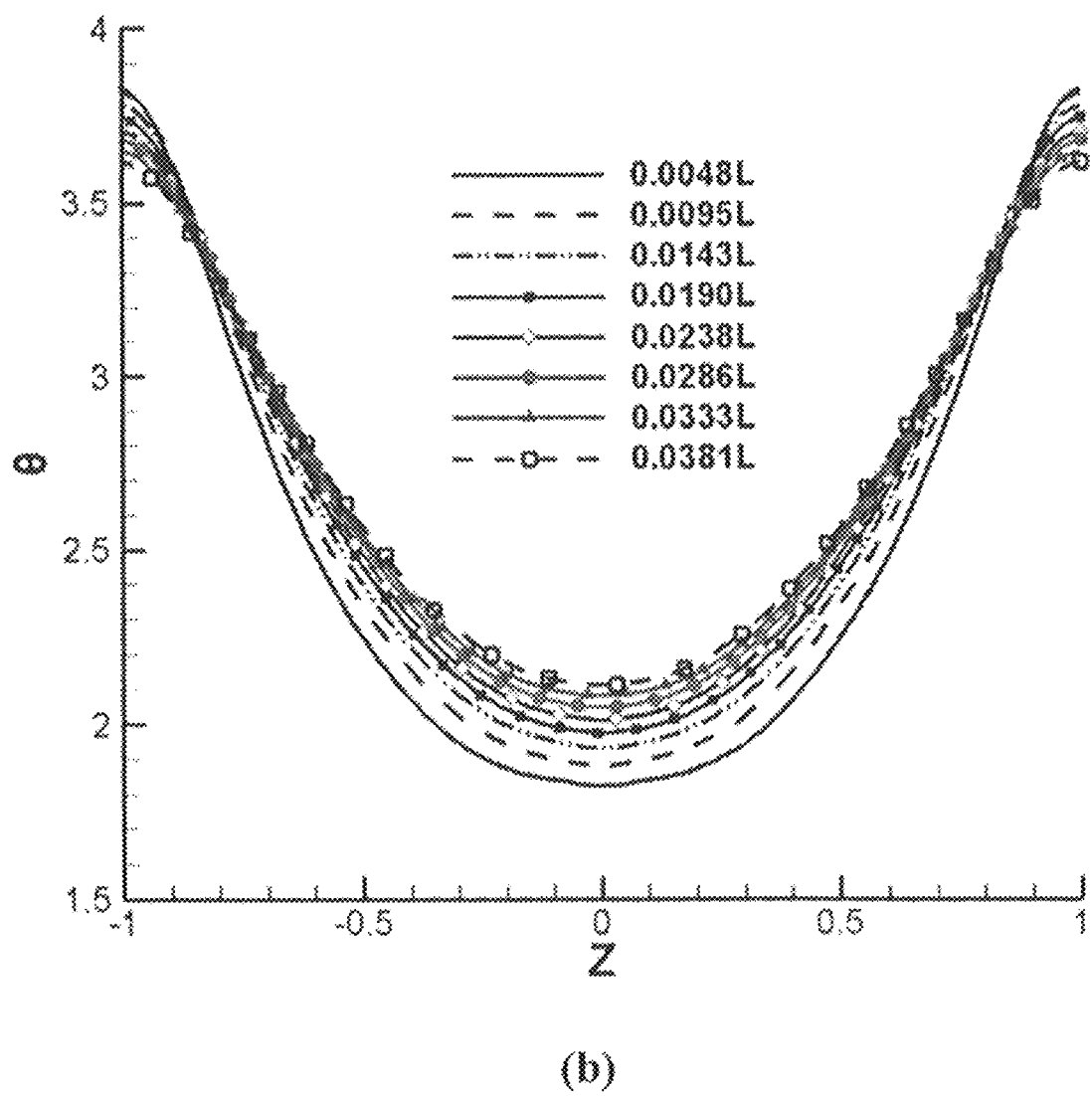
Figure 31:
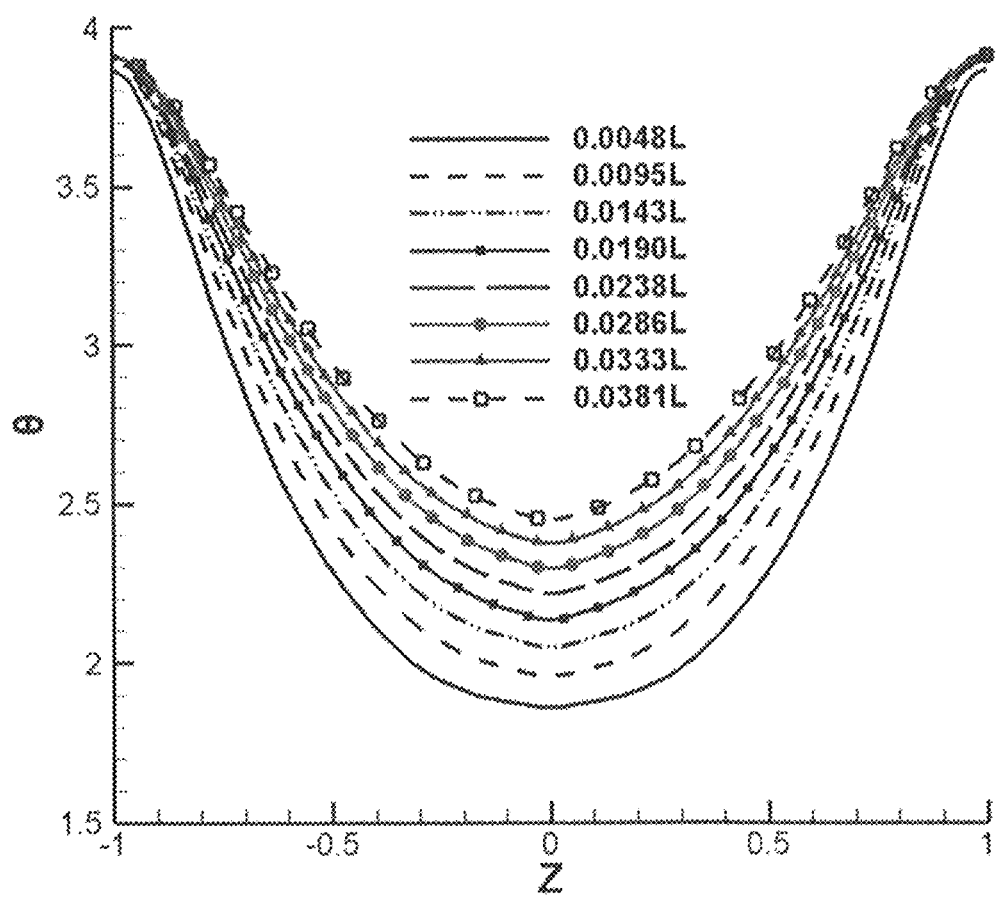
FIG. 31 shows the effect of conductive heat spreader plate thickness on non-dimensional temperature distribution along the spanwise centerline of the bottom surface of the plate for Case C5.

The effect of the thickness of the conductive heat spreader plate on temperature distribution is investigated for Case C5 with the plate thicknesses of 0.25 mm (0.0048L), 0.5 mm (0.0095L), 0.75 mm (0.0143L), 1 mm (0.019L), 1.25 mm (0.0238L), 1.5 mm (0.0286L), 1.75 mm (0.0333L), and 2 mm (0.0381L). The results indicate that an increase in the plate thickness enlarges the temperature values at the streamwise centerline of the base interface surface (Y=0, Z=0), while improving the temperature uniformity (FIG. 30A). That is due to multi-dimensional conduction heat transfer within the plate. As FIG. 30B depicts, similar behavior is observed along the spanwise centerline except near the side walls (X=0, Y=0, Z=±1). The study of temperature profiles along the streamwise centerline at the bottom surface of the plate where the heat flux is applied shows that the temperature values are enlarged by increasing the thickness. The temperature uniformity is also enhanced by the thickness increase. However, the temperature values at the bottom surface of the plate are greater than those at the base interface (Y=0). FIG. 31 represents the non-dimensional temperature profiles along the spanwise centerline at the bottom surface of the plate where the heat flux is applied. As FIG. 31 shows, the temperature values and uniformity are increased by the thickness. However, near the side walls, the temperature at the bottom surface is less affected by the thickness. For the studied Case C5 with the plate thickness of 0.5 mm (0.009L), the maximum local Nusselt number occurred at the center of the stagnation region is evaluated as 798.7. The Nusselt number is 760.9, and 733.2 for the plate thickness of 1 mm (0.019L), and 1.5 mm (0.029L), respectively. It shows that by increasing the thickness from 0.5 mm by 100% and 200%, the maximum local Nusselt number decreases by 4.7% and 8.2%, respectively.

Electronics cooling is a key part of development of advanced miniaturized electronics devices. In this example, innovative cooling systems are investigated with application in hot spot removal in electronics components. Flow and thermal transport in the combined rib and foam filled channels subject to jet impingement and high heat flux value are analyzed. Various effective parameters are studied such as fully versus partially foam filled channels, slot and circular jet impingements through combined rib-foam filled channels, rib size, rib orientation, rib location, single rib and multi ribs. The results show that the minimum temperature occurs right in front of the impinging jet in the stagnation zone for both slot and circular jets. However, the temperature increases as flow moves away from the stagnation region. In addition, fully foam filled channels provide less temperature values at the base and a more efficient cooling. The results also indicate that the addition of rib structures can result in lower temperature values at the base where the ribs are located. Studying multiple cases with slot and circular jet impingement indicate the advantage of combined rib-foam filled channels for local hotspot removal.

The most efficient design is Case C5 with perpendicular cuboid ribs placed at the base in the stagnation area, right in front of the jet impingement. The maximum local Nusselt number occurs at the stagnation area right in front of the impinging jet. Employing the perpendicular ribs at the stagnation region has increased the maximum local Nusselt number by 13%, confirming the thermal advantage of placing ribs at the stagnation zone of the impinging jet for local hot spot removal. For Case C5, the effects of jet velocity, applied heat flux and the thickness of the conductive heat spreader plate are also discussed. The result show that by increasing the velocity from 6 cm/s by 50%, 100%, and 150%, the maximum local Nusselt number increases by 20%, 35.3%, and 48%, the pressure drop increases by 80%, 180%, and 299.4%, and the required pumping power increases by 170.7%, 460.7%, and 900.7%, respectively. A reduction in the plate thickness decreases the temperate values and temperature uniformity along the streamwise centerline direction. In addition, increasing the plate thickness from 0.5 mm by 100% and 200% would result in reduction in the maximum local Nusselt number by 4.7% and 8.2%, respectively.

Thus, specific embodiments, methods of use of thermal management devices for use with components having high heat or temperature flux values have been disclosed. It should be apparent, however, to those skilled in the art that many more modifications besides those already described are possible without departing from the inventive concepts herein. The inventive subject matter, therefore, is not to be restricted except in the spirit of the disclosure herein. Moreover, in interpreting the specification and claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

REFERENCES

[1] Y. A. Cengel and A. J. Ghajar, *Heat and Mass Transfer: Fundamentals & Applications*, McGraw-Hill, New York, 2015.

[2] S. Mahjoob and K. Vafai, "A Synthesis of Fluid and Thermal Transport Models for Metal Foam Heat Exchangers," International Journal of Heat and Mass Transfer, vol. 51, no. 15, pp. 3701-3711, 2008.
[3] J. S. Bintoro, A. Akbarzadeh, and M. Mochizuki, "A Closed-Loop Electronics Cooling by Implementing Single Phase Impinging Jet and Mini Channels Heat Exchanger," Applied Thermal Engineering, vol. 25, no. 17, pp. 2740-2753, 2005.
[4] M. Iyengar and M. Jr. Ellsworth, "Design and Analysis of Direct Liquid Multi-Jet Impingement Schemes for Electronics Applications," ASME International Mechanical Engineering Congress and Exposition, vol. 2, pp. 249-256, 2004.
[5] K. Vafai, *Handbook of Porous Media*, $3^{rd}$ Edition, CRC Press, Taylor & Francis, Boca Raton, FL, 2015
[6] A. Sivasamy, V. Selladurai, and P. R. Kanna, "Jet Impingement Cooling of a Constant Heat Flux Horizontal Surface in a Confined Porous Medium: Mixed Convection Regime," International Journal of Heat and Mass Transfer, vol. 53, no. 25, pp. 5847-5855, 2010.
[7] N. H. Saeid and A. A. Mohamad, "Jet Impingement Cooling of a Horizontal Surface in a Confined Porous Medium: Mixed Convection Regime," International Journal of Heat and Mass Transfer, vol. 49, no. 21, pp. 3906-3913, 2006.
[8] K. C. Wong and N. H. Saeid, "Numerical Study of Mixed Convection on Jet Impingement Cooling in an Open Cavity Filled with Porous Medium," International Communications in Heat and Mass Transfer, vol. 36, no. 2, pp. 155-160, 2009.
[9] A. P. Rallabandi, D. H. Rhee, A. Gao, and J. C. Han, "Heat Transfer Enhancement in Rectangular Channels with Axial Ribs or Porous Foam under Through Flow and Impinging Jet Conditions," International Journal of Heat and Mass Transfer, vol. 53, no. 21, pp. 4663-4671, 2010.
[10] P. Wang, K. Vafai, and D. Y. Liu, "Analysis of Radiative Effect Under Local Thermal Non-Equilibrium Conditions in Porous Media-Application to a Solar Air Receiver," Numerical Heat Transfer, Part A: Applications, vol. 65, no. 10, pp. 931-948, 2014.
[11] E. M. G. Rodrigues, R. Melicio, V. M. F. Mendes, and J. P. S. Catalao, "Simulation of a Solar Cell considering Single-Diode Equivalent Circuit Model," Renewal Energy and Power Quality Journal, vol. 1, pp. 369-373, 2011.
[12] C. Zing and S. Mahjoob, "Numerical Analysis of Thermal Transport in Nano Fluidic Porous Filled Heat Exchangers for Electronics Cooling," ASME Summer Heat Transfer Conference, vol. 1, 2017.
[13] L. Tadrist, M. Miscevic, O. Rahli, and F. Topin, "About the use of Fibrous Materials in Compact Heat Exchangers," Experimental Thermal and Fluid Science, vol. 28, no. 2, pp. 193-199, 2004.
[14] S. Mahjoob, K. Vafai, and N. R. Beer, "Rapid Microfluidic Thermal Cycler for Polymerase Chain Reaction Nucleic Acid Amplification," International Journal of Heat and Mass Transfer, vol. 51, no. 9, pp. 2109-2122, 2008.
[15] Fluent 17.1.0, *User Guide*, 2016.
[16] K. Vafai and S. Kim, "Forced Convection in a Channel Filled with Porous Medium—An Exact Solution," ASME J. Heat Transfer, vol. 111, pp. 103-110, 1989.
[17] Bhattacharya, A., and Mahajan, R. L. "Metal Foam and Finned Metal Foam Heat Sinks for Electronics Cooling in Buoyancy-Induced Convection." *Journal of Electronic Packaging* Vol. 128 No. 3 (2006): pp. 259-266.
[18] Feng, S. S., Kuang, J. J., Wen, T., Lu, T. J., and Ichimiya, K. "An Experimental and Numerical Study of Finned Metal Foam Heat Sinks under Impinging Air Jet Cooling." *International Journal of Heat and Mass Transfer* Vol. 77 (2014): pp. 1063-074.
[19] Feng, S. S., Kuang, J. J., Wen, T., Lu, T. J., and Ichimiya, K. "An Experimental and Numerical Study of Finned Metal Foam Heat Sinks under Impinging Air Jet Cooling." *International Journal of Heat and Mass Transfer* Vol. 77 (2014): pp. 1063-074.
[20] Shih, W. H., Chou, F. C., and Hsieh, W. H. "Experimental Investigation of the Heat Transfer Characteristics of Aluminum-foam Heat Sinks with Restricted Flow Outlet." Journal of Heat Transfer Vol. 129 No. 11 (2007): pp. 1554-1563.
[21] Bhattacharya, Anandaroop, Calmidi, Varaprasad V., and Mahajan, Roop L.-Thermophysical Properties of High Porosity Metal Foams. *International Journal of Heat and Mass Transfer* Vol. 45 No. 5 (2002): pp. 1017-1031.
[22] Iasiello, Marcello, Bianco, Nicola, Chiu, Wilson K. S., and Naso, Vincenzo.—Thermal Conduction in Open-Cell Metal Foams: Anisotropy and Representative Volume Element. *International Journal of Thermal Sciences* Vol. 137 (2019): pp. 399-409.
[23] Ranut, Paola. "On the Effective Thermal Conductivity of Aluminum Metal Foams: Review and Improvement of the Available Empirical and Analytical Models." *Applied Thermal Engineering* Vol. 101 (2016): pp. 496-524.
[24] Hwang, Jenn J., Hwang, G. J., Yeh, Rong H., and Chao, Chung H. "Measurement of Interstitial Convective Heat Transfer and Frictional Drag for Flow across Metal Foams." *Journal of Heat Transfer* Vol. 124 No. 1 (2002): pp. 120-129.
[25] Zhao, Chang Y., Lu, Wei, and Tassou, Savvas A. "Thermal Analysis on Metal-Foam Filled Heat Exchangers. Part II: Tube Heat Exchangers." *International Journal of Heat and Mass Transfer* Vol. 49 No. 15 (2006): pp. 2762-2770.
[26] Rachedi, R. and Chikh, Salah. "Enhancement of Electronic Cooling by Insertion of Foam Materials." *Heat and Mass Transfer* Vol. 37 No. 4 (2001): pp. 371-378.
[27] Boomsma, Kevin, Poulikakos, Dimos, and Zwick, F. "Metal Foams as Compact High Performance Heat Exchangers." *Mechanics of Materials* Vol. 35 No. 12 (2003): pp. 1161-1176.
[28] Das, Sarit K., Choi, Stephen U. S., and Patel, Hrishikensh E. "Heat Transfer in Nanofluids—a Review." *Heat Transfer Engineering* Vol. 27 No. 10 (2006): pp. 3-19.
[29] Zing, Carlos, Mahjoob, Shadi, and Vafai, Kambiz. Analysis of Porous Filled Heat Exchangers for Electronic Cooling. *International Journal of Heat and Mass Transfer* Vol. 133 (2019): pp. 268-276.
[30] Khanafer, Khaliland Vafai, Kambiz. "A Critical Synthesis of Thermophysical Characteristics of Nanofluids." *International Journal of Heat and Mass Transfer* Vol. 54 No. 19 (2011): pp. 4410-4428.
[31] Mahjoob, Shadi, and Vafai, Kambiz. Analytical Characterization and Production of an Isothermal Surface for Biological and Electronics Applications. *ASME Journal of Heat Transfer* Vol. 131 (2009): pp. 052604-1-052604-12.

[32] Wu, Zhiyong, Caliot, Cyril, Flamant, Gilles, and Wang, Zhifeng. "Numerical Simulation of. Convective Heat Transfer between Air Flow and Ceramic Foams to Optimise Volumetric Solar Air Receiver Performances." *International Journal of Heat and Mass Transfer* Vol. 54 No. 7-8 (2011): pp. 1527-537.

[33] Lee, Dae-Young and Vafai, Kambiz. Analytical Characterization and Conceptual Assessment of Solid and Fluid Temperature Differentials in Porous Media. *International Journal of Heat and Mass Transfer* Vol. 42 No. 3 (1999): pp. 423-435.

[34] Pak, Bock C. and Cho, Young I.—Hydrodynamic and Heat Transfer Study of Dispersed Fluids with Submicron Metallic Oxide Particles. *Experimental Heat Transfer* Vol. 11 (1998): pp. 151-170.

[35] Saleh, Rosari, Putra, Nandy, Wibowo, Romualdus E., Spetiadi, Wayan N., and Prakoso, Suhendro P.—Titanium Dioxide Nanofluids for Heat Transfer Applications. *Experimental Thermal and Fluid Science* Vol. 52 (2014): pp. 19-29.

[36] Albojamal, Ahmedand Vafai, Kambiz. "Analysis of Single Phase, Discrete and Mixture Models, in Predicting Nanofluid Transport." *International Journal of Heat and Mass Transfer* Vol. 114 (2017): pp. 225-237.

[37] Calmidi, Varaprasad V. and Mahajan, Roop L. Forced Convection in High Porosity Metal Foams. *Journal of Heat Transfer* Vol. 122 No. 3 (2000): pp. 557-565.

[38] Calmidi, Varaprasad V.—Transport Phenomena in High Porosity Fibrous Metal Foam. PhD Thesis. University of Colorado, Boulder, CO. 1998.

[39] Mahjoob, Shadi and Vafai, Kambiz. Analytical Characterization of Heat Transport through Biological Media Incorporating Hyperthermia Treatment.‖*International Journal of Heat and Mass Transfer* Vol. 52 No. 5 (2009): pp. 1608-1618.

[40] Iasiello, Marcello, Cunsolo, Salvatore, Bianco, Nicola, Chiu, Wilson K. S., and Naso, Vincenzo. "Developing Thermal Flow in Open-cell Foams." *International Journal of Thermal Sciences* Vol. 111 (2017): pp. 129-37.

[41] C. S. Sharma, M. K. Tiwari, S. Zimmermann, T. Brunschwiler, G. Schlottig, B. Michel, D. Poulikakos, Energy efficient hotspot-targeted embedded liquid cooling of electronics, Applied Energy 138 (2015) 414-422.

[42] C. Du, L. Li, X. Wu, Z. Feng, Effect of jet nozzle geometry on flow and heat transfer performance of vortex cooling for gas turbine blade leading edge, Applied Thermal Engineering 93 (2016) 1020-1032.

[43] Z. Liu, J. Li, Z. Feng, T. Simon, Numerical study on the effect of jet nozzle aspect ratio and jet angle on swirl cooling in a model of a turbine blade leading edge cooling passage, International Journal of Heat and Mass Transfer 90 (2015) 986-1000.

[44] A. M. Kuraan, S. I. Moldovan, K. Choo, Heat transfer and hydrodynamics of free water jet impingement at low nozzle-to-plate spacings, International Journal of Heat and Mass Transfer 108 (Part B) (2017) 2211-2216.

[45] M. Choi, H. S. Yoo, G. Yang, J. S. Lee, D. K. Sohn, Measurements of impinging jet flow and heat transfer on a semi-circular concave surface, International Journal of Heat and Mass Transfer 43 (10) (2000) 1811-1822.

[46] B. V. N. R. Kumar, B. V. S. S. S. Prasad, Computational flow and heat transfer of a row of circular jets impinging on a concave surface, Heat and Mass Transfer 44 (2008) 667-678.

[47] L. Tan, J. Z. Zhang, H. S. Xu, Jet impingement on a rib-roughened wall inside semi-confined channel, International Journal of Thermal Sciences 86 (2014) 210-218.

[48] D. Zhang, H. Qu, J. Lan, J. Chen, Y. Xie, Flow and heat transfer characteristics of single jet impinging on protrusioned surface, International Journal of Heat and Mass Transfer 58 (1-2) (2013) 18-28.

[49] C. B. Kim, C. Leng, X. D. Wang, T. H. Wang, W. M. Yan, Effects of slot-jet length on the cooling performance of hybrid microchannel/slot-jet module, International Journal of Heat and Mass Transfer 89 (2015) 838-845.

[50] P. M. Ligrani, Z. Ren, W. C. Buzzard, Impingement jet array heat transfer with small-scale cylinder target surface roughness arrays, International Journal of Heat and Mass Transfer 107 (2017) 895-905.

[51] C. A. Rubio-Jimenez, S. G. Kandlikar, A. Hernandez-Guerrero, Numerical analysis of novel micro pin fin heat sink with variable fin density, IEEE Transactions on Components, Packaging and Manufacturing Technology 2 (5) (2015) 825-833.

[52] A. Ü. Tepe, Ü. Uysal, Y. Yetisken, K. Arslan, Jet impingement cooling on a rib-roughened surface using extended jet holes, Applied Thermal Engineering 178 (2020) 115601.

[53] P. Singh, M. Zhang, S. Ahmed, K. R. Ramakrishnan, S. Ekkad, Effect of micro-roughness shapes on jet impingement heat transfer and fin-effectiveness, International Journal of Heat and Mass Transfer 132 (2019) 80-95.

[54] C. Y. Zhao, Review on thermal transport in high porosity cellular metal foams with open cells, International Journal of Heat and Mass Transfer 55 (13-14) (2012) 3618-3632.

[55] S. Rashidi, F. Hormozi, M. H. Doranehgard, Abilities of porous materials for energy saving in advanced thermal systems, Journal of Thermal Analysis and calorimetry (2020)

[56] D. Boules, M. H. Sharqawy, W. H. Ahmed, Enhancement of heat transfer from a horizontal cylinder wrapped with whole and segmented layers of metal foam, International Journal of Heat and Mass Transfer 165 (2021).

[57] A Sivasamy, P. R. Kanna, V. Selladurai, Jet impingement cooling of a horizontal surface in an unconfined porous medium: Mixed convection regime, International Journal of Heat and Mass Transfer 54 (17-18) (2011) 4127-4134.

[58] K. C. Wong, Thermal analysis of a metal foam subject to jet impingement, International Communications in Heat and Mass Transfer 39 (2012) 960-965.

[59] P. Singh, K. Nithyanandam, R. L. Mahajan, An experimental and numerical investigation of forced convection in high porosity aluminum foams subjected to jet array impingement in channel-flow, International Journal of Heat and Mass Transfer 149 (2020).

[60] K. Yogi, M. Godase, M. Shetty, S. Krishnan, S. V. Prabhu, Experimental investigation on the local heat transfer with a circular jet impinging on a metal foamed flat plate, International Journal of Heat and Mass Transfer 162 (2020).

[61] M. Manno, B. Yang, A. Bar-Cohen, Near-junction "hot spot" suppression with integral SiC microcontact TEC, International Journal of Heat and Mass Transfer 115 (Part A) (2017) 530-536.

[62] A. M. Waddell, J. Punch, J. Stafford, N. Jeffers, The characterization of a low-profile channel-confined jet for targeted hot-spot cooling in microfluidic applications, International Journal of Heat and Mass Transfer 101 (2016) 620-628.

[63] A. Amiri, K. Vafai, Analysis of Dispersion Effects and Non-Thermal Equilibrium, Non-Darcian, Variable Porosity Incompressible Flow Through Porous Media, International Journal of Heat and Mass Transfer 37 (6) (1994) 939-954.

[64] N. Dukhan, K. C. Chen, Heat transfer measurements in metal foam subjected to constant heat flux, Journal of Experimental Thermal and Fluid Science 32 (2) (2007) 624-631.

[65] I. B. Celik, U. Ghia, P. J. Roache, C. J. Freitas, H. Coleman, P. E. Raad, Procedure for Estimation and Reporting of Uncertainty Due to Discretization in CFD Applications, Journal of Fluid Engineering 130 (7) (2008).

[66] J. W. Paek, B. H. Kang, S. Y. Kim, and J. M. Hyun, Effective thermal conductivity and permeability of aluminum foam materials, Int. J. Thermophys. 21 (2) (2000) 453-464.

| NOMENCLATURE | |
|---|---|
| c | specific heat, J/kg K |
| $d_f$ | filament diameter, m |
| Da | Darcy number |
| F | geometric function |
| h | convection heat transfer coefficient, W/m$^2$ K |
| k | thermal conductivity, W/m K |
| $k_{eff}$ | effective thermal conductivity, W/m K |
| K | permeability, m$^2$ |
| P | pressure, Pa |
| q | heat flux, W/m$^2$ |
| $q_s$ | source heat flux, W/m$^2$ |
| T | temperature, K |
| u | velocity, m/s |
| v | velocity vector, m/s |
| y | vertical coordinate, m |
| Greek symbols | |
| ε | porosity |
| ρ | density, kg/m$^3$ |
| μ | dynamic viscosity, kg/m s |
| υ | kinematic viscosity, m$^2$/s |
| Λ | inertia parameter |
| Subscripts | |
| f | fluid |
| s | solid |
| b | bulk flow |
| w | wall |
| Symbol | |
| < > | "Local volume average" of a quantity |

We claim:

1. A heat management device for use with an electronic component, comprising:
   at least two jet inlet channels, wherein the at least two jet inlet channels comprise at least two inlet channel sizes,
   at least one non-uniform channel area or uniform channel area,
   at least two exit channels,
   at least one heat spreader conductive plate, wherein the at least one non-uniform channel area or uniform channel area is bounded by the at least two jet inlet channels, the at least two exit channels, and the at least one heat spreader conductive plate, and
   at least one porous component or at least one foam component, wherein the at least one porous component or at least one foam component at least partially fills the at least one non-uniform channel area or uniform channel area.

2. The heat management device for use with an electronic component of claim 1, wherein the at least one porous component or at least one foam component completely fills the at least one non-uniform channel area or uniform channel area.

3. The heat management device for use with an electronic component of claim 1, wherein the at least one porous component or at least one foam component comprises at least one metal.

4. The heat management device for use with an electronic component of claim 1, wherein the at least one foam component comprises a metal foam.

5. The heat management device for use with an electronic component of claim 1, further comprising at least one rib structure component that is coupled with the at least one heat spreader conductive plate and is located in the at least one non-uniform channel area or uniform channel area.

6. The heat management device for use with an electronic component of claim 1, wherein each of the at least two jet inlet channels comprises a shape, wherein the shape is square or rectangular.

7. The heat management device for use with an electronic component of claim 1, wherein each of the at least two jet inlet channels has a vertical enclosure having a top, a bottom, and at least one side.

8. The heat management device for use with an electronic component of claim 7, wherein each of the at least two jet inlet channels has a tapered directional component coupled with the bottom of the vertical enclosure.

9. The heat management device for use with an electronic component of claim 1, further comprising at least one electronic component having a heat flux value of at least $10^4$ W/m$^2$, wherein the component has a top surface.

10. A heat management device for use with an electronic component, comprises:
    at least two jet inlet channels, wherein the at least two jet inlet channels comprise at least two inlet channel sizes,
    at least one non-uniform channel area or uniform channel area,
    at least two exit channels,
    at least one heat spreader conductive plate, wherein the at least one non-uniform channel area or uniform channel area is bounded by the at least two jet inlet channels, the at least two exit channels, and the at least one heat spreader conductive plate, and
    at least one porous component or at least one foam component, wherein the at least one porous component or at least one foam component at least partially fills the at least one non-uniform channel area or uniform channel area,
    at least one jet impingement of at least one thermal management liquid or gas, wherein the at least two jet inlet channels directs the at least one jet impingement of a liquid or a gas onto a surface of the at least one porous component or at least one foam component.

11. The heat management device for use with an electronic component of claim 10, wherein the at least one porous component or at least one foam component completely fills the at least one non-uniform channel area or uniform channel area.

12. The heat management device for use with an electronic component of claim 11, wherein the at least one non-uniform channel area or uniform channel area is coupled with, or connected to the top surface of the component.

13. The heat management device for use with an electronic component of claim 10, wherein the at least one porous component or at least one foam component comprises at least one metal.

14. The heat management device for use with an electronic component of claim 10, wherein the at least one foam component comprises a metal foam.

15. The heat management device for use with an electronic component of claim 10, further comprising at least one rib structure component that is coupled with the at least one heat spreader conductive plate and is located in the at least one non-uniform channel area or uniform channel area.

16. The heat management device for use with an electronic component of claim 10, wherein each of the at least two jet inlet channels comprises a shape, wherein the shape is square or rectangular.

17. The heat management device for use with an electronic component of claim 10, wherein each of the at least two jet inlet channels has a vertical enclosure having a top, a bottom, and at least one side.

18. The heat management device for use with an electronic component of claim 17, wherein each of the at least two jet inlet channels has a tapered directional component coupled with the bottom of the vertical enclosure.

19. The heat management device for use with an electronic component of claim 10, further comprising at least one electronic component having a heat flux value of at least $10^4$ W/m$^2$, wherein the component has a top surface.

20. The heat management device for use with an electronic component of claim 19, wherein the at least one non-uniform channel area or uniform channel area is coupled with, or connected to the top surface of the component.

* * * * *